(12) United States Patent
Sim et al.

(10) Patent No.: US 8,618,679 B2
(45) Date of Patent: Dec. 31, 2013

(54) PATTERN STRUCTURES IN SEMICONDUCTOR DEVICES

(75) Inventors: Jaehwang Sim, Seoul (KR); Jaeho Min, Seoul (KR); Jaehan Lee, Seoul (KR); Keonsoo Kim, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 254 days.

(21) Appl. No.: 12/862,972

(22) Filed: Aug. 25, 2010

(65) Prior Publication Data

US 2011/0062595 A1    Mar. 17, 2011

(30) Foreign Application Priority Data

Sep. 15, 2009    (KR) ........................ 10-2009-0086808

(51) Int. Cl.
*H01L 23/485*    (2006.01)

(52) U.S. Cl.
USPC ....... 257/786; 257/773; 257/775; 257/E23.01

(58) Field of Classification Search
USPC ......... 257/208, 734, 737, 738, 773, 775, 780, 257/784, 786, E23.015, E23.02, E23.021
See application file for complete search history.

(56) References Cited

U.S. PATENT DOCUMENTS

| | | | | |
|---|---|---|---|---|
| 5,982,033 A * | 11/1999 | Ohsawa et al. | ............... | 257/737 |
| 6,417,575 B2 * | 7/2002 | Harada et al. | ................. | 257/784 |
| 6,858,944 B2 * | 2/2005 | Huang et al. | ................... | 257/786 |
| 6,987,323 B2 * | 1/2006 | Yamane | ........................ | 257/775 |
| 2005/0095862 A1 * | 5/2005 | Lee et al. | ....................... | 438/689 |

FOREIGN PATENT DOCUMENTS

| | | |
|---|---|---|
| KR | 2006-113162 | 11/2006 |
| KR | 10-790998 | 12/2007 |
| KR | 10-843236 | 6/2008 |
| KR | 10-850216 | 7/2008 |

* cited by examiner

*Primary Examiner* — Marcos D. Pizarro
(74) *Attorney, Agent, or Firm* — Stanzione & Kim, LLP

(57) ABSTRACT

A pattern structure in a semiconductor device includes an extending line and a pad connected with an end portion of the extending line. The pad may have a width that is larger than a width of the extending line. The pad includes a protruding portion extending from a lateral portion of the pad. The pattern structure may be formed by simplified processes and may be employed in various semiconductor devices requiring minute patterns and pads.

29 Claims, 38 Drawing Sheets

PATTERN STRUCTURES IN SEMICONDUCTOR DEVICES

CROSS-REFERENCE TO RELATED APPLICATIONS

This application claims the benefit of Korean Patent Application No. 2009-0086808, filed on Sep. 15, 2009 in the Korean Intellectual Property Office, the disclosure of which is incorporated herein by reference in its entirety.

BACKGROUND

1. Field of the Invention

Example embodiments of the present general inventive concept relate to pattern structures in semiconductor devices and methods of forming pattern structures in semiconductor devices. More particularly, example embodiments of the present general inventive concept relate to pattern structures including pads and method of forming pattern structures including pads.

2. Description of the Related Art

In the conventional method of manufacturing a semiconductor device, it is very difficult to exactly form a minute pattern having a width below about 40 nm. To form such a minute pattern, a doubling pattern method is typically used. In the double patterning method, a spacer formation layer is formed on a pattern formed by a photolithography process, and then the minute pattern can be obtained using the spacer formation layer as an etching mask.

However, the minute pattern formed by the doubling patterning method may not have a desired structure according to that of a pattern obtained by the photolithography process. Thus, the minute pattern may not ensure a desired structure and dimension through the doubling pattern method including only one photolithography process. Generally, more than three photolithography processes may be required to form the minute pattern and a pad having a relatively large width at an end portion of the minute pad. As a result, processes for forming the minute pattern and the pad may be considerably complicated, and the cost and time of the processes may be increased. Further, the mis-alignment of the minute pattern and/or the pad may frequently occur because of the complicated processes.

SUMMARY

Example embodiments of the present general inventive concept provide pattern structures including pads.

Example embodiments of the present general inventive concept provide methods of manufacturing pattern structures including pads through simplified processes.

Additional features and utilities of the present general inventive concept will be set forth in part in the description which follows and, in part, will be obvious from the description, or may be learned by practice of the general inventive concept.

According to example embodiments of the present general inventive concept, a pattern structure is provided in a semiconductor device. The pattern structure includes an extending line and a pad connected with an end portion of the extending line. The pad has a width larger than a width of the extending line, and the pad includes a protruding portion extending from a lateral portion of the pad.

In example embodiments, the protruding portion may be protruded along a direction where the first extending line. For example, the protruding portion may have a line shape.

In example embodiments, a line pattern may be formed to be connected with another end portion of the extending line. The line pattern may extend along a first direction.

In example embodiments, the first direction may be different from an extending direction of the extending line so that the line pattern may be bent from the extending line.

In example embodiments, the line pattern may have a width smaller than that of the extending line.

According to example embodiments of the present general inventive concept, a pattern structure is provided in a semiconductor device, which includes a first pattern and a second pattern. The first pattern includes a first extending line and a first pad having a first protruding portion extending from a lateral portion of the first pad. The first pad is connected with an end portion of the first extending line and the first pad has a width larger than a width of the first extending line. The second pattern includes a second extending line and a second pad having a second protruding portion extending from a lateral portion of the second pad. The second extending line is inclinedly separated from the first extending line. The second pad is connected with an end portion of the second extending line, and the second pad has a width larger than a width of the second extending line.

In example embodiments, the second extending line may be perpendicular to the first extending line.

In example embodiments, the first and the second protruding portions may extend along directions where the first and the second extending lines, respectively.

In example embodiments, a first line pattern may be formed to be connected to another end portion of the first extending line. The first line pattern may extend in a first direction. Further, a second line pattern may be formed to be connected to another end portion of the second extending line. The second line pattern may extend along a direction in parallel relative to the first direction.

In example embodiments, the first direction may be different from extending directions of the first and the second extending lines, so that the first and the second line patterns may be bent from the first and the second extending lines, respectively.

In example embodiments, the first line pattern may have a length different from that of the second line pattern.

In example embodiments, the first and the second line patterns may have widths smaller than those of the first and the second extending lines, respectively.

In example embodiments, each of the first and the second line patterns may correspond to a gate electrode.

According to example embodiments of the present general inventive concept, a method of forming a pattern structure in a semiconductor device is provided. In the method of manufacturing the pattern structure, a sacrificial pattern structure including a first material film pattern and a second material film pattern is formed on a layer to be etched. The sacrificial pattern structure includes a sacrificial line having a first width and extending in a first direction, a first sacrificial pad portion being inclinedly connected to an end portion of the sacrificial line and having a width larger than the first width, and a second sacrificial pad portion being connected with and the end portion of the sacrificial line and having a width larger than the first width. A spacer formation layer is formed on a sidewall of the sacrificial pattern structure. At least portions of the spacer formation layer and the sacrificial line between the first and the second sacrificial pad portions are selectively removed to isolate lower portions of the first and the second sacrificial pad portions. The spacer formation layer is anisotropically etched to form a spacer. An etching mask structure is formed by removing the sacrificial line while remaining the spacer and the first and the second sacrificial pad portions. The layer to be etched is etched using the etching mask structure to form a first pattern including a first line pattern, a first extending line and a first pad and to form a second pattern including a second line pattern, a second extending line and a second pad.

In example embodiments, the first material film pattern may include polymer and the second material film pattern may include silicon oxynitride.

In example embodiments, the second material film pattern included in the sacrificial line may have a thickness smaller than that of the second material film pattern included in the first and the second sacrificial pad portions.

In the formation of the sacrificial pattern structure according to example embodiments, a first material film and a second material film may be formed on the layer to be etched. The first and the second material films may be patterned by a photolithography process.

In the selective removal of at least portions of the spacer formation layer and the sacrificial line according to example embodiments, a photoresist pattern may be formed on the spacer formation layer. The photoresist pattern may selectively expose portions of the sacrificial line and the spacer formation layer between the first and the second sacrificial pad portions. The photoresist pattern may also selectively expose another portion of the spacer formation layer and another end portion of the sacrificial line opposite to the first and the second sacrificial par portions. The exposed portions of the spacer formation layer and the sacrificial line may be anisotropically etched using the photoresist pattern as an etching mask, to form an opening between the first and the second sacrificial pad portions and to form the spacer. A portion of the sacrificial line exposed by the opening may be etched to isolate the lower portions of the first and the second sacrificial pad portions after removing the photoresist pattern. The first material film pattern may be removed while remaining the second material film pattern during removing the photoresist pattern.

In example embodiments, the first and the second sacrificial pad portions may respectively include preliminary extending portions connected with the sacrificial line, and preliminary pad portions on which pads are formed. At least one of the preliminary extending portions may be disposed by a predetermined angle relative to the sacrificial line. Each of the preliminary extending portions may have a length substantially the same as or larger than a width of the first material film pattern in the sacrificial line removed during removing the photoresist pattern.

In the formation of the etching mask structure according to example embodiments, the second material film pattern included in the sacrificial line may be etched while remaining the second material film pattern included in the first and the second sacrificial pad portions. The first material film pattern included in the sacrificial line may also be etched. The second material film pattern included in the first and the second sacrificial pad portions may selectively etched while remaining the first material film pattern included in the first and the second sacrificial pad portions.

In example embodiments, the etching mask structure may include a first spacer having a line shape extending in the first direction, a portion of the first sacrificial pad portion contacting an end portion of the first spacer, a second spacer having a line shape in parallel to the first spacer, and a portion of the second sacrificial pad portion contacting an end portion of the second spacer.

In example embodiments, another end portion of the sacrificial line opposite to the first and the second sacrificial pad portions may be bent along a direction different from the first direction.

In example embodiments, the etching mask structure may include a line-shaped portion extending in the first direction, and a protruding portion partially enclosing the first and the second sacrificial pad portions and protruding from the first and the second sacrificial pad portions.

In example embodiments, the first and the second extending lines may respectively have widths larger than those of the first and the second line patterns because of an etching loading effect.

According to example embodiments of the present general inventive concept, a pattern structure having a minute pattern and a pad connected with the minute pattern may be formed through only two photolithography processes, so that the cost and time for forming the pattern structure may be considerably reduced. Additionally, a bridge failure between adjacent minute patterns may be reduced because of the pattern structure may have a desired shape and dimensions. Thus, a semiconductor device having the pattern structure may have increased integration and may improve the yield of the processes of manufacturing the semiconductor device when the pattern structure is employed in the semiconductor device. For example, when the pattern structure is used as a control gate of a NADN type flash memory device, the NAND type flash memory device may provide increased performance and integration. Furthermore, the mis-alignment between the minute pattern and the pad may be minimized and/or prevented since the pad having a relatively large width may be directly connected with the minute pattern, thereby improving the performance and reliability of the semiconductor device including the pattern structure.

Exemplary embodiments of the present general inventive concept provide a pattern structure of a semiconductor device, including a line pattern unit formed on a substrate to transmit data, and a pad formed to be connected to the line pattern unit to receive and output the data, having a circumferential line to define a shape of the pad, and having a concave portion formed in the circumference line.

The pattern structure may include where the line pattern unit has a line pattern, and an extending line disposed between the line pattern and the pad, and having a width different from at least one of the line pattern and the pad.

The pattern structure may include where the line pattern connected to the extending line and disposed opposite to the pad with respect to the extending line, and the extending unit is disposed in a direction different from at least one of the line pattern and the pad.

The pattern structure may include where the extending unit includes two ends which are connected to opposite ends of circumferential line, and the concave portion is connected to the one of the two ends of the extending unit.

The pattern structure may include where the extending unit includes two line ends which are connected to opposite ends of circumferential line and has a width same as a width of the corresponding opposite ends of the circumferential line of the pad.

The pattern structure may include where the extending unit has a width, and the pad has a variable width different from the width of the extending unit with respect to the line pattern.

The pattern structure may include where the concave portion of the pad is disposed adjacent to the extending unit.

The pattern structure may include where the circumferential line includes one end directly connected to the extending unit, and another end connected to the extending unit through the concave portion.

The pattern structure may include where the pad has a constant width and a variable width with respect to a longitudinal direction of the line pattern, and the variable width corresponds to the concave portion.

The pattern structure may include where the circumference line comprises two ends connected to corresponding ends of the line pattern unit, and a line connected to the two ends to define the shape of the pad.

The pattern structure may include where the concave portion is formed on the line of the circumferential line.

The pattern structure may include where the concave portion is disposed between one of the ends and the line of the circumferential line.

The pattern structure may include where the circumferential line of the pad comprises an end connected to one end of the line pattern unit and another end connected to one end of the concave portion, and the concave portion has another end connected to another end of the line pattern unit.

The pattern structure may include where the pad comprises a first portion having a constant width and a second portion having a variable width in a direction according to a location of the concave portion.

The pattern structure may include where the circumferential line of the pad forms an area of the pad, and the area of the pad has a first portion in which a width of the area in a direction parallel to a longitudinal direction of the line pattern unit does not vary, and a second portion in which a direction parallel to a longitudinal direction of the line pattern unit varies according to a distance from the line pattern unit.

The pattern structure may include where the pad comprises a connecting portion to connect the circumference line to the line pattern unit, the connection portion is curved in a first area, and the concave portion is curved in a second area larger than the first area.

The pattern structure may include where the pad comprises a connection portion connected to the line pattern unit, and the concave portion is disposed in an area different from the connection portions.

The pattern structure may include where the pad comprises a connection portion connected to the line pattern unit, and the concave portion is connected between an end of the connection portion.

The pattern structure may include where the pad comprises a connecting portion having a first end connected between the line pattern unit and one end of the circumference pad and a second end connected between the line pattern and one end of the concave portion.

The pattern structure may include where the pad comprises at least four sides, the circumferential line defines three of the four sides, and the concave portion defines one of the four sides.

The pattern structure may include a protrusion disposed between the concave portion and the circumference line.

The pattern structure may include a protrusion to protrude from the concave portion and the circumference line by a length.

The pattern structure may include where the length is shorter than a length of one of the concave portion and the circumference line.

The pattern structure may include where the length is shorter than the least width of the pad.

The pattern structure may include where the length is longer than a width of the line pattern unit.

The pattern structure may include where the protrusion has a width narrower than the length.

The pattern structure may include where the protrusion has a width narrower than a length of the concave portion.

The pattern structure may include where the line pattern unit is disposed in a direction, and the protrusion is disposed in another direction.

The pattern structure may include where the line pattern unit comprises a line pattern formed in a first direction and an extending portion formed in a second direction between the line pattern and the pad, and the protrusion is formed in one of the first direction and the second direction.

Exemplary embodiments of the present general inventive concept also provide a pattern structure of a semiconductor device, including a line pattern formed on a substrate and having a first width, an extending line formed on the substrate, extended in a direction from the line pattern, and having a second width, and a pad formed on an end portion of the extending line formed on the substrate, and having a third width, and having a concave portion and a protrusion.

Exemplary embodiments of the present general inventive concept also provide a pattern structure of a semiconductor device, including a line pattern disposed in a first direction and having a first width, an extending line extended from the line pattern, and having a second width, and a pad formed on an end portion of the extending line and having a third width, and a protruding portion to protrude from a portion of the pad in one of the first direction and a second direction having an angle with the first direction.

Exemplary embodiments of the present general inventive concept also provide a pattern structure of a semiconductor device, including a line pattern formed on a substrate, extended from a first position of the substrate in a direction, and having a first width, an extended line extended from an end portion of the line pattern and having a second width, a pad formed on a second position of the substrate, extended from the extended line in another direction, and having a third width, and a protruding portion to protrude from the pad in one of the direction and another direction, where the first position of the substrate is connectable to an internal circuit, and the second position of the substrate is connectable to an external circuit to drive the internal circuit.

Exemplary embodiments of the present general inventive concept also provide a pattern structure of a semiconductor device, including a line pattern formed on a substrate and having a first width, an extended line extended from an end portion of the line pattern and having a second width, a pad formed on an end portion of the extended line and having a third width and a fourth width narrower than the third width, and a protruding portion to protrude from a portion of the pad of the fourth width.

Exemplary embodiments of the present general inventive concept provide a pattern structure of a semiconductor device, including a line pattern disposed in a first direction and having a first width in a second direction having an angle with the first direction, an extending line extended from the line pattern in the second direction and having a second width in the first direction wider than the first width, and a pad formed on an end portion of the extending line, having a third width wider than the second width, and having a circumferential surface formed with a concave portion.

Exemplary embodiments of the present general inventive concept provide a pattern structure of a semiconductor device, a first pattern structure having a first line pattern unit and a first pad connected to the first line pattern unit and having a first concave portion, and a second pattern structure having a second line pattern unit disposed parallel to the first line pattern unit and a second pad connected to the second line pattern structure and having a second concave portion to face the first concave portion.

Exemplary embodiments of the present general inventive concept provide a pattern structure of a semiconductor device, including a first pattern structure having a first line pattern unit and a first pad connected to the first line pattern unit and having a first protrusion, and a second pattern structure having a second line pattern unit and a second pad connected to the second line pattern unit and having a second protrusion disposed to face the first protrusion.

Exemplary embodiments of the present general inventive concept also provide a pattern structure of a semiconductor device, including a first pattern structure having a first line pattern, a first extending line extended from the first line pattern, and a first pad connected to the first extending line and having a circumferential line, a concave portion, and a protrusion disposed between the circumferential line and the concave portion, and a second pattern disposed adjacent to the first pattern structure, having a second line pattern, a second extending line extended from the second line pattern, and a second pad connected to the second extending line and having a second circumferential line, a second concave portion, and a second protrusion disposed between the second circumferential line and the second concave portion.

Exemplary embodiments of the present general inventive concept also provide a pattern structure of a semiconductor device, including a first pattern structure connected to a controller, the first pattern structure having a first line pattern disposed in a first direction and having a first width in a second direction having an angle with the first direction, a first extending line extended from the line pattern in the second direction and having a second width in the first direction wider than the first width, and a first pad formed on an end portion of the extending line and having a third width wider than the second width, and a second pattern structure disposed to face the first pattern structure and connected to the controller, the second pattern structure having a second line pattern formed on a substrate and having a fourth width, a second extended line extended from an end portion of the line pattern and having a fifth width, a second pad formed on an end portion of the extended line and having a six width and a seventh width narrower than the sixth width, and a protruding portion to protrude from a portion of the pad of the seven width.

Exemplary embodiments of the present general inventive concept provide a pattern structure of a semiconductor device, including a first pattern structure formed on a first position of a substrate, having a first line pattern disposed in a first direction and having a first width in a second direction having an angle with the first direction, a first extending line extended from the line pattern in the second direction and having a second width in the first direction wider than the first width, and a first pad formed on an end portion of the extending line and having a third width wider than the second width, and a second pattern structure formed a second position of the substrate, having a second line pattern disposed in the first direction and having a fourth width in the second direction having the angle with the first direction, a second extending line extended from the line pattern in the second direction and having a fifth width in the first direction wider than the first width, and a second pad formed on an end portion of the extending line and having a sixth width wider than the fifth width.

Exemplary embodiments of the present general inventive concept also provide an electronic apparatus including a semiconductor device having a substrate having a memory cell to store data, and a pattern structure connected to between the circuit and a driver to drive the memory cell, the pattern structure comprising; a line pattern unit formed on a substrate to transmit data, and a pad formed to be connected to the line pattern unit to receive and output the data, having a circumferential line to define a shape of the pad, and having a concave portion formed in the circumference line, a function unit to perform an operation, a controller to control the semiconductor device to read and write the data, and to control the function unit to perform the operation according to the data.

Exemplary embodiments of the present general inventive concept also provide a method of forming a pattern structure of a semiconductor device, the method including forming a line pattern unit on a substrate to transmit data, and forming a pad to be connected to the line pattern unit to receive and output the data, having a circumferential line to define a shape of the pad, and having a concave portion formed in the circumference line.

Exemplary embodiments of the present general inventive concept also provide a method of forming a pattern structure of a semiconductor device, including forming a line pattern on a substrate and having a first width, forming an extending line on the substrate, extended in a direction from the line pattern, and having a second width, and forming a pad on an end portion of the extending line formed on the substrate, and having a third width, and having a concave portion and a protrusion.

Exemplary embodiments of the present general inventive concept also provide a method of forming a pattern structure of a semiconductor device, including forming a line pattern disposed in a first direction and having a first width, forming an extending line extended from the line pattern, and having a second width, and forming a pad on an end portion of the extending line and having a third width, and forming a protruding portion to protrude from a portion of the pad in one of the first direction and a second direction having an angle with the first direction.

Exemplary embodiments of the present general inventive concept also provide a method of forming a pattern structure of a semiconductor device, including forming a line pattern on a substrate, extended from a first position of the substrate in a direction, and having a first width, forming an extended line extended from an end portion of the line pattern and having a second width, forming a pad formed on a second position of the substrate, extended from the extended line in another direction, and having a third width, and forming a protruding portion to protrude from the pad in one of the direction and another direction, where the first position of the substrate is connectable to an internal circuit, and the second position of the substrate is connectable to an external circuit to drive the internal circuit.

Exemplary embodiments of the present general inventive concept also provide a method of forming a pattern structure of a semiconductor device, forming a line pattern formed on a substrate and having a first width, forming an extended line extended from an end portion of the line pattern and having a second width, forming a pad on an end portion of the extended line and having a third width and a fourth width narrower than the third width, and forming a protruding portion to protrude from a portion of the pad of the fourth width.

Exemplary embodiments of the present general inventive concept also provide a pattern structure of a semiconductor device, including forming a line pattern disposed in a first direction and having a first width in a second direction having an angle with the first direction, forming an extending line extended from the line pattern in the second direction and having a second width in the first direction wider than the first width, and forming a pad formed on an end portion of the extending line, having a third width wider than the second width, and having a circumferential surface formed with a concave portion.

Exemplary embodiments of the present general inventive concept also provide a method of forming a pattern structure of a semiconductor device, the method including forming a line pattern unit on a substrate to transmit data, and forming a pad to be connected to the line pattern unit to receive and output the data, the pad having a circumferential line to define a shape of at least a portion of the pad, having a concave portion formed on the circumference line, and a protrusion disposed between the concave portion and the circumference line.

Exemplary embodiments of the present general inventive concept also provide a method of forming a pattern structure of a semiconductor device, the method including forming a layer to be etched, on a substrate, forming a sacrificial layer as a photo resist film on a predetermined portion of the layer, forming a spacer formation layer on the sacrificial layer and the layer, forming a second sacrificial layer as a second photo resist film on the spacer formation layer, the spacer forming layer having a first opening to expose a portion of the spacer formation layer, etching a portion of the second sacrificial layer through the first opening of the spacer formation layer to form a second opening, etching the remaining second sacrificial layer, removing portions of the spacer formation layer to form a pattern, and etching a portion of the layer according to the pattern to form a pattern structure.

The method may include where the pattern structure has a line pattern unit formed on a substrate to transmit data, and a pad formed to be connected to the line pattern unit to receive and output the data, having a circumferential line to define a shape of the pad, and having a concave portion formed on the circumference line.

Exemplary embodiments of the present general inventive concept also provide a method of forming a pattern structure of a semiconductor device, including forming a first pattern structure having a first line pattern unit and a first pad connected to the first line pattern unit and having a first concave portion, and forming a second pattern structure having a second line pattern unit disposed parallel to the first line pattern unit and a second pad connected to the second line pattern structure and having a second concave portion to face the first concave portion.

Exemplary embodiments of the present general inventive concept also provide method of forming a pattern structure of a semiconductor device, including forming a first pattern structure having a first line pattern unit and a first pad connected to the first line pattern unit and having a first protrusion, and forming a second pattern structure having a second line pattern unit and a second pad connected to the second line pattern unit and having a second protrusion disposed to face the first protrusion.

Exemplary embodiments of the present general inventive concept also provide a method of forming a pattern structure of a semiconductor device, including forming a first pattern structure having a first line pattern, a first extending line extended from the first line pattern, and a first pad connected to the first extending line and having a circumferential line, a concave portion, and a protrusion disposed between the circumferential line and the concave portion, and forming a second pattern disposed adjacent to the first pattern structure, having a second line pattern, a second extending line extended from the second line pattern, and a second pad connected to the second extending line and having a second circumferential line, a second concave portion, and a second protrusion disposed between the second circumferential line and the second concave portion.

BRIEF DESCRIPTION OF THE DRAWINGS

Example embodiments of the present general inventive concepts can be understood in more detail from the following description taken in conjunction with the accompanying drawings, in which.

DETAILED DESCRIPTION OF THE EMBODIMENTS

Figure 1A:
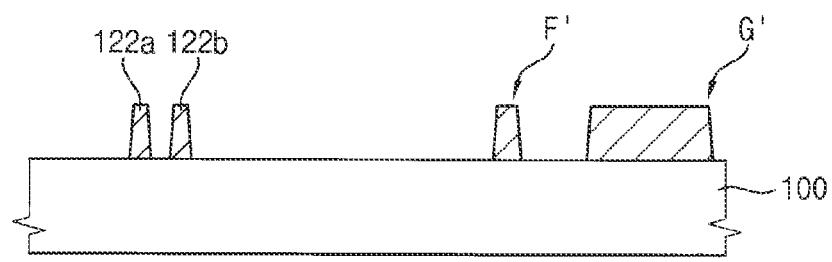
FIG. 1A is a cross sectional view illustrating a pattern structure in accordance with exemplary embodiments of the present general inventive concept.

Example embodiments of the inventive concept are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present general inventive concept are described herein with reference to cross-sectional illustrations that are schematic illustrations of illustratively idealized example embodiments (and intermediate structures) of the present general inventive concept. As such, variations from the shapes of the illustrations as a result, for example, of manufacturing techniques and/or tolerances, are to be expected. Thus, example embodiments of the present general inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
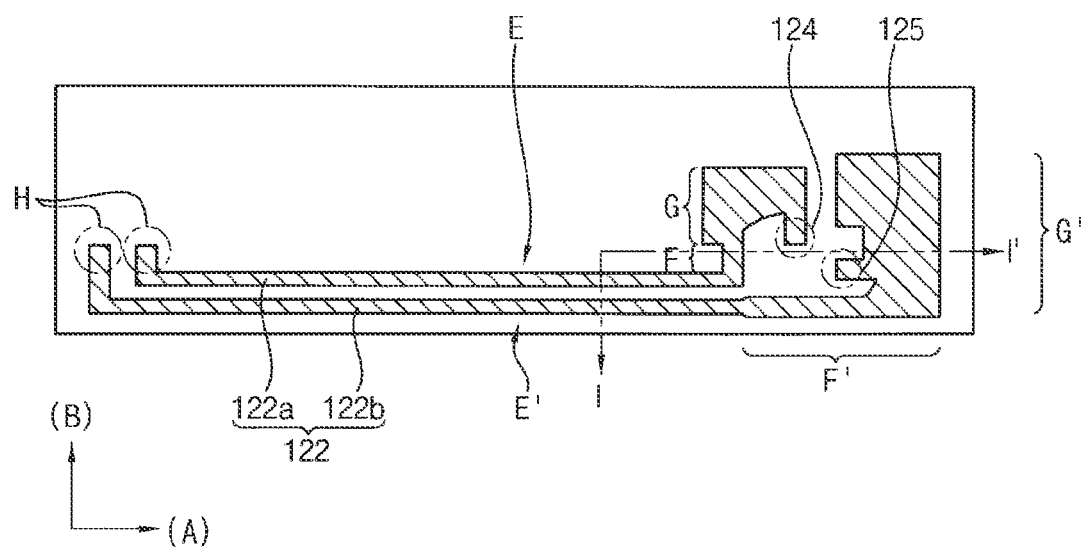
FIG. 1B is a plan view illustrating the pattern structure in FIG. 1A.
Figure 2:
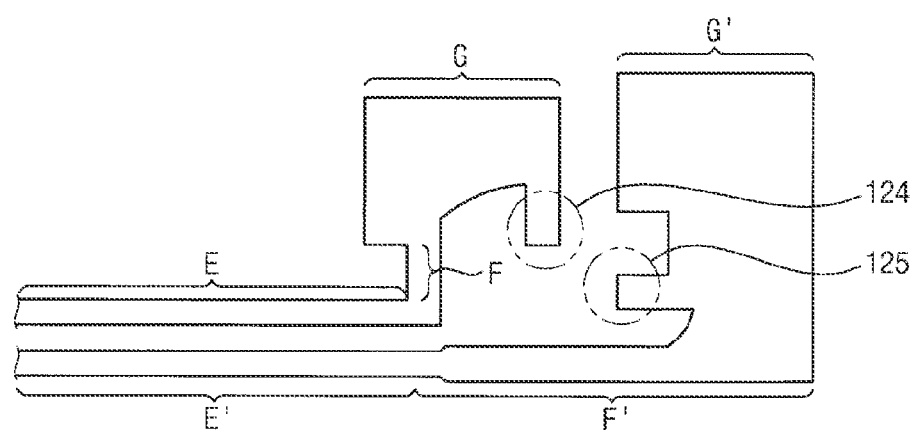
FIG. 2 is an enlarged cross sectional view illustrating an end portion of the pattern structure in FIG. 1B.

FIG. 1A is a cross sectional view illustrating a pattern structure in accordance with exemplary embodiments of the present general inventive concept. FIG. 1B is a plan view illustrating the pattern structure in FIG. 1A. FIG. 1A is the cross sectional view illustrating the pattern structure taken the line of I-I' in FIG. 1B. FIG. 2 is an enlarged cross sectional view illustrating an end portion of the pattern structure in FIG. 1B.

Referring to FIGS. 1A, 1B and 2, a pattern structure 122 includes a first pattern 122a and a second pattern 122b. The first and the second patterns 122a and 122b may be arranged on a substrate 100 in parallel with each other. The first and second patterns 122a and 122b may connect a first portion of the substrate 100 to another portion of the substrate 100. For example, the first and second patters 122a and 122b of the first portion of the substrate 100 may connect to an internal circuit, and the first and second patters 122a and 122b of the second portion of the substrate 100 may connect to an external circuit. That is, terminal (H) of the second portion of the substrate 100 having the first and second patters 122a and 122b may connect to an external circuit in exemplary embodiments of the present general inventive concept.

The first pattern 122a includes a first line pattern (E), a first extending line (F) and a first pad (G). The first line pattern (E) may have a first width (e.g., a width in the (B) direction) and extend on the substrate 100 along a first direction (A). The first extending line (F) may be connected to an end portion of the first line pattern (E). The first pad (G) may make contact with an end portion of the first extending line (F). The first pad (G) may have a width larger than the first width. The first width of the first line pattern (E) may be smaller than a critical width of a photolithography process.

The first extending line (F) may be disposed along a direction different the first direction of the first line pattern (E). For example, the first extending line (F) may be perpendicular to the first line pattern (E). That is, the first extending line (F) may be perpendicularly bent from the end portion of the first line pattern (E).

The first extending line (F) may have a width (e.g., in the (B) direction) larger than that of the first line pattern (E) in the (B) direction, whereas the width of the first extending line (F) in the (B) direction may be smaller than the width of the first pad (G) in the (B) direction. When the first extending line (F) and the first line pattern (E) are formed on the substrate 100 by an etching process, the loading effect of the etching process may occur at the first extending line (F) having a relatively large pattern density. Therefore, the width of the first extending line (F) in the (B) direction may be larger than the first width of the first line pattern (E) in the (B) direction.

The first pad (G) includes a protruding portion 124 extending from a portion of the first pad (G). The protruding portion 124 may extend along a direction substantially the same as that of the first extending line (F). For example, the protruding portion 124 may extend in parallel relative to the first extending line (F) in the (B) direction. The protruding portion 124 may have a line shape that has a width (e.g., a width in the B direction) that is substantially the same as or similar to that of the first extending line (F). The pattern structure 122 may be easily identified by the protruding portion 124 of the first pad (G). That is, the pattern structure 122 may have a structural feature including the protruding portion 124 of the first pad (G).

The second pattern 122b may be adjacent to the first pattern 122a by a predetermined distance. That is, the second pattern 122b may be spaced apart from the first pattern 122a by the predetermined distance. The second pattern 122b includes a second line pattern (E'), a second extending line (F') and a second pad (G'). The second line pattern (E') may extend in parallel relative to the first line pattern (E), with the first line pattern (E) and the second line pattern (E') extending in the (A) direction.

The second line pattern (E') may have a second width substantially the same as or similar to the first width (e.g., the width in the (B) direction) of the first line pattern (E). The second extending line (F') may be connected to an end portion of the second line pattern (E'). The second pad (G') may make contact with an end portion of the second extending line (F'). The second pad (G') may have a width larger in the (B) direction than the first width. The width of the second pad (G') may be sized so as to receive contact plugs for transmitting signals.

In example embodiments of the present general inventive concept, the second extending line (F') may extend in a direction substantially parallel with respect to the first direction where the first line pattern (E) extends. That is, the second extending line (F') may extend in the (A) direction. The second extending line (F') may have a width (e.g., a width in the (B) direction) larger than that of the second line pattern (E'), whereas the width (e.g., the width in the (B) direction) of the second extending line (F') may be smaller than that of the second pad (G').

The second pad (G') may be bent along a direction (e.g., the (B) direction) substantially perpendicular relative to the direction (e.g., the (A) direction) where the second extending line (F') extends. The second pad (G') may be include a second protruding portion 125 that protrudes from a portion of the second pad (G') in, for example, the (A) direction. The second protruding portion 125 may be arranged in parallel relative to the second extending line (F'). That is, the second protruding portion 125 and the second extending line (F') may both extend in the (A) direction and be parallel with one another. The second protruding portion 125 may be spaced apart (e.g., in the (B) direction) from the second extending line (F') by a predetermined distance.

In example embodiments of the present general inventive concept, another end portion of the first line pattern (E) of the first pattern 122a and another end portion of the second line pattern (E') of the second pattern 122b may extend along one or more directions different from the first direction (e.g., the (A) direction), respectively. For example, another end portion of the first line pattern (E) and another end portion of the second line pattern (E') may be bent in directions perpendicular to the first direction. That is, the first line pattern (E) and the second line pattern (E') may extend in the (A) direction, and may have portion (H) which may perpendicularly extend in the (B) direction.

When the first line pattern (E) and the second line pattern (E') have bending end portions, bridge patterns may be formed at the bending end portions (e.g., the (H) portions) of the first and the second line patterns (E and E'). Thus, a short between the first pattern 122a and the second pattern 122b may be minimized and/or prevented.

The first pattern 122a may have a length (e.g., a length extending the (A) direction) that is different from that of the second pattern 122b. For example, the length of the first pattern 122a may be smaller than that of the second pattern 122b.

FIGS. 3A to 12B are cross sectional views and plan views illustrating a method of forming the pattern structure in FIG. 1a according to exemplary embodiments of the present general inventive concept. FIGS. 3A, 4A, 5A, 6A, 7A, 8A, 9A, 10A, and 12A are cross sectional views illustrating the pattern structure, and FIGS. 3B, 4B, 5B, 6B, 7B, 8B, 9B, 10B, 11B, and 12B are plan views illustrating the pattern structure according to exemplary embodiments of the present general inventive concept. FIGS. 3A, 4A, 5A, 6A, 7A, 8A, 9A, 10A, 11A, and 12A are cross sectional views taken along lines of I-I' in FIGS. 3B, 4B, 5B, 6B, 7B, 8B, 9B, 10B, 11B, and 12B, respectively. FIG. 3C is an enlarged cross sectional view illustrating a sacrificial pattern structure.

Figure 3A:
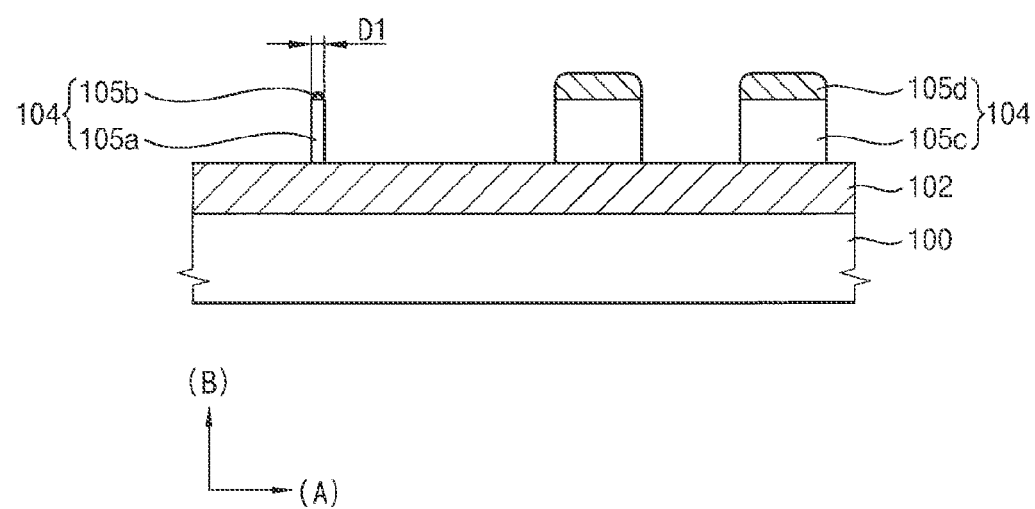
FIGS. 3A to 12B are cross sectional views and plan views illustrating a method of forming the pattern structure in FIG. 1A according to exemplary embodiments of the present general inventive concept.
Figure 3B:
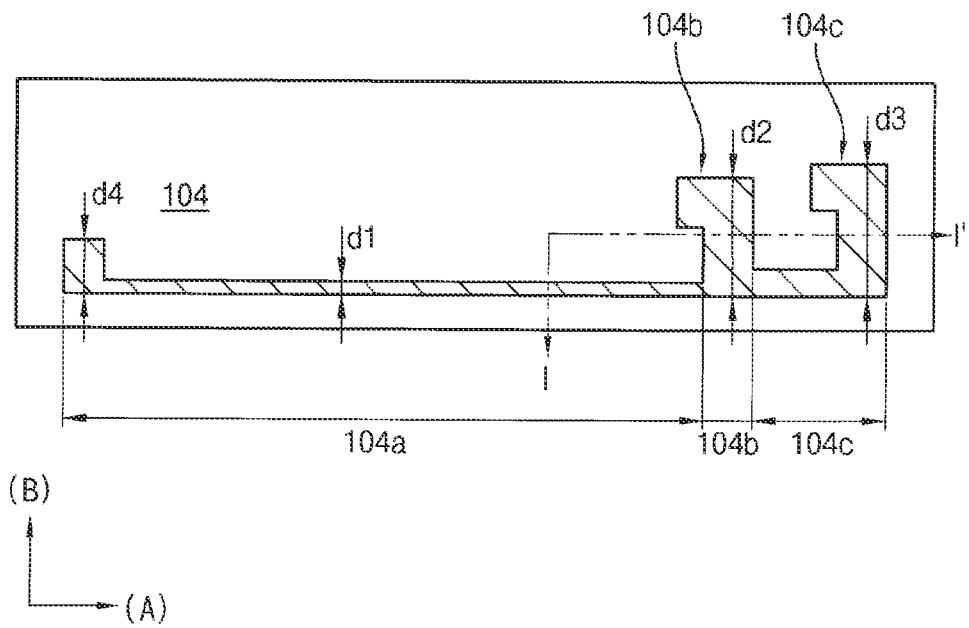
Figure 3C:
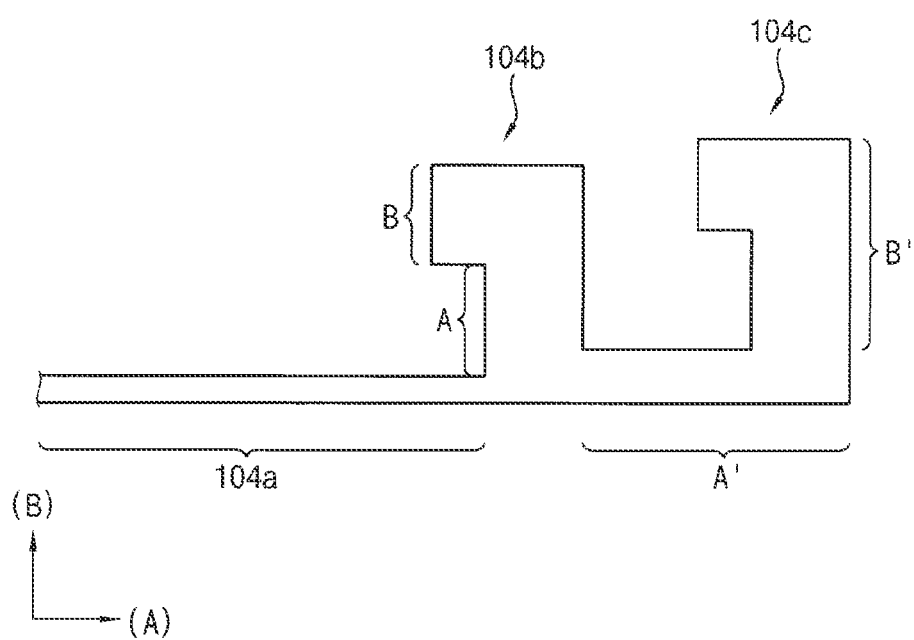

Referring to FIGS. 3A to 3C, a layer to be etched 102 is formed on a substrate 100. The layer to be etched 102 may include a mask pattern for etching an underlying layer (e.g., a layer adjacent to a surface of the layer 102) in a successive process. The layer to be etched 102 may be formed using oxide such as silicon oxide. For example, the layer to be etched 102 may include boro-phosphor silicate glass (BPSG), tonensilazane (TOSZ), high density plasma-chemical vapor deposition (HDP-CVD) oxide, plasma enhanced-tetraethylorthosilicate (PE-TEOS), etc.

A sacrificial layer (not illustrated) may be formed on the layer to be etched 102. The sacrificial layer may be a buffer layer to form an etching mask that has a first width and a second width, where the second width is greater than the first width, at different portions of the etching mask. The sacrificial layer may include a first material film and a second material film.

In example embodiments of the present general inventive concept, the first material film may be formed on the layer to be etched 102. The first material film may be formed using a first material that may be easily removed by an ashing process and/or a stripping process. The first material film may include polymer. For example, the first material film may be formed using spin on hard mask (SOH) material or carbon spin on hard mask (C-SOH) material. A portion of the first material film may be the etching mask. The first material film may have a predetermined thickness that includes a thickness of the etching mask.

A second material film may be formed on the first material film. The second material film may include a second material including nitride or oxynitride. For example, the second material film may be formed using silicon nitride (SiNx) or silicon oxynitride (SiOxNy). The second material film may be fully removed before etching the layer to be etched 102. Thus, the second material film may have a thickness that is smaller than that of the first material film.

The sacrificial layer may be patterned by a photolithography process to provide a sacrificial pattern structure 104. In example embodiments of the present general inventive concept, two patterns may be formed on the substrate 100 adjacent to both sides of one sacrificial pattern structure 104, so that the number of sacrificial pattern structures may be a half of the number of the patterns on the substrate 100.

Because the structure of the etching mask may vary in accordance with the shape of the sacrificial pattern structure 104, the shape of the sacrificial pattern structure 104 may be changed according to the shapes of pattern structures.

As illustrated in FIGS. 3A to 3C, the sacrificial pattern structure 104 may include one first material film 105a and one second material film pattern 105b on a first portion of the layer to be etched 102, or may include another first material film pattern 105c or another second material film pattern 105d on a second portion of the layer to be etched 102. The second material film patterns 105b and 105d may have different thickness (e.g., thicknesses in the (B) direction) according to the width (e.g., the width in the (B) direction) of the sacrificial pattern structure 104. Further, the first material film patterns 105a and 105c may have different widths (e.g., widths in the (B) direction) in accordance with the width (e.g., in the (B) direction) of the sacrificial pattern structure 104.

In example embodiments of the present general inventive concept, a first photoresist film may be coated on the second material film. The first photoresist film may be patterned to form a first photoresist pattern through an exposure process and a developing process. The first photoresist pattern may include a central portion and an end portion. The central portion of the first photoresist pattern may have a line shape and the end portion of the first photoresist pattern may have a width (e.g., a width in the (B) direction) that is larger than that of the central portion of the first photoresist pattern.

The second material film may be etched using the first photoresist pattern as an etching mask to form the second material film patterns 105b and 105d. The second material film may be anisotropically etched. Using the second material film patterns 105b and 105d as etching masks, the first material film may be etched to form the first material film patterns 105a and 105c beneath the second material film patterns 105b and 105d. One sacrificial patterns structure 104 may include the first and the second material film patterns 105a and 105b that have widths (e.g., widths in the (B) direction) that are smaller that those of the first and the second material film patterns 105c and 105d of another sacrificial pattern structure 104.

When the sacrificial pattern structures 104 are formed by an anisotropic etching process, the second material film pattern 105b having a width (e.g., in the (B) direction) that is smaller than of the width (e.g., in the (B) direction) of the second material film pattern 105d, the second material film pattern 105b may have etched damage that is larger than the second material film pattern 105d because of the difference in widths and the three-dimensional etching effect. Hence, the second material film pattern 105b having the smaller width (e.g., in the (B) direction) may be reduced after forming the sacrificial pattern structures 104 as illustrated in FIG. 3A. Namely, the second material film pattern 105b may have a reduced width in the (B) direction, so that the width difference in the (B) direction between the material layer patterns 105b and 105d may be more increased. Therefore, the pattern structures may have the shapes varied in accordance with the shapes of the sacrificial pattern structures 104 including the material film patterns 105a, 105c, 105d and 105d.

In example embodiments of the present general inventive concept, the sacrificial pattern structure 104 may include a sacrificial line 104a and a first sacrificial pad portion 104b and a second sacrificial pad portion 104c. The sacrificial line 104a may extend along a first direction (e.g., the (A) direction) and may have a first width (d1). The first sacrificial pad portion 104b may be connected to an end portion of the sacrificial line 104a. The first sacrificial pad portion 104b may extend in a direction substantially perpendicular to the first direction (e.g., the first sacrificial pad portion 104b may extend in the (B) direction). The first sacrificial pad portion 104b may have a width (d2) that is larger than the first width (d1) of the sacrificial line 104a. The second sacrificial pad portion 104c may make contact with an end portion of the first sacrificial pad portion 104b. The second sacrificial pad portion 104c may have a width (d3) that is larger than the first width (d1). The second sacrificial par portion 104c may be spaced apart from the first sacrificial pad portion 104b by a predetermined distance.

In example embodiments of the present general inventive concept, two etching masks may be formed adjacent to sidewalls of the sacrificial pattern structure 104. Here, the etching masks may be spaced apart from each other by removing the sacrificial line 104a. To reduce a distance between the etching masks, the first width of the sacrificial line 104a may be a critical width of a photolithography process. For example, the first width of the sacrificial line 104a may be in a range of about 40 nm to about 60 nm.

In example embodiments of the present general inventive concept, the first sacrificial pad portion 104b may include a line-shaped etching mask pattern and a pad-shaped etching mask pattern. Additionally, the second sacrificial pad portion 104c may include another line-shaped etching mask pattern and another pad-shaped etching mask pattern.

Referring now to FIG. 3C, the first sacrificial pad portion 104b includes a first preliminary extending portion (A) and a first preliminary pad portion (B). The first preliminary extending portion (A) may be connected with the end portion of the sacrificial line 104a along a direction substantially perpendicular to the first direction. That is, the first preliminary extending portion (A) may be connected with the end portion of the sacrificial line 104a in the (B) direction. The first preliminary pad portion (B) may extend from the first preliminary extending portion (A).

A pad may be positioned on the first preliminary pad portion (B). The second sacrificial pad portion 104c includes a second preliminary extending portion (A') and a second preliminary pad portion (B'). The second preliminary extending portion (A') may extend from the end portion of the first sacrificial pad portion line 104b along a direction substantially in parallel to the first direction. That is, the second preliminary extending portion (A') may extend from the end portion of the first sacrificial pad portion line 104b along the (A) direction. The second preliminary pad portion (B') may extend from the second preliminary extending portion (A'). For example, the second preliminary pad portion (B') may extend from the second preliminary extending portion (A') in the (B) direction. Another pad may be positioned on the second preliminary pad portion (B').

In example embodiments of the present general inventive concept, the first preliminary pad portion (B) may have a size substantially the same as or similar to that of the second preliminary pad portion (B'). Further, each of the first and the second preliminary pad portions (B and B') may have a width substantially the same as or substantially similar to those of the pad provided thereon. At least one of the first and the second preliminary extending portions (A and A') may be perpendicularly bent with respect to the first direction (e.g., the (A) direction) or may be bent relative to the first direction at a predetermined angle.

Other end portions of the first and the second sacrificial pad portions 104b and 104c may be bent in a direction (e.g., in the (B) direction) substantially perpendicular to the first direction (e.g., in the (A) direction). Further, another end portion of the sacrificial line 104a may be bent along a direction relative to the first direction (e.g., the (A) direction) with a predetermined angle. That is, both of end portions of the sacrificial line 104a may extend along different directions, respectively.

In example embodiments of the present general inventive concept, a width of the end portion of the first preliminary pad portion 104b (the first preliminary extending portion (A)) may correspond to the distance between two etching masks formed adjacent to both of sidewalls of the sacrificial pattern structure 104. That is, (w1) may be the width of the first preliminary extending portion (A) in the (B) direction. Thus, the end portion of the first preliminary pad portion 104b may have a width to minimize and/or prevent a short between end portions of the etching masks. For example, the end portion of the sacrificial line 104a may have a width (e.g., width (d4) illustrated in FIG. 3B) that is larger than the first width (d1).

Figure 4A:
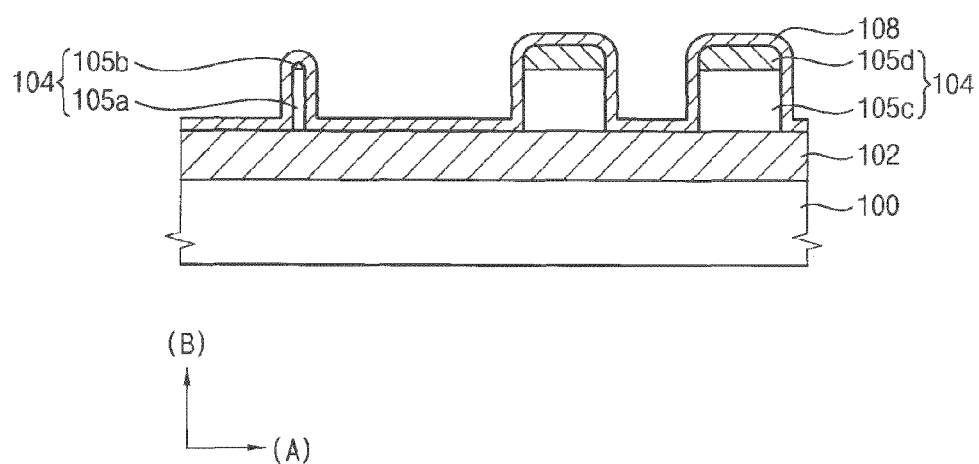
Figure 4B:
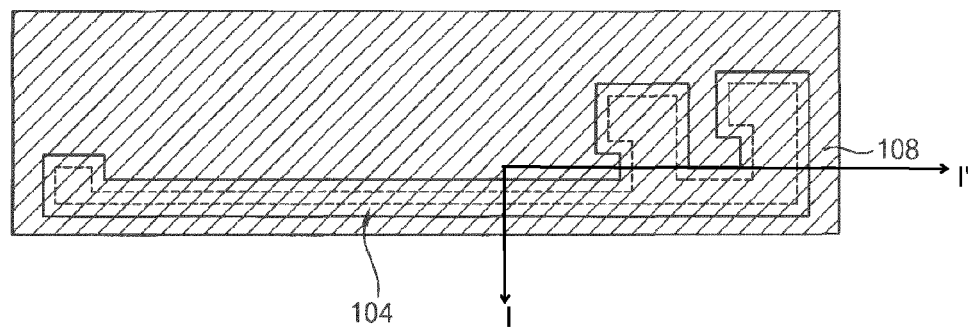

Referring to FIGS. 4A and 4B, a spacer formation layer 108 is formed along profiles of the layer to be etched 102 and the sacrificial pattern structures 104. That is, the spacer formation layer 108 may be conformally formed on the sacrificial pattern structures 104 and the layer to be etched 102.

The spacer formation layer 108 may be formed using oxide, for example, silicon oxide. The spacer formation layer 108 may have a thickness (e.g., a thickness in the (B) direction) substantially the same as or similar to that of the etching mask successively formed. For example, the spacer formation layer 108 may have a thickness smaller than the critical width of the photolithography process.

Figure 5A:
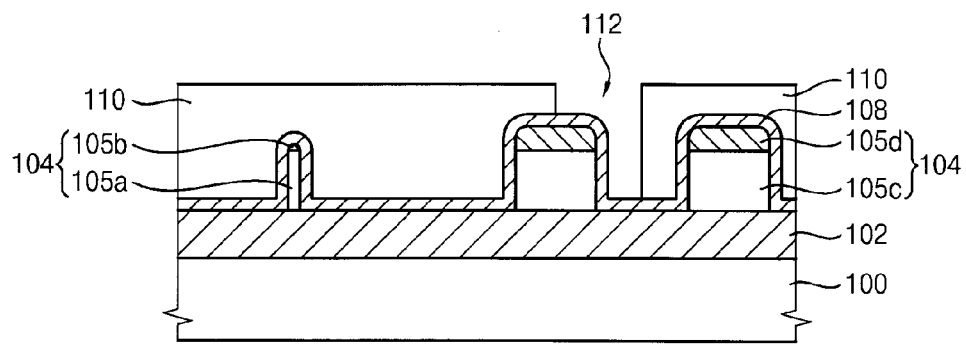
Figure 5B:
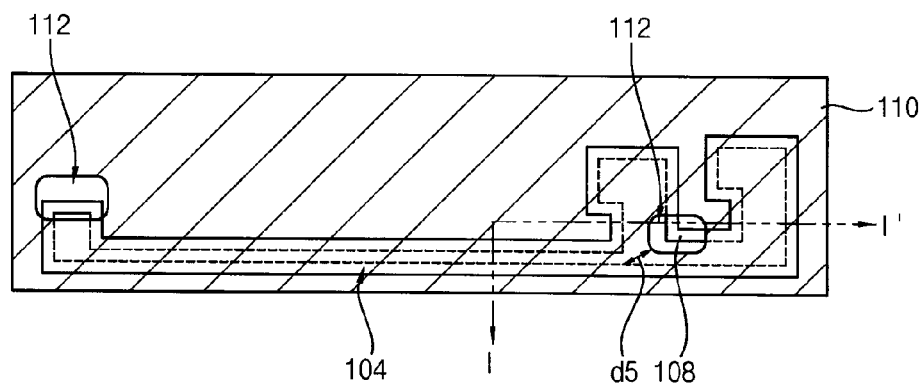

Referring to FIGS. 5A and 5B, a second photoresist film is coated on the spacer formation layer 108, and the second photoresist film may be processed by an exposure process and a developing process. Thus, a second photoresist pattern 110 is provided on the spacer formation layer 108. In example embodiments, two photolithography processes may form the pattern structure without any additional photolithography processes.

The second photoresist pattern 110 has a first opening 112 that selectively exposes a portion of the spacer formation layer 108 positioned between the sacrificial pattern structures 104. For example, the first opening 112 may expose a portion of the spacer formation layer 108 between the first and the second sacrificial pad portions 104b and 104c. Here, a portion of the spacer formation layer 108, under which bent portion of the first and the second sacrificial pad portions 104b and 104c are located, may be exposed through the first opening 112 formed through the second photoresist pattern 110.

In example embodiments of the present general inventive concept, a distance (d5) between a sidewall of the first opening 112 and the end portion of the sacrificial line 104a may be above about 30 nm to about 100 nm. When the distance between the first opening 112 and the sidewall of the sacrificial pattern structure 104 is less than or equal to a predetermined distance, failures of the etching masks may occur due to a mis-alignment because of the predetermined distance. When the distance between the first opening 112 and the sidewall of the sacrificial pattern structure 104 is greater than or equal to another predetermined distance, minute patterns may be connected that may short the adjacent minute patterns.

The second photoresist pattern 110 additionally exposes another portion of the spacer formation layer 108 positioned adjacent to the sidewall of the end portion of the sacrificial line 104a opposite to the first and the second sacrificial pad portions 104b and 104c.

Figure 6A:
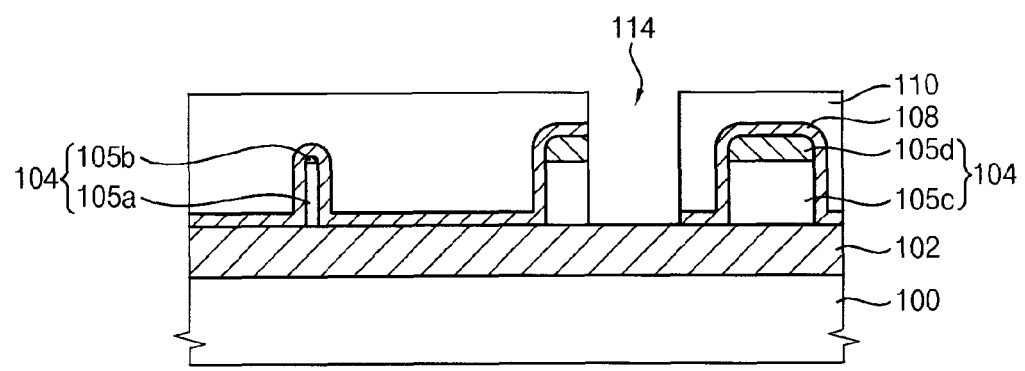
Figure 6B:
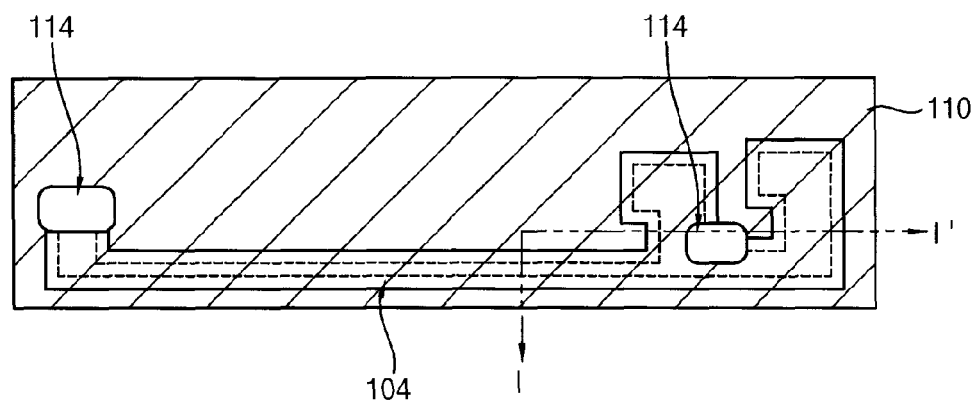

Referring to FIGS. 6A and 6B, exposed portion of the spacer formation layer 108 and portions of the sacrificial pattern structure 104 are etched using the second photoresist pattern 110 as an etching mask.

In an etching process using the second photoresist pattern 110, the spacer formation layer 108 may be divided into at least two portions by etching the portion of the spacer formation layer 108 on the end portions of the first and the second sacrificial pad portions 104b and 104c opposite to the sacrificial line 104a. Further, a second opening 114 may be formed from the first opening 112 between the first and the second sacrificial pad portions 104b and 104c. Here, a sidewall of a partially etched sacrificial pattern structure 104 may be exposed through the second opening 114. Other portions of the sacrificial pattern structures 104 may be exposed because the other portions of the sacrificial pattern structures 104 are covered with the spacer formation layer 108.

Figure 7A:
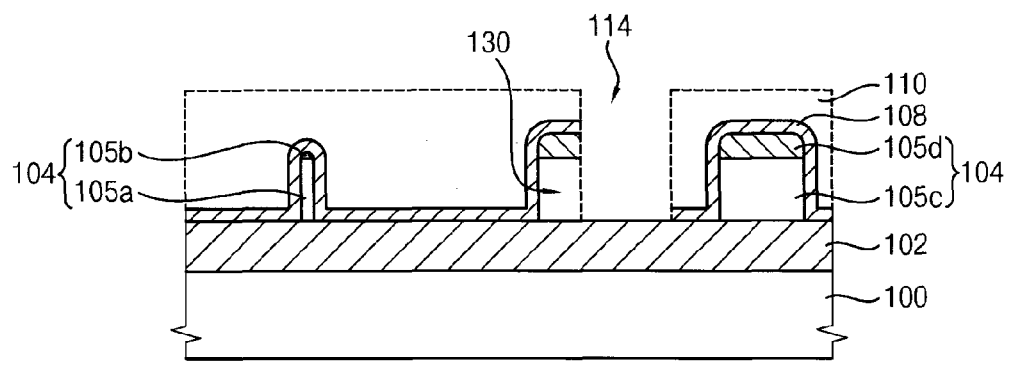
Figure 7B:
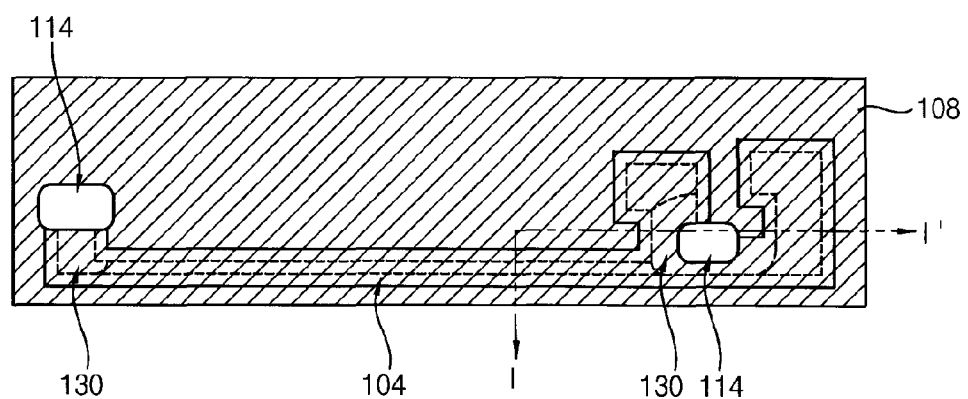

Referring to FIGS. 7A and 7B, the second photoresist pattern 110 is removed from the spacer formation layer 108. The second photoresist pattern 110 may be removed by an ashing process and/or a stripping process.

In the removal of the second photoresist pattern 110, portions of the first material film pattern 105a of the sacrificial pattern structure 104, which are exposed at the sidewall of the second opening 114 and the end portion of the sacrificial line 104a, are removed together with the second photoresist pattern 110.

Since the first material film pattern 105a includes organic material similar to the second photoresist pattern 110, the portions of the first material film pattern 105a may be removed with the second photoresist pattern 110 while isotropically etching the second photoresist pattern 110.

When the portions of the first material film pattern 105a are removed, a groove or a recess 130 is generated at a lower side of the second opening 114, so that the second opening 114 may have a lower width that is larger than an upper width thereof. However, the second material film patterns 105d and 105d may not be etched when the second photoresist pattern 110 is removed.

After removing the second photoresist pattern 110, lower portions of the first and the second sacrificial pad portions 104b and 104c may be separated from each other. That is, portions of the first material film pattern 105a between the first and the second sacrificial pad portions 104b and 104c may be removed to thereby expose portions of the spacer formation layer 108 adjacent to both of the end portions of the sacrificial line 104a through the lower sidewall of the second opening 114.

When removing the portions of the first material film pattern 105a, lower portions of the first and the second preliminary extending portions (A and A') in the first and the second sacrificial pad portions 104b and 104c may be removed, respectively. However, the first and the second preliminary pad portions (B and B') may not be etched because the pads may be formed thereon.

Because the second material film pattern 105d is not etched when the second photoresist pattern 110 is removed, upper portions of the first and the second sacrificial pad portions 104b and 104c.

Figure 8A:
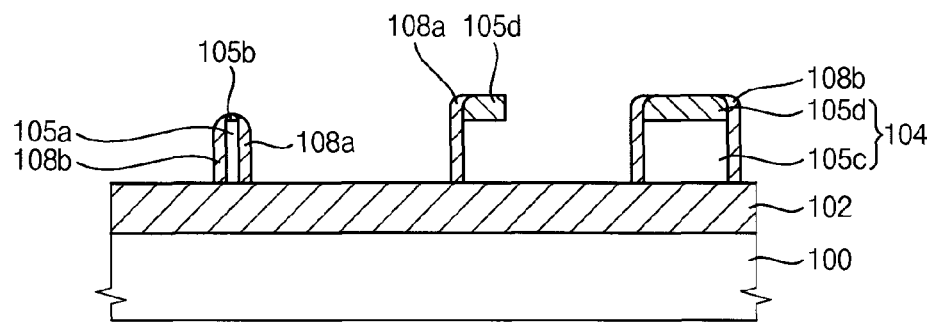
Figure 8B:
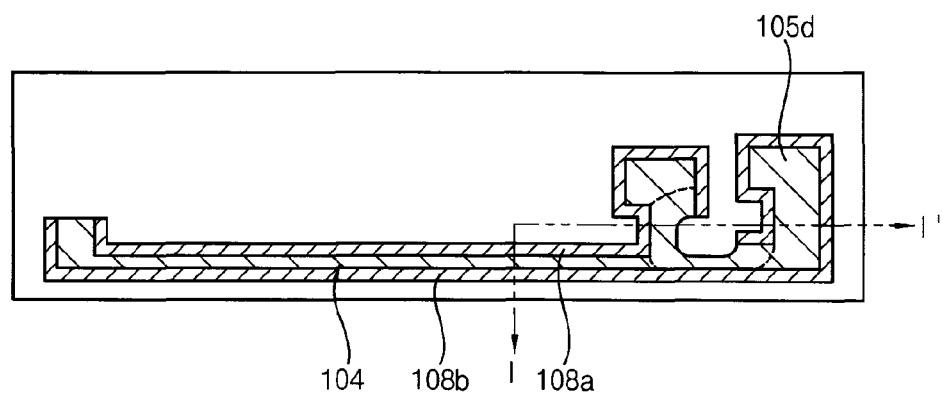

Referring to FIGS. 8A and 8B, first and second spacers 108a and 108b are formed by etching the spacer formation layer 108 (illustrated in FIG. 7B). The first and second spacers 108a and 108b may be obtained by an anisotropic etching process. The first and second spacers 108a and 108b may be positioned on both of the sidewalls of the sacrificial pattern structure 104.

Since the portions of the spacer formation layer 108 is previously removed at the second opening 114, the first and the second spacers 108a and 108b are not formed at sidewalls of the second opening 114 (as illustrated in FIG. 7B). Thus, two spacers 108a and 108b may be formed at both of the sidewalls of one sacrificial pattern structure 104. Here, end portions of the first and the second spacers 108a and 108b may be separated. Further, one of the spacers 108a and 108b (e.g., the first spacer 108a) may enclose a sidewall of the first sacrificial pad portions 104b whereas the other of the spacers 108a and 108b (e.g., the second spacer 108b) may enclose a sidewall of the second sacrificial pad portion 104c (e.g., where first and second sacrificial pad portions 104b and 104c are illustrated in FIG. 3B).

Figure 9A:
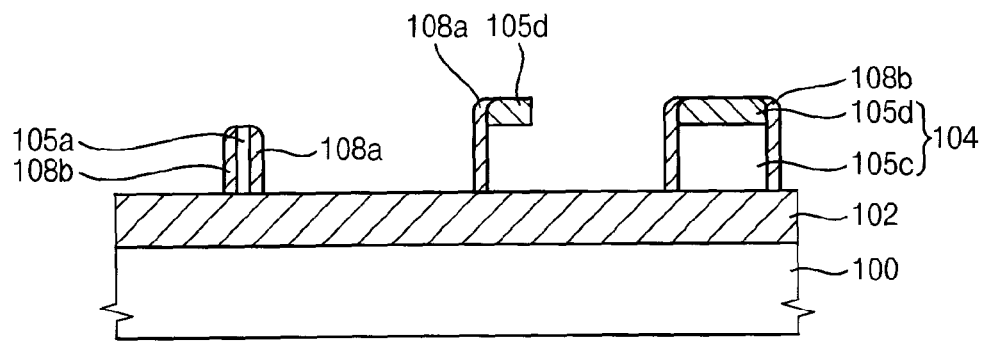
Figure 9B:
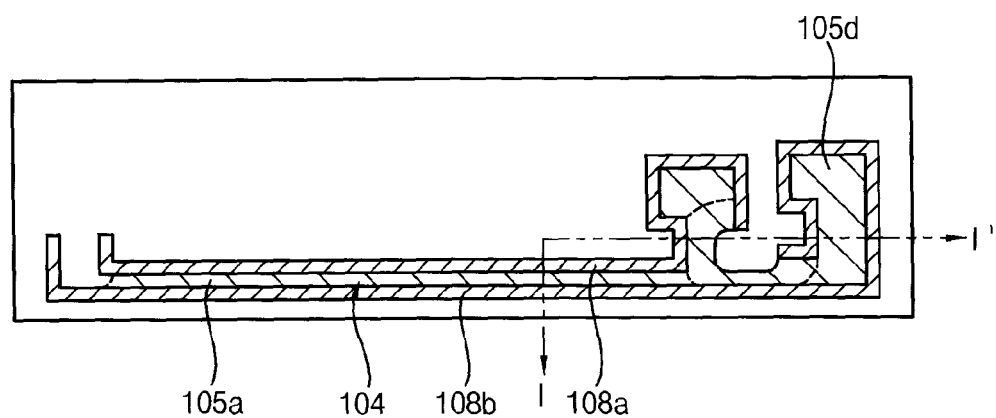

Referring to FIGS. 9A and 9B, the second material film pattern 105b included in the sacrificial line 104a having the first width is removed while remaining the second material film pattern 105d included in the first and the second sacrificial pad portions 104b and 104c (e.g., where first and second sacrificial pad portions 104b and 104c are illustrated in FIG. 3B).

As described above, the second material film pattern 105b in the sacrificial line 104a (see FIG. 3B) having the first width may be the relatively small thickness, whereas the second material film pattern 105d in the first and the second sacrificial pad portions 104b and 104c (see FIG. 3B) may have the relatively large thickness. Therefore, the second material film pattern 105b in the sacrificial line 104a may be removed by controlling an etching time without forming any additional etching mask while remaining the second material film pattern 105d in the first and the second sacrificial pad portions 104b and 104c.

Figure 10A:
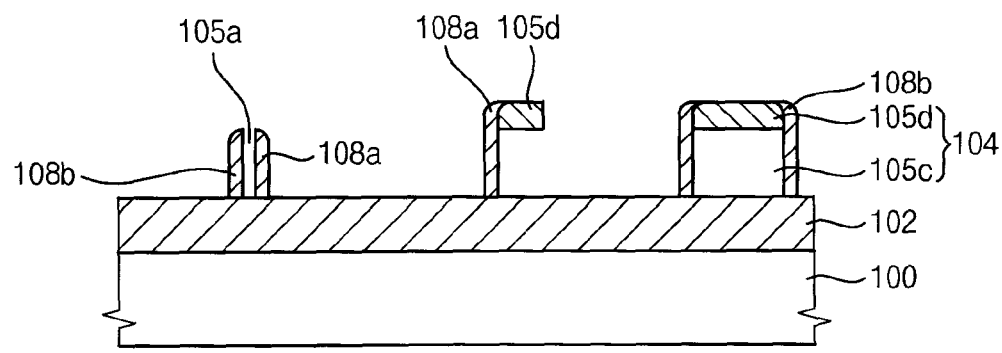
Figure 10B:
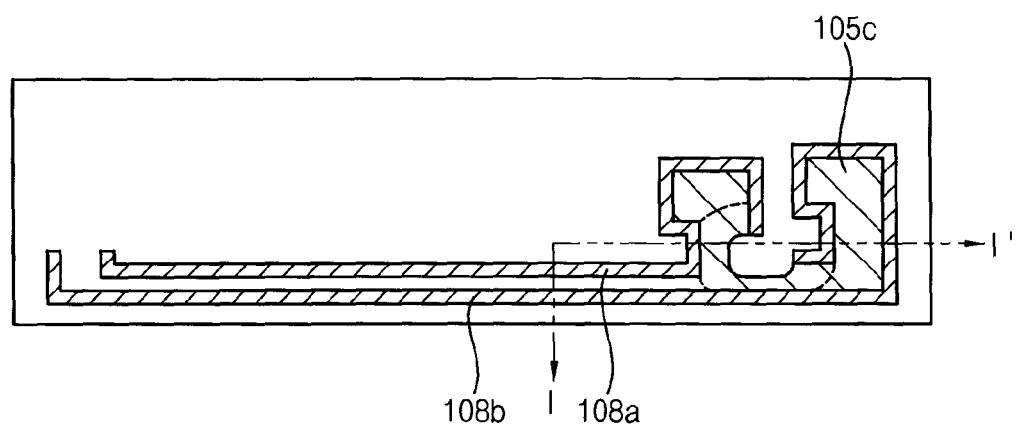

Referring to FIGS. 10A and 10B, the first material film pattern 105a exposed after removing the second material film pattern 105b is removed. However, the first material film pattern 105c beneath the remaining second material film pattern 105d is not exposed, so that the first material film pattern 105c in the first and the second sacrificial pad portions 104b and 104c is not etched. The first material film pattern 105a may be removed by an anisotropic etching process.

In example embodiments of the present general inventive concept, the first material film pattern 105a included in the sacrificial line 104a may be removed, such that a gap may be provided between the first and the second spacers 108a and 108b. The first material film pattern 105c in the first and the second sacrificial pad portions 104b and 104c may not removed because the remaining second material film pattern 105d covers the first material film pattern 105c.

In example embodiments of the present general inventive concept, the second material film pattern 105d corresponding to the preliminary extending portions (A and A') may remain in the first and the second sacrificial pad portions 104b and 104c. Hence, lower portions of the first and the second sacrificial pad portions 104b and 104c may be separated each other. The preliminary pad portions (B and B') of the first and the second sacrificial pad portions 104b and 104c may be covered with the first and the second material film patterns 105c and 105d, so that the first and the second spacers 108a and 108b may remain to enclose sidewalls of the preliminary pad portions (B and B').

Figure 11A:
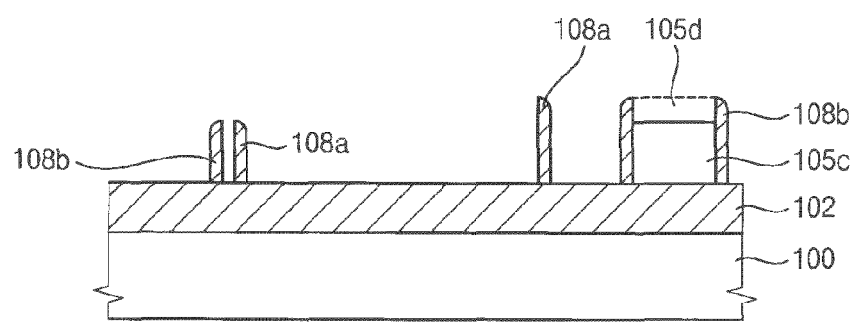
Figure 11B:
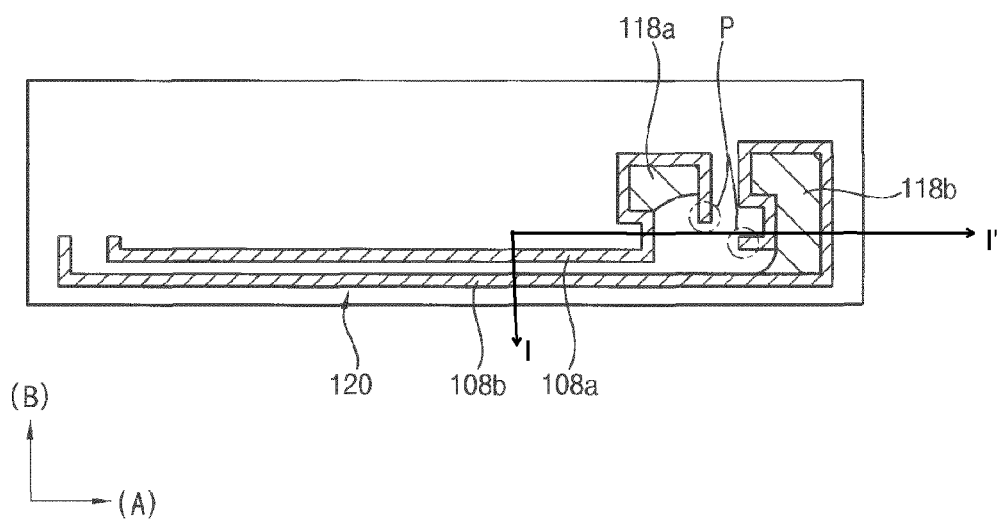

Referring to FIGS. 11A and 11B, the remaining second material film pattern 105d is removed. When the second material film pattern 105d is etched, an etching mask structure 120 is provided on the layer to be etched 102 formed on the substrate 100.

The etching mask structure 120 may include the first spacer 108a, the second spacer 108b, a first pad mask pattern 118a, and a second pad mask pattern 118b. The first and the second pad mask patterns 118a and 118b may make contact with end portions of the first and the second spacers 108a and 108b.

In example embodiments of the present general inventive concept, the etching mask structure 120 may have constructions that correspond with that of the sacrificial pattern structure. As for the etching mask structure 120, the first and the second spacers 108a and 108b may be disposed in parallel each other.

Each of the first and the second spacers 108a and 108b may have a line and/or rectangular shape. The first and the second spacers 108a and 108b may be spaced apart by a predetermined distance. The first and the second pad mask patterns 118a and 118b may include the remaining first material film pattern 105c. The pads will be provided on the first and the second pad patterns 118a and 118b.

As illustrated in FIG. 11B, the first spacer 108a may enclose a sidewall of the first pad mask pattern 118a, and the first spacer 108a may protrude from a side of the first pad mask pattern 118a. The second spacer 108b may also enclose a sidewall of the second pad mask pattern 118b, and may extend from a side of the second pad mask pattern 118b.

Protruding portions (P) of the first and the second spacers 108a and 108b may be formed from the first material film pattern 105a exposed through the second opening 114 while remaining the first and the second spacers 108a and 108b during removing the second photoresist pattern 110. That is, the protruding portions (P) of the first and the second spacers

108a and 108b may be protruded with heights in the (B) direction corresponding to the thickness depth of the removed first material film pattern 105a.

In example embodiments of the present general inventive concept, portions of the first material film pattern 105a corresponding to the preliminary extending portions (A and A') in the first and the second sacrificial pad portions 104b and 104c may be removed when removing the second photoresist pattern 110. Therefore, the protruding portions (P) may be in parallel to the preliminary extending portions (A and A', illustrated in FIG. 3C), respectively. Further, each of the preliminary extending portions (A and A') may have a length (in the (A) direction) substantially the same as or larger than a width (in the (B) direction) of the removed first material film pattern 105a in the sacrificial line 104a in the removal of the second photoresist pattern 110.

In some example embodiments of the present general inventive concept, end portions of the first and the second pad mask patterns 118a and 118b opposite to the first and the second spacers 108a and 108b may be bent along a direction (e.g., the (B) direction) substantially perpendicular to the first direction (e.g., the (A) direction) or may be bent with a predetermined angle with respect to the first direction.

There may be no patterns at end portions of the first and the second spacers 108a and 108b, so that an etching loading effect may not occur at the end portions of the first and the second spacers 108a and 108b. The etching loading effect may be increased at portions of the layer to be etched 102 positioned beneath the end portions of the first and the second spacers 108a and 108b in a successive etching process. In other words, the portions of the layer to be etched 102 at the end portions of the first and the second spacers 108a and 108b may have increased widths (e.g., in the (B) direction) due to the increased etching loading effect.

When the portions of the layer to be etched 102 have increased widths, a bridge failure may occur at the enlarged portions of the layer to be etched 102. However, the end portions of the first and the second spacers 108a and 108b opposite to the first and the second pad mask patterns 118a and 118b may have the bent shapes (e.g., bent in the (B) direction) from the first direction (e.g., the (A) direction) as described above, such that the bridge failure in a pattern structure formed from the layer to be etched 102 may be reduced.

Figure 12A:
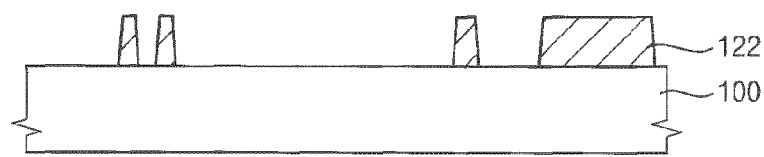
Figure 12B:
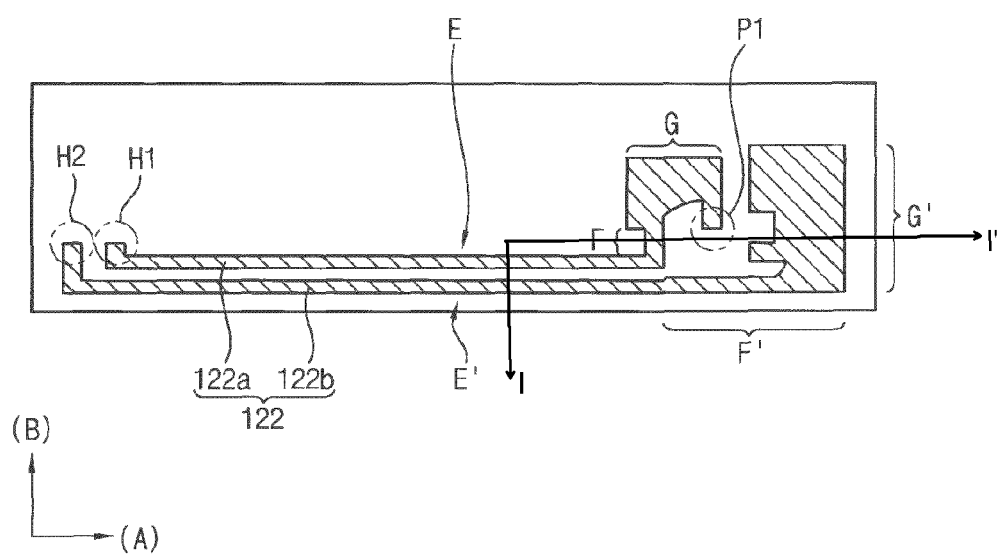

Referring to FIGS. 12A and 12B, the layer to be etched 102 is etched using the etching mask structure 120 to form a desired pattern structure on the substrate 100. The pattern structure includes a first pattern 122a and a second pattern 122b. The first pattern 122a may be arranged in parallel to the second pattern 122b.

In example embodiments of the present general inventive concept, the first pattern 122a of the pattern structure includes a first line pattern (E), a first extending line (F) and a first pad (G). The first line pattern (E) may extend along the first direction (e.g., the (A) direction). The first line pattern (E) may have a first width (e.g., a width in the (B) direction). The first extending line (F) may be connected with an end portion of the first line pattern (E).

The first pad (G) may make contact with the end portion of the first line pattern (E). The first pad (G) may have a width (e.g., in the (B) direction) that is larger than the first width. The first pad (G) may include a protruding portion P1 extending from a side of the first pad (G). Another end portion (H1) of the first line pattern (E) opposite to the first pad (G) may be bent along a direction (e.g., the (b) direction) that is substantially perpendicular to the first direction (e.g., the (A) direction).

The protruding portion of the first pad (G) may be formed by masking a portion of the layer to be etched 102 with the first and the second spacers 108a and 108b. Further, the first extending line (F) may also formed by masking a portion of the layer to be etched 102 with the first and the second spacers 108a and 108b. Therefore, the protruding portion P1 of the first pad (G) may have a width (e.g., in the (B) direction) substantially the same as or similar to that of the first extending line (F). Additionally, the width (e.g., in the (B) direction) of each the protruding portion of the first pad (G) and the first extending line (F) may respectively have widths (e.g., in the (B) direction) larger than those of the first and the second spacers 108a and 108b because of an etching loading effect.

The second pattern 122b of the pattern structure includes a second line pattern (E'), a second extending line (F') and a second pad (G'). The second line pattern (E') of the second pattern 122b may be adjacent to the first line pattern (E) of the first pattern 122a. The second line pattern (E') may extend in parallel relative to the first line pattern (E). The second line pattern (E') may also have a first width (e.g., a width in the (B) direction).

The second extending line (F') may be connected with an end portion of the second line pattern (E'). The second pad (G') may make contact with the end portion of the second line pattern (E'). The second pad (G') may have a width (e.g., in the (B) direction) larger than the first width. The second pad (G') may include a protruding portion extending from a lateral portion of the second pad (G'). Another end portion (H2) of the second line pattern (E') opposite to the second pad (G') may also be bent along a direction substantially perpendicular (e.g., in a (B) direction) to the first direction (e.g., the (A) direction).

Although the first extending line (F) and the first line pattern (E) may be formed by masking portions of the layer to be etched 102 with the spacers 108a and 108b, the first extending line (F) may have a width (e.g., in the (B) direction) different from that of the first line pattern (E) because of the etching loading effect. When etching the layer to be etched 102 using the etching mask structure 120, the second line pattern (E') may be closed to the first line pattern (E), so that the etching loading effect may be reduced due to the increased pattern density between the first and the second line patterns (E and E'). However, the first extending line (F) may be spaced apart from the second extending line (F') by a predetermined distance, such that the etching loading effect may be increased due to the relatively low pattern density between the first and the second extending lines (F and F'). Therefore, the first extending line (F) may have a width (e.g., in the (B) direction) that is larger than that of the first line pattern (E). The etching loading effect may not affect the widths of the patterns, so that the width (e.g., in the (B) direction) of the first extending line (F) may be smaller than that of the first pad (G).

In the above-described etching loading effect, the second extending line (F') may have a width (e.g., in the (B) direction) that is larger than that of the second line pattern (E'). Further, the width of the second extending line (F') may be smaller than that of the second pad (G').

As described with reference to FIGS. 7A to 12B, a plurality of layers may be sequentially etched without an additional photolithography process. Therefore, the processes described with reference to FIGS. 7A to 12B may be carried out in-situ without a break of vacuum.

Because an additional photolithography process may not be performed in order to form the pattern structure in the semiconductor device, the cost and time for forming the pattern structure may be reduced, and also a failure of the pattern structure may be reduced.

According to example embodiments of the present general inventive concept, a pattern structure including a minute pattern and a pad may be obtained with an increased reliability by employing two photolithography processes. For example, the pattern structure may include a minute pattern and a pad having a width that is larger than that of the minute pattern. Because the minute pattern and the pad may be simultaneously formed, a mis-alignment between the minute pattern and the pad may be minimized and/or prevented.

Hereinafter, a pattern structure array including a plurality of minute patterns will be described with reference to the accompanying drawings. Each of the minute patterns in the pattern structure array may have a construction substantially the same as or similar to that of the above-described first pattern and/or the second pattern in connection with FIGS. 1A-12B.

Figure 13:
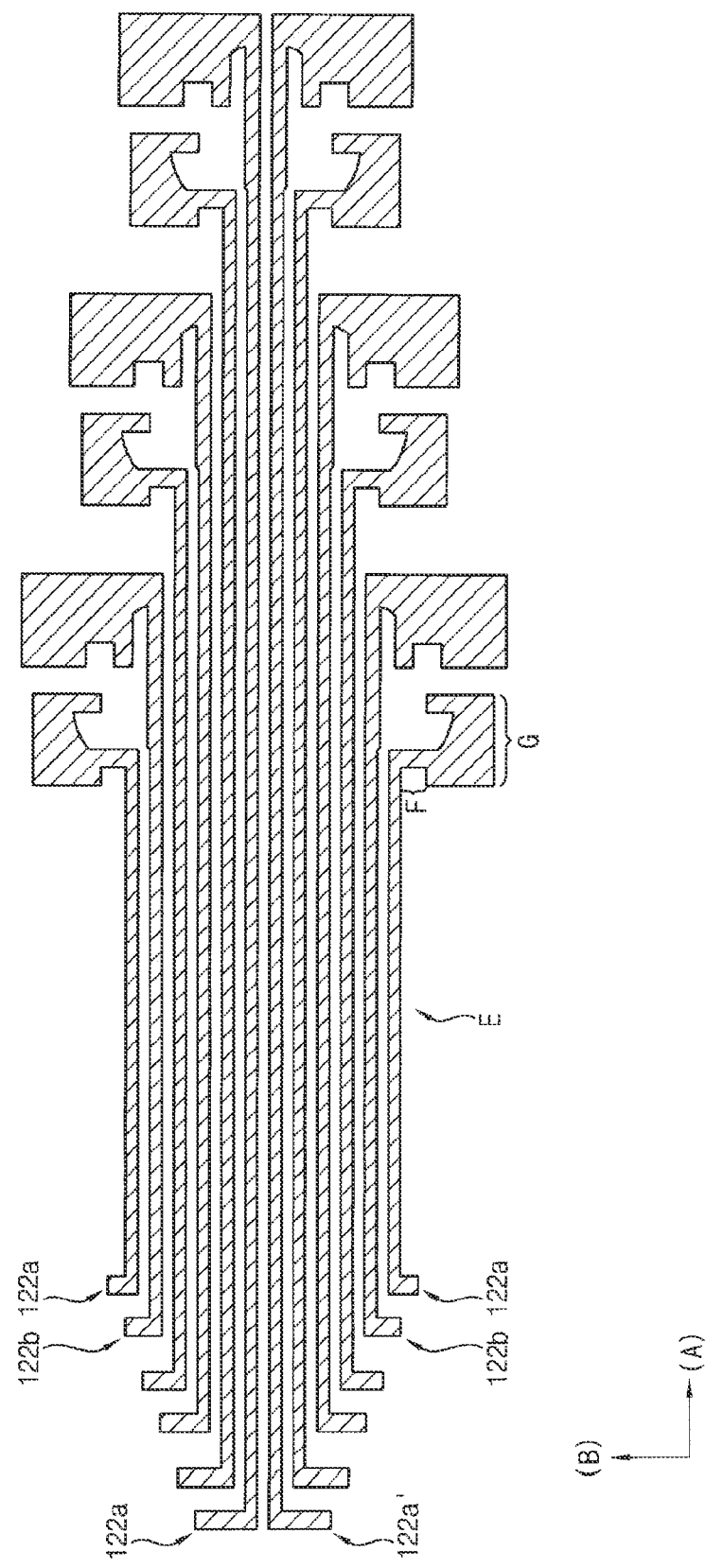
FIG. 13 is a plan view illustrating a pattern structure array including alternatively arranged first patterns and second patterns in FIGS. 1A and 1B according to exemplary embodiments of the present general inventive concept.

FIG. 13 is a plan view illustrating a pattern structure array including alternatively arranged first patterns and second patterns in FIGS. 1A and 1B according to example embodiments of the present general inventive concept.

As illustrated in FIG. 13, the pattern structure array includes a plurality of first patterns 122a and a plurality of second patterns 122b. Each of the first patterns 122a may have a structure substantially the same as or similar to that of the first pattern described with reference to FIGS. 1A and 1B, and each second pattern 122b may also have a structure substantially the same as or similar to that of the second pattern described with reference to FIGS. 1A and 1B.

The first and the second patterns 122a and 112b may be arranged in parallel one another. The first and the second patterns 122a and 112b may have different lengths whereas the first and the second patterns 122a and 122b may have same shapes, respectively. For example, line patterns (E) of the first and the second patterns 122a and 122b may have different lengths.

In example embodiments of the present general inventive concept, the first patterns 122a may be positioned at odd lines whereas the second patterns 122b may be located at even lines. However, positions of the first and the second patterns 122a and 122b may vary in accordance with a construction of the pattern structure array.

In the pattern structure array, the first and the second patterns 122a and 122b disposed at a center of the pattern structure in a direction substantially perpendicular (e.g., the (B) direction) to the first direction (e.g., the (A) direction) may have relatively large lengths. Other first and second patterns 122a and 122b may have gradually decreased lengths from the center of the pattern structure array toward borders of the pattern structure array.

The first and the second patterns 122a and 122b may be symmetrically disposed on another centering the patterns 122a and 122a' disposed at the center of the pattern structure in the direction perpendicular (e.g., the (B) direction) to the first direction (e.g., the (A) direction).

The line patterns (E) in the first and the second patterns 122a and 122b may be arranged relative to pads (G) of the first and the second patterns 122a and 122b without generating shorts between the line patterns (E) and the pads (G). To minimize and/or prevent the short between the line patterns (E) and the pads (G), the line patterns (E) and the pads (G) in the patterns 122a and 122a' disposed at the center of the pattern structure in the direction perpendicular (e.g., the (B) direction) to the first direction (e.g., the (A) direction) may be protruded rather than the line patterns (E) and the pads (G) in adjacent first and second patterns 122a and 122b.

End portions of the first and the second patterns 122a and 122b opposite to the line patterns (E) and the pads (G) may also be arranged without shorting the end portions of the first and the second patterns 122a and 122b. Considering the shorts between the end portions of the first and the second patterns 122a and 122b, end portions of the patterns 122a and 122a' disposed at the center of the pattern structure in the direction perpendicular (e.g., the (B) direction) to the first direction (e.g., the (A) direction) may be protruded rather than adjacent first and second patterns 122a and 122b.

In example embodiments of the present general inventive concept, the pattern structure array illustrated in FIG. 13 may be formed by processes substantially the same as or similar to those described with reference to FIGS. 4A to 12B. For example, a plurality of sacrificial pattern structures having different lengths may be provided on a layer to be etched to form the pattern structure array illustrated in FIG. 13.

Hereinafter, a method of forming the pattern structure array illustrated in FIG. 13 will be described with reference to the accompanying drawings.

Figure 14:
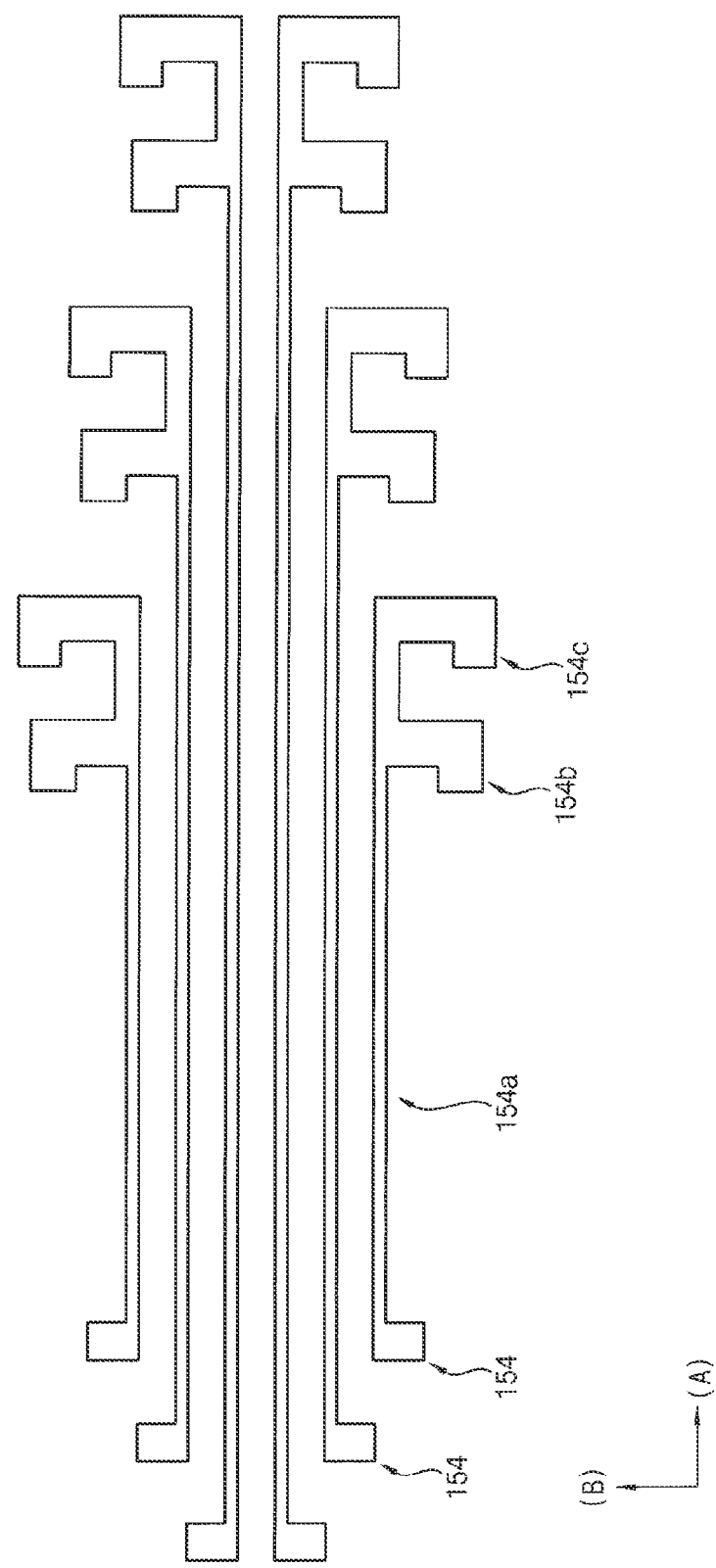
FIGS. 14 and 15 are plan views illustrating a method of forming the pattern structure array in FIG. 13 according to exemplary embodiments of the present general inventive concept.
Figure 15:
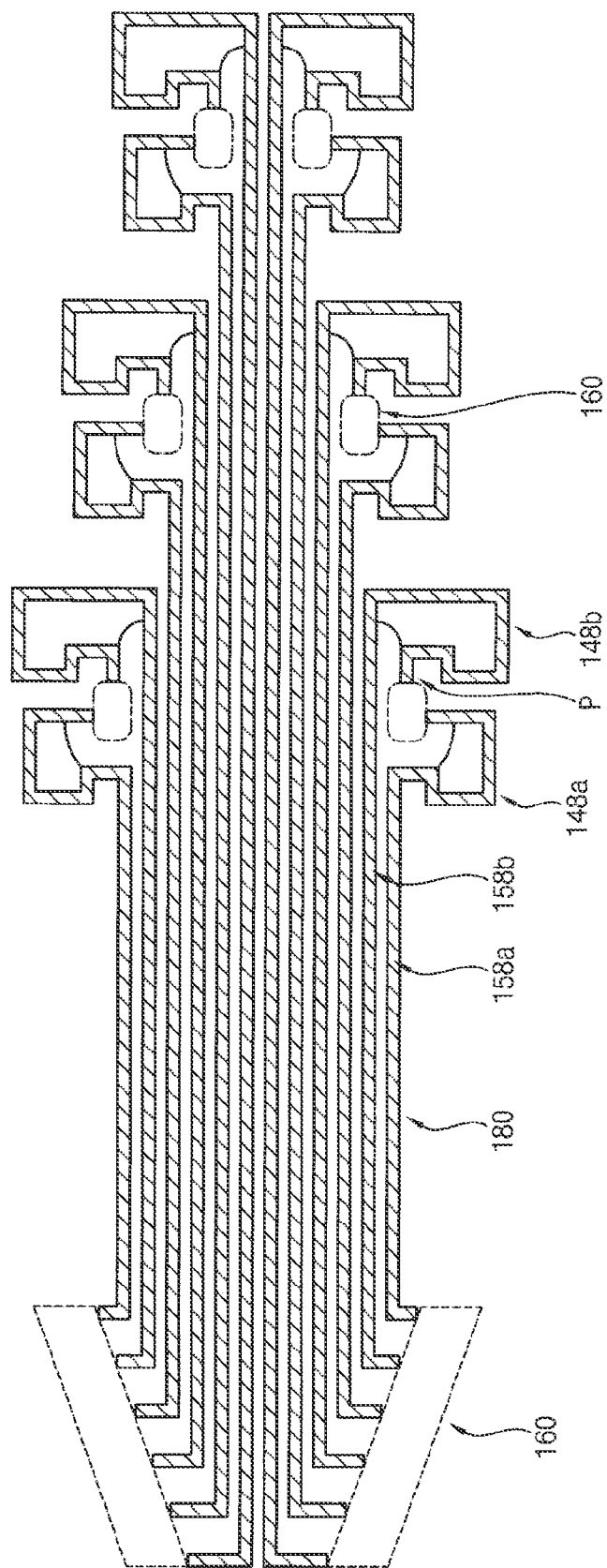

FIGS. 14 and 15 are plan views illustrating a method of forming the pattern structure array in FIG. 13.

Referring to FIG. 14, a plurality of sacrificial pattern structures 154 are formed on an object to be etched positioned on a substrate. The sacrificial pattern structures 154 may have different lengths, respectively. Each of the sacrificial pattern structures 154 includes a sacrificial line 154a, a first sacrificial pad portion 154a and a second sacrificial pad portion 154c.

Among the sacrificial pattern structures 154, one sacrificial pattern structure 154 disposed on a center of the object along a direction perpendicular (e.g., the (B) direction) to a direction (e.g., the (A) direction) where the sacrificial pattern structures 154 extend may have the largest length than other sacrificial pattern structures 154. Additionally, other sacrificial pattern structures 154 may be symmetrically arranged one another centering the sacrificial pattern structure 154 disposed at the center of the object.

Referring to FIG. 15, an etching mask structure 180 is formed on the object by processes substantially the same as or similar to those described with reference to FIGS. 4A to 11B.

In FIG. 15, a reference numeral 160 indicates portions of the sacrificial pattern structures 154 exposed by the second photoresist pattern in the processes described with reference to FIGS. 5A and 5B. After forming the second photoresist pattern, portions of the sacrificial pattern structures 154 beneath the exposed portions, so that line patterns of the sacrificial pattern structures 154 opposite to pads may be separated, thereby defining two pad mask patterns 148a and 148b in one sacrificial pattern structure 154.

Spacers 158a and 158b of the etching mask structure 180 may be generated using the line patterns and protruding portions (P) in the sacrificial pattern structures 154.

The object, for example a layer to be etched, may be patterned using the etching mask structure 180, to thereby form a pattern structure array having a construction substantially the same as or similar to that of the pattern structure array described with reference to FIG. 13.

According to example embodiments of the present general inventive concept, the pattern structure array may serve as a gate electrode and/or a word line of a semiconductor memory device. For example, the pattern structure array may be employed as a word line of a NAND type flash memory device.

Figure 16:
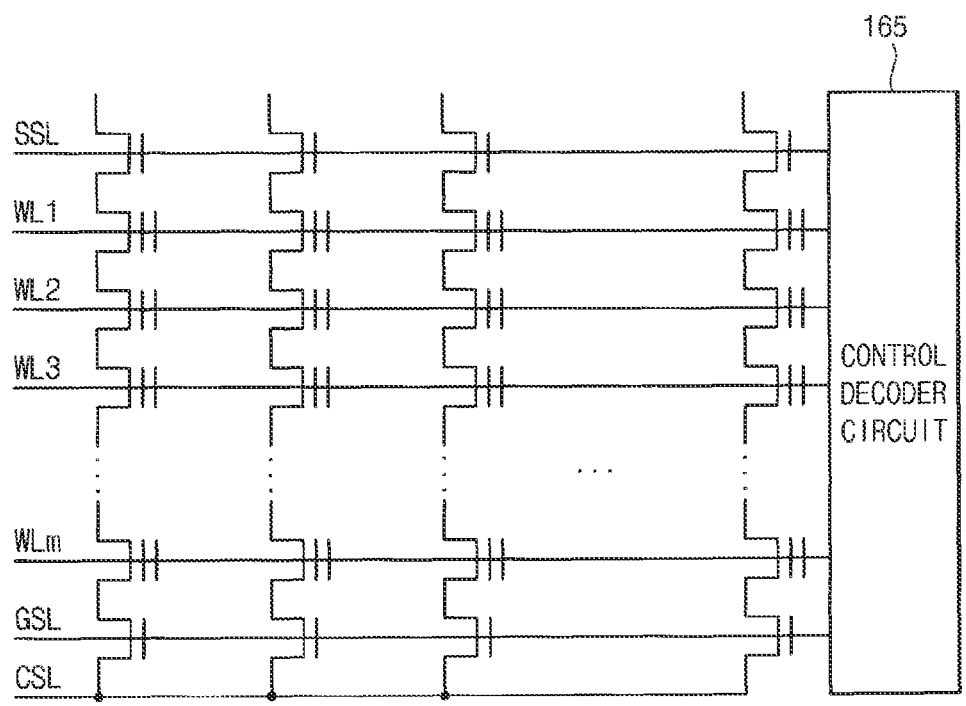
FIG. 16 is a circuit diagram illustrating a unit cell of a NAND type flash memory device according to exemplary embodiments of the present general inventive concept.
Figure 17A:
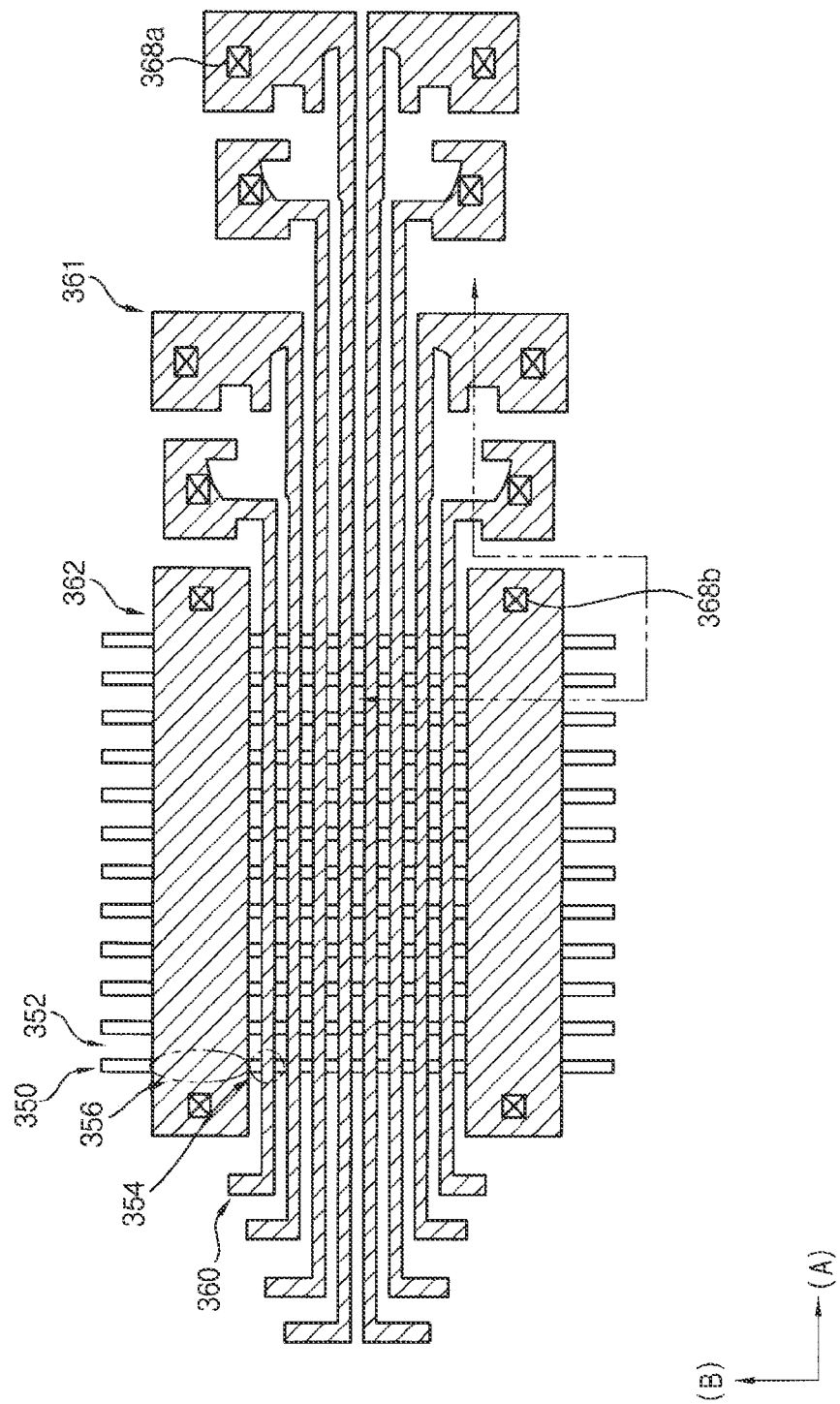
FIG. 17A is a plan view illustrating a unit cell of a NAND type flash memory device including the patterns structure in FIGS. 1A and 1B according to exemplary embodiments of the present general inventive concept.
Figure 17B:
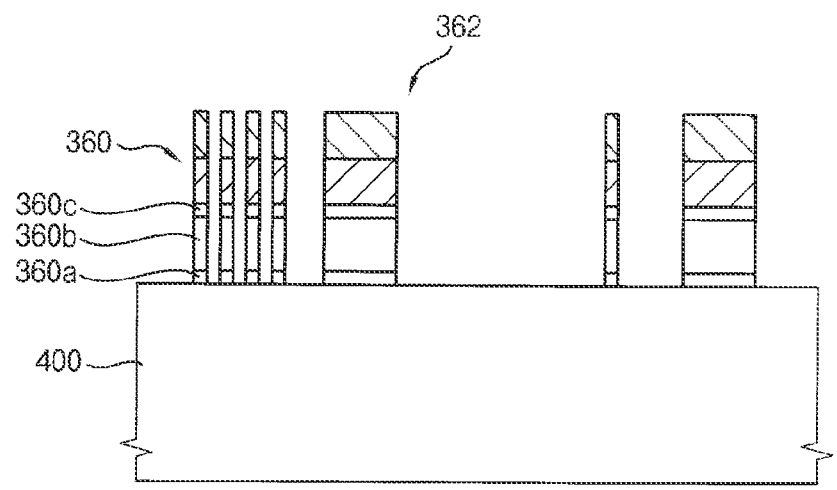
FIG. 17B is a cross sectional view illustrating the unit cell of the NAND flash memory device including the pattern structure in FIGS. 1A and 1B according to exemplary embodiments of the present general inventive concept.

FIG. 16 is a circuit diagram illustrating a unit cell of a NAND type flash memory device. FIG. 17A is a plan view illustrating a unit cell of a NAND type flash memory device including the patterns structure in FIGS. 1A and 1B. FIG. 17B is a cross sectional view illustrating the unit cell of the NAND flash memory device including the pattern structure in FIGS. 1A and 1B.

Referring to FIG. 16, unit cells of the NAND type flash memory device are disposed on a substrate. Each cell string in a cell region of the substrate includes a plurality of word lines (WL1, WL2, WL3, ..., WLm). Generally, 32 word lines may be provided in one string. Cell transistors may be provided to be electrically the word lines (WL1, WL2, WL3, ..., WLm), respectively.

A cell selection line (SSL) may be positioned adjacent to one of the outermost word lines (i.e., the word line (WL1), and a ground selection line (GSL) may be located adjacent to the other of the outermost word lines (i.e., the word line (WLm). Cell selection transistors and ground selection transistors may be electrically connected to the cell selection line (SSL) and the ground selection line (GSL), respectively.

Impurity regions of the cell transistors may be electrically connected to bit lines, and impurity regions of the ground selection transistor may be electrically connected to a common source line (CSL). The common source line (CSL) may extend so that the common source line (CSL) electrically connects the strings disposed along a direction where the word lines (WL1, WL2, WL3, ..., WLm) extend. In example embodiments of the present general inventive concept, the cell strings may be symmetrically disposed one after another centering one common source line (CLS).

A control decoder circuit 165 may control operations of the unit cells of the NAND type flash memory device. The unit cells of the NAND type flash memory device illustrated in FIG. 16 may be provided on a semiconductor substrate, for example, a single crystalline silicon substrate.

Referring to FIGS. 17A and 17B, the substrate may include an active region and an isolation region. Various elements of the NAND type flash memory device may be formed in the active region, and the isolation region may electrically isolate the elements in one active region from adjacent elements in adjacent active region.

Active patterns 350 are provided in the active region. Each of the active patterns 350 may have a line shape and may extend along a second direction (e.g., the (B) direction). The active patterns 350 may be alternatively disposed in the active region. In example embodiments of the present general inventive concept, each active pattern 350 may have a small width substantially similar to or the same as the critical width of the photolithography process. Trenches may be positioned between adjacent active patterns 350, and isolation layer patterns 352 are formed in the trenches, respectively.

Cell transistors 354, word lines 360 and selection transistors 356 are provided on the active patterns 350.

Each of the cell transistors 354 may include a tunnel insulation layer pattern 360a, a floating gate 360b, a dielectric layer pattern 360c and a control gate 360. The tunnel insulation layer pattern 360a is formed on the active pattern 350. The floating gate 360b may be isolated from adjacent floating gate.

A plurality of floating gates may be arranged on the tunnel insulation layer pattern 360a at predetermined intervals from one another. The dielectric layer pattern 360c may be disposed on the floating gate 360b. The control gate 360 may be positioned on the dielectric layer pattern 306b. The control gate 360 may have a line shape and may extend along a second direction substantially perpendicular to the first direction. The control gate 360 may be opposite to the floating gate 360b by interposing the dielectric layer pattern 360c therebetween. A plurality of the control gates may be referred to as word lines 360 of the flash memory device.

In example embodiments of the present general inventive concept, the word lines 360 may have the structure of the pattern structure array having one or more of the constructions as described above. As illustrated in FIGS. 17A and 17B, the word lines 360 may have a structure substantially similar or the same as the construction of the pattern structure described with reference to FIG. 13.

Each of the word lines 360 may have a width smaller that the critical width of the photolithography process. Further, a distance between adjacent word lines 360 may also be smaller than the critical width of the photolithography process. A pad 361 having a predetermined width may be connected with an end portion of each word line 360. A first contact plug 368a may be provided on the pad 361. Thus, the contact plug 368a may be electrically connected to the each word line 360.

Each of the selection transistors 356 may include a gate insulation layer and a gate electrode 362. The gate insulation layer may be formed on the active pattern 350. The gate insulation layer may include oxide such as silicon oxide. The gate electrode 362 may have a line shape and may extend in the first direction (e.g., the (A) direction). The gate electrode 362 in the selection transistor 356 may have a width (e.g., a width in the (B) direction) larger than the control gate 360 (i.e., the word line) of the cell transistor.

When the gate electrode 362 in the selection transistor 356 has a width (e.g., a width in the (B) direction) that is greater than or equal to a predetermined width, a second contact plug 368b may be provided on the gate electrode 362. Therefore, the gate electrode 362 in the selection transistor 356 may not require an additional pad for the second contact plug 368b.

In example embodiments of the present general inventive concept, a distance between the gate electrode 362 of the selection transistor 356 and the control gate 340 of the cell transistor may be substantially the same or similar to a distance between adjacent control gates 360 of the cell transistors. That is, a distance between the selection transistor 356 and the cell transistor may be less than or equal to a predetermined distance, so that the flash memory device may have increased integration.

Hereinafter, a method of manufacturing the NAND type flash memory device in FIGS. 17A and 17B will be described with reference to the accompanying drawings.

Figure 20:
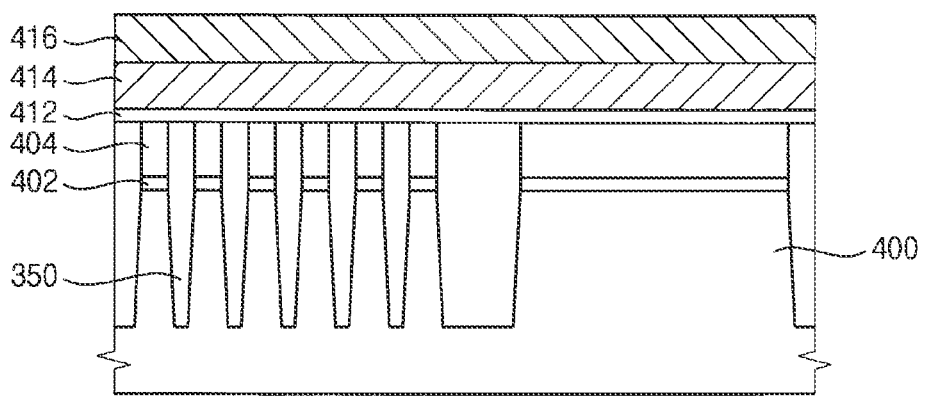
Figure 21:
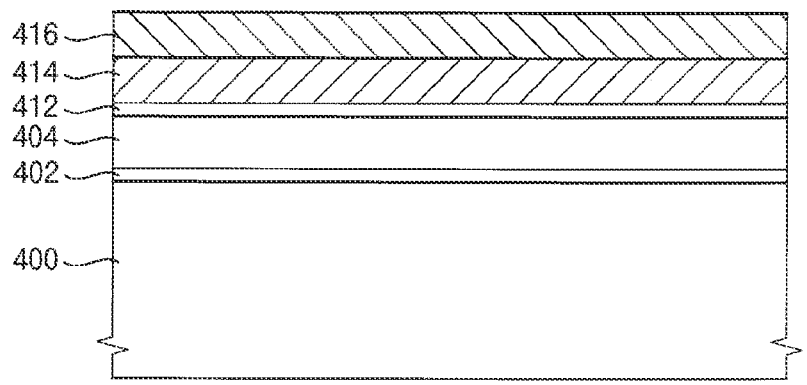
Figure 22A:
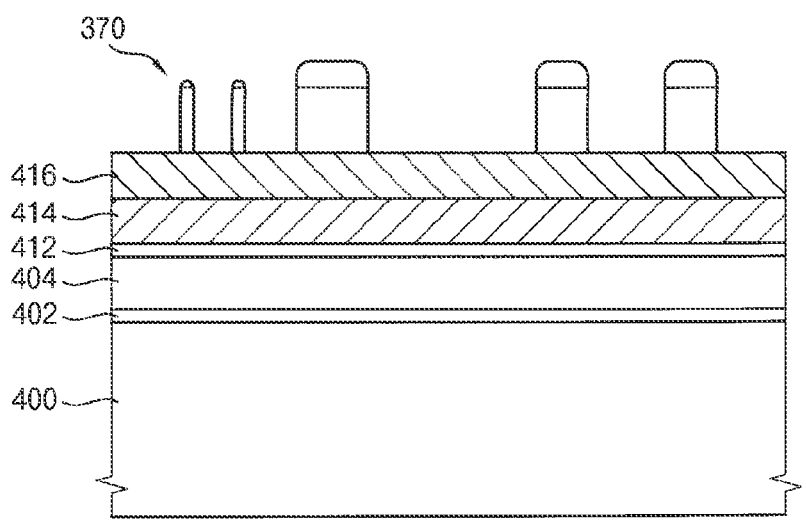

FIGS. 18 to 21, 22A and 23A are cross sectional views illustrating a method of forming the unit cell of the NAND type flash memory device having the pattern structure in FIGS. 17A and 17B. FIGS. 22A and 23B are plan views illustrating the method of forming the unit cell of the NAND type flash memory device having the pattern structure in FIGS. 17A and 17B.

Figure 18:
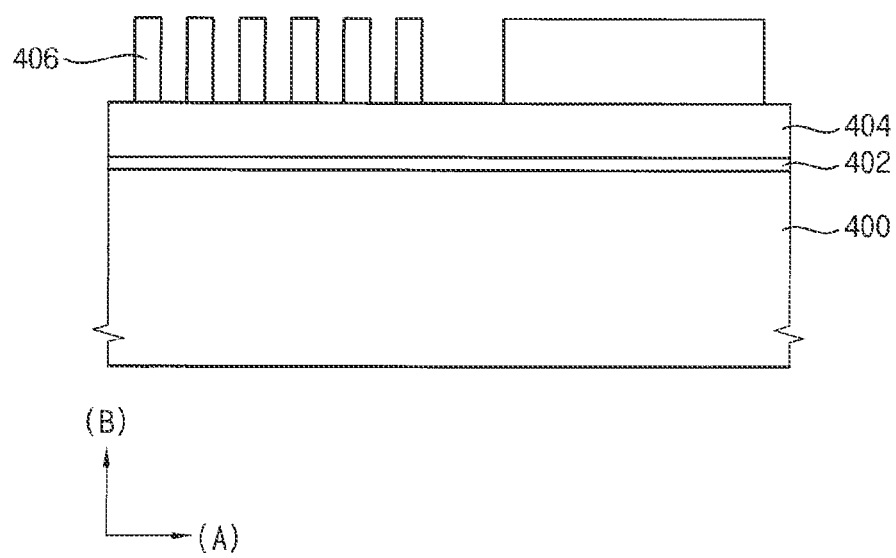
FIGS. 18 to 21, 22A and 23A are cross sectional views illustrating a method of forming the unit cell of the NAND type flash memory device having the pattern structure in FIGS. 17A and 17B according to exemplary embodiments of the present general inventive concept.

Referring to FIG. 18, a tunnel insulation layer 402 may be formed on a substrate 400. The tunnel insulation layer 402 may be formed by thermally oxidizing the substrate 400. The tunnel insulation layer 402 may include oxide, for example, silicon oxide.

A first gate electrode layer 404 may be formed on the tunnel insulation layer 402. The first gate electrode layer 404 may include polysilicon formed by a low pressure chemical vapor deposition (LPCVD) process or any other suitable process. The first gate electrode layer 404 may be a floating gate through successive processes.

A hard mask pattern 406 may be formed on the first gate electrode layer 404. The hard mask pattern 406 may be formed using oxide such as silicon oxide. The hard mask pattern 406 may be an etching mask to form at least a portion of an active region and an isolation region. The hard mask pattern 406 may have a line shape and may extend along the second direction (e.g., the (B) direction) substantially perpendicular to the first direction (e.g., the (A) direction).

In example embodiments of the present general inventive concept, a hard mask layer may be formed on the first gate electrode layer 404, and the hard mask layer may be etched by a photolithography process or any other suitable process to form the hard mask pattern 406. Alternatively, the hard mask pattern 406 may be formed by a doubling patterning process including the photolithography process.

Figure 19:
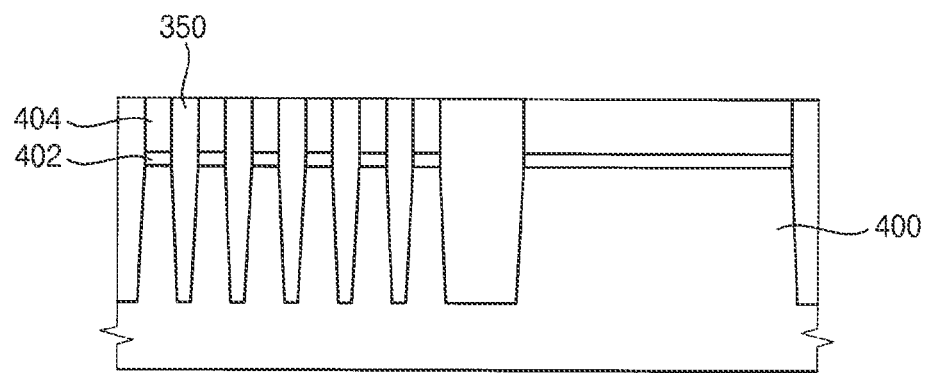

Referring to FIG. 19, the first gate electrode layer 404, the tunnel insulation layer 402 and the substrate 400 may be partially etched using the hard mask pattern 406 as the etching mask to form trenches on the substrate 400. When the trenches are filled with insulation materials, isolation layer patterns 350 are provided in the trenches, respectively. Therefore, the substrate 400 may be divided into the active region and the isolation region.

Referring to FIGS. 20 and 21, a dielectric layer 412 and a second gate electrode layer 414 may be formed on the first gate electrode layer 404 and the isolation layer patterns 350.

A hard mask formation layer 416 may be formed on the second gate electrode layer 414. The hard mask formation layer 416 may serve as a layer to be etched.

Figure 22B:
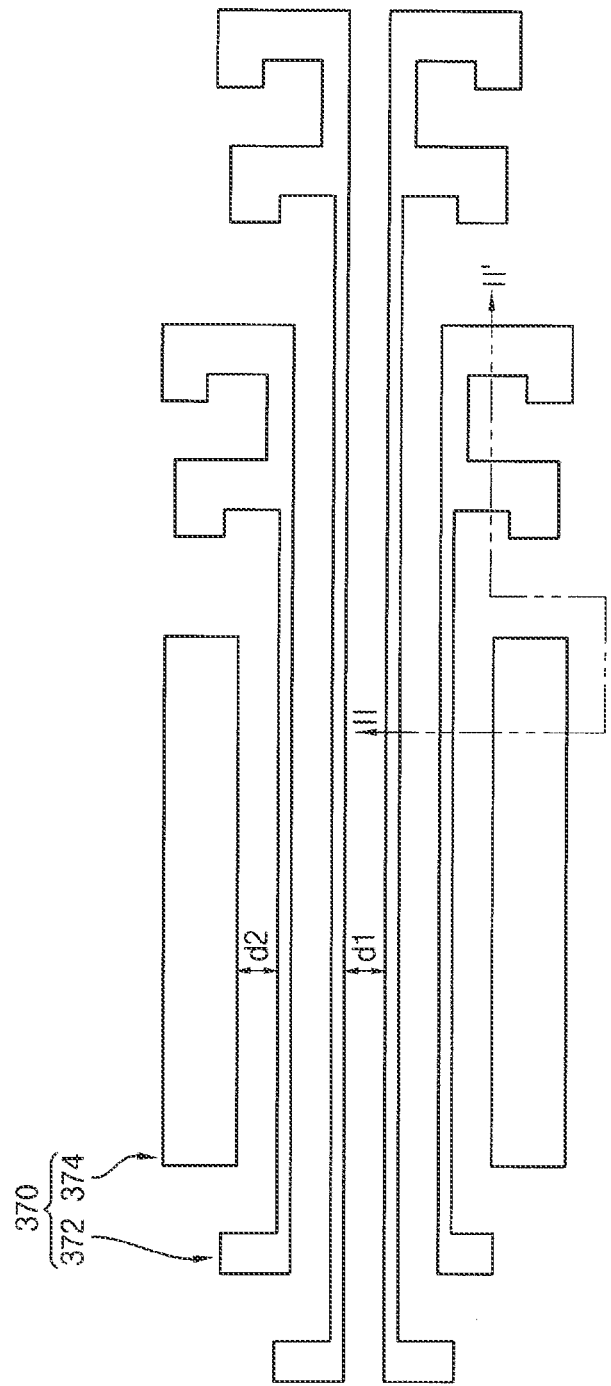
FIGS. 22B and 23B are plan views illustrating the method of forming the unit cell of the NAND type flash memory device having the pattern structure in FIGS. 17A and 17B according to exemplary embodiments of the present general inventive concept.

Referring to FIGS. 22A and 22B, sacrificial pattern structures 370 may be formed on the hard mask formation layer 416. Each of the sacrificial pattern structures 370 may extend in the second direction (e.g., the (B) direction) substantially perpendicular to the first direction (e.g., the (A) direction). Using the sacrificial pattern structures 370, etching masks to form control gates of cell transistors and a gate electrode of a selection transistor. The control gates of the cell transistors may serve as word lines of the flash memory device.

The sacrificial pattern structures 370 include first sacrificial pattern structures 372 and second sacrificial pattern structures 374. The first sacrificial pattern structures 372 may be used to form the control gates and the second sacrificial pattern structures 374 may be utilized to form gate electrodes of selection transistors.

Each of the gate electrodes may have a width relatively larger than that of each control gate. The second sacrificial pattern structures 374 may be positioned adjacent outermost first sacrificial pattern structures 372. The first sacrificial pattern structures 372 may have constructions substantially the same or similar to those of the pattern structures 104 described with reference to FIGS. 3A to 3C.

Each second sacrificial pattern structure 374 may have width larger than that of each first sacrificial pattern structure 372. The second sacrificial pattern structures 374 may be arranged in parallel relative to the first sacrificial pattern structures 372. In example embodiments of the present general inventive concept, a distance (d1) between adjacent first sacrificial pattern structures 372 may be substantially the same as a distance (d2) between adjacent second sacrificial pattern structures 374.

Figure 23A:
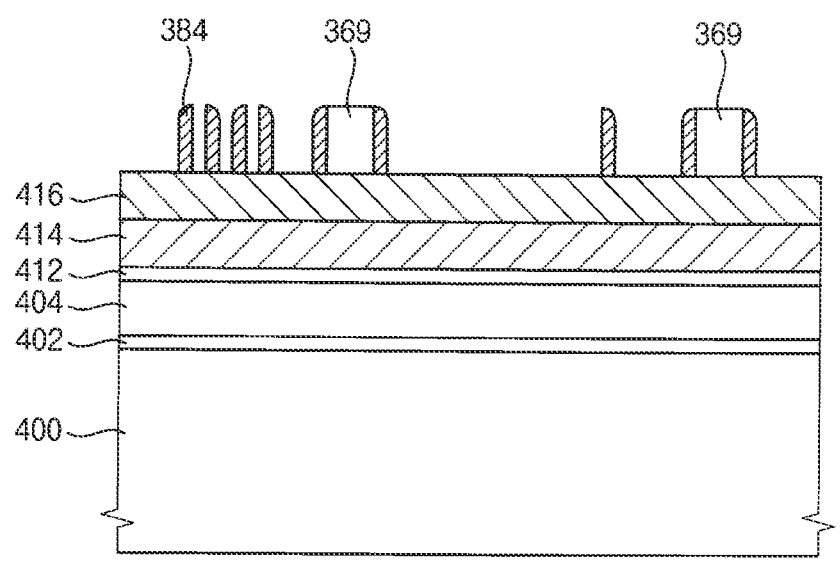
Figure 23B:
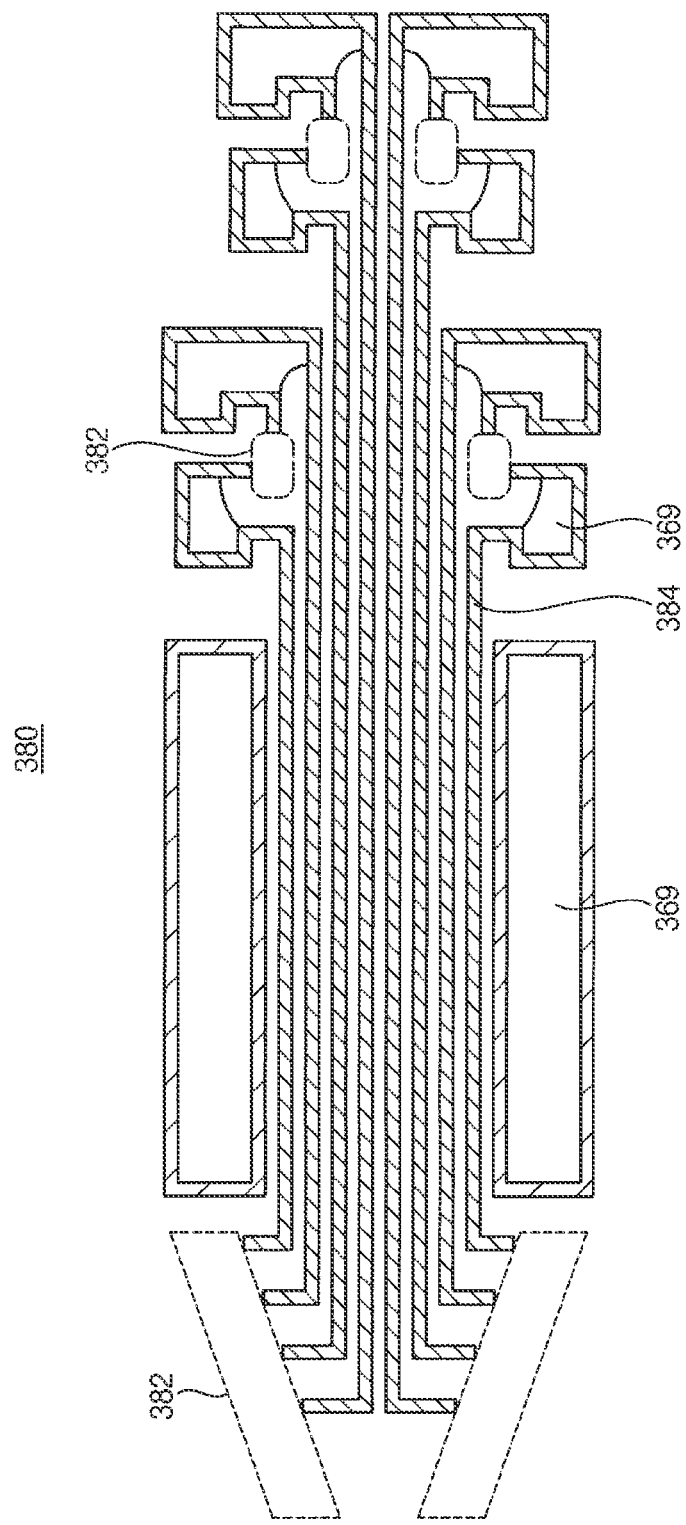

Referring to FIGS. 23A and 23B, etching masks 380 are provided by etching the hard mask formation layer 416 through processes substantially the same or similar to those described with reference to FIGS. 3A to 12B. In FIG. 23B, a reference numeral 382 denotes a portion of the etching mask 380 exposed by a second photoresist pattern in the process described with reference to FIG. 5A. When the exposed portion of the etching mask 380 is removed, line patterns opposite to pad portions may be separated one another, and the pad portions may be defined.

As illustrated in FIG. 23A, first material film patterns 369 of the second sacrificial pattern structures 374 remain on the etching masks 380 because of the widths of the second sacrificial pattern structures 374.

With the etching masks 380, the second gate electrode layer 414, the dielectric layer 412 and the first gate electrode layer 404 may be sequentially etched to form the control gate patterns 360 of the cell transistors and to form the gate electrodes 362 of the selection transistors. Additionally, dielectric layer patterns 360c and floating gate patterns 360b may be formed beneath the control gate patterns 360. The control gate patterns 360 and the gate electrodes 362 may be substantially the same as or similar to those described with reference to FIGS. 17A and 17B.

An insulating interlayer may be formed on the substrate 400 to cover the control gate patterns 360 and the gate electrodes 362. After partially the insulating interlayer, first contact plugs 368a and second contact plugs 368b may be formed through the insulating interlayer. The first contact plugs 368a may be connected with pad portions of the control gate patterns 360. The second contact plugs 368b may directly make contact with the gate electrodes 362.

According to example embodiments of the present general inventive concept, minute pattern structures such as the control gate patterns 360 and the gate electrodes 362 may be manufactured through two photolithography processes. Here, each control gate pattern 360 may include a minute pattern and a pad portion having a predetermined size. The pad portion may be connected with an end portion of the minute pattern. Each gate electrode 362 may have a width that is greater than that of each control gate pattern 360.

According to exemplary embodiments of the present general inventive concept, a control gate and a pad pattern in a flash memory device may be simultaneously formed without separate photolithography processes, so that a mis-alignment between the control gate and the pad pattern may be minimized and/or prevented. Failures of the flash memory device may be reduced by minimizing and/or preventing an alignment failure between the control gate and a pad.

Figure 24:
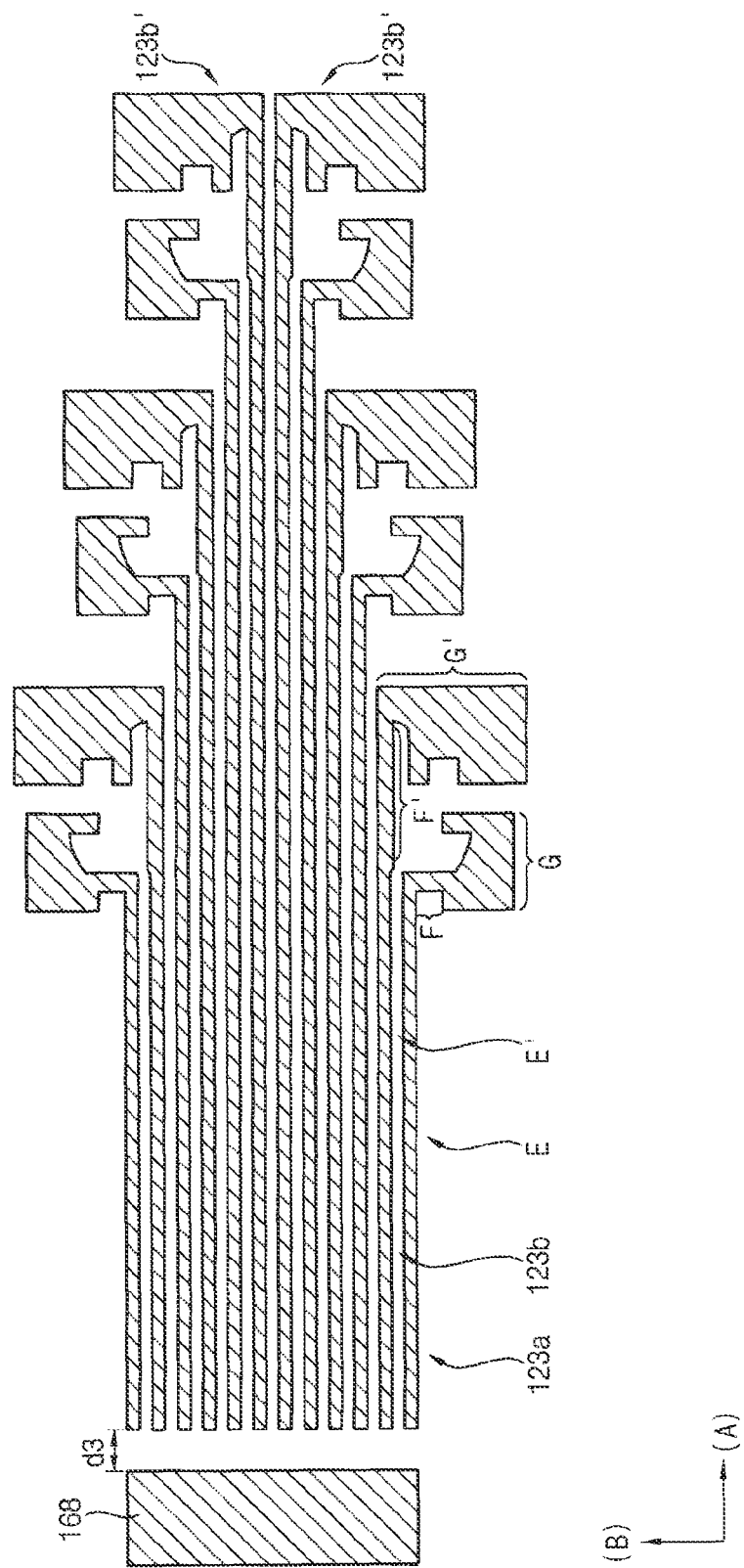
FIG. 24 is a plan view illustrating a pattern structure array in accordance with exemplary embodiments of the present general inventive concept.

FIG. 24 is a plan view illustrating a pattern structure array in accordance with exemplary embodiments of the present general inventive concept. The pattern structure array illustrated in FIG. 24 may have a construction similar to that of the pattern structure array in FIG. 13. For example, the pattern structure array in FIG. 24 includes first and second patterns substantially the same as or similar to the first and the second patterns in FIG. 13. However, end portions of the first and the second patterns in the pattern structure array in FIG. 24 may be different from those of the first and the second patterns in the pattern structure array in FIG. 13.

As illustrated in FIG. 24, the pattern structure array includes first patterns 123a and second patterns 123b. Each of the first patterns 123a includes a first line pattern (E), a first extending line (F) and a first pad (G). The first line pattern (E) may extend along the first direction and may have a first width. The first extending line (F) may be connected with an end portion of the first line pattern (E). The first pad (G) may make contact with the end portion of the first line pattern (E) and may have a width larger than the first width.

The first pad (G) and the first extending line (F) in the first pattern 123a may have constructions substantially the same as those of the first pattern in FIG. 13. However, another end portion of the first line pattern (F) in the first pattern 123a may not be bent relative to the first direction (e.g., the (A) direction).

The second patterns 123b may be arranged adjacent to the first patterns 123a by predetermined distances, respectively.

Each of the second patterns 123*b* may include a second line pattern (E'), a second extending line (F') and a second pad (G'). The second line pattern (E') may extend in parallel relative to the first line pattern (E) and may have a first width. The second extending line (F') may be connected with an end portion of the second line pattern (E'). The second pad (G') may make contact with the end portion of the second line pattern (E') and may have a width that is larger than the first width. The second pad (G') and the second extending line (F') in the second pattern 123*b* may also have constructions substantially the same as those of the first pattern in FIG. 13. However, another end portion of the second line pattern (F') in the second pattern 123*b* may not be bent with respect to the first direction (e.g., the (A) direction).

In example embodiments of the present general inventive concept, the first and the second patterns 123*a* and 123*b* may be symmetrically arranged centering a second direction (e.g., the (B) direction) substantially perpendicular a direction (e.g., the (A) direction) where the first and the second patterns 123*a* and 123*b* extend.

A second patterns 123*b*' disposed at a center of an object to be etched in the second direction (e.g., the (B) direction) may be protruded rather than adjacent first and second patterns 123*a* and 123*b*. That is, an extending and a pad of the second patterns 123*b*' disposed at the center of the object in the second direction (e.g., the (B) direction) may be protruded rather than extending lines and pads of adjacent first and second patterns 123*a* and 123*b*. However, an end portion of the second patterns 123*b*' disposed at the center of the object in the second direction (e.g., the (B) direction) may not be protruded from end portions of adjacent first and second patterns 123*a* and 123*b*. Namely, end portions of the first and the second patterns 123*a* and 123*b* may be disposed substantially in parallel relative to a dummy pattern 168.

In example embodiments of the present general inventive concept, the dummy pattern 168 may be spaced apart from the end portions of the first and the second patterns 123*a* and 123*b* by a predetermined distance (d3). The dummy pattern 168 may have a width larger than widths of line patterns in the first and the second patterns 123*a* and 123*b*. The dummy pattern 168 may extend along a direction (e.g., the (B) direction) substantially perpendicular to the direction (e.g., the (A) direction) where the first and the second patterns 123*a* and 123*b* extend. The dummy pattern 168 may minimize and/or prevent shorts among the first and the second patterns 123*a* and 123*b* when the end portions of the first and the second patterns 123*a* and 123*b* may be enlarged.

When the distance (d3) between the dummy pattern 168 and the end portions of the first and the second patterns 123*a* and 123*b* may be above about 100 nm, bridge failures among the first and the second patterns 123*a* and 123*b* may be generated. Thus, the distance (d3) between the dummy pattern 168 and the end portions of the first and the second patterns 123*a* and 123*b* may be below about 100 nm to minimize and/or prevent the bridge failures from generating among the first and the second patterns 123*a* and 123*b*.

Hereinafter, a method of forming the pattern structure array illustrated in FIG. 24 will be described with reference to the accompanying drawings.

Figure 25:
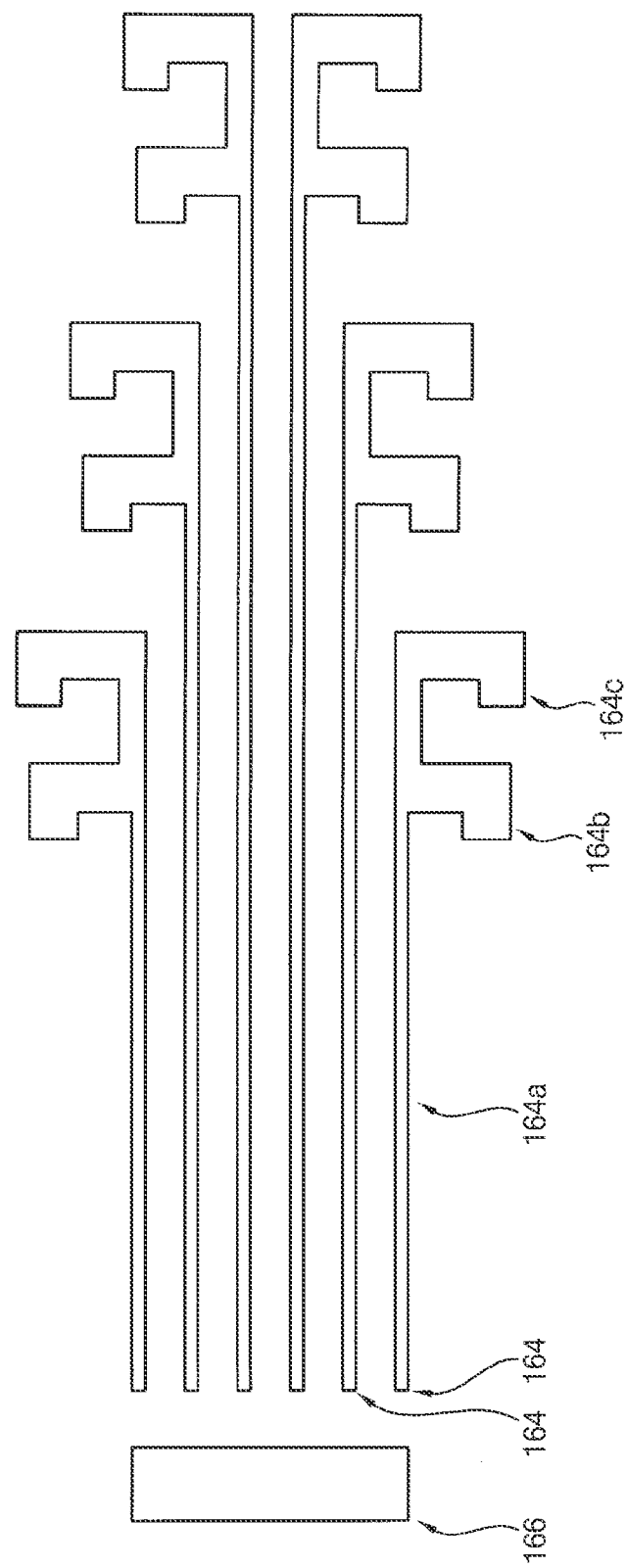
FIGS. 25 and 26 are plan views illustrating a method of forming the pattern structure array in FIG. 24 according to exemplary embodiments of the present general inventive concept.
Figure 26:
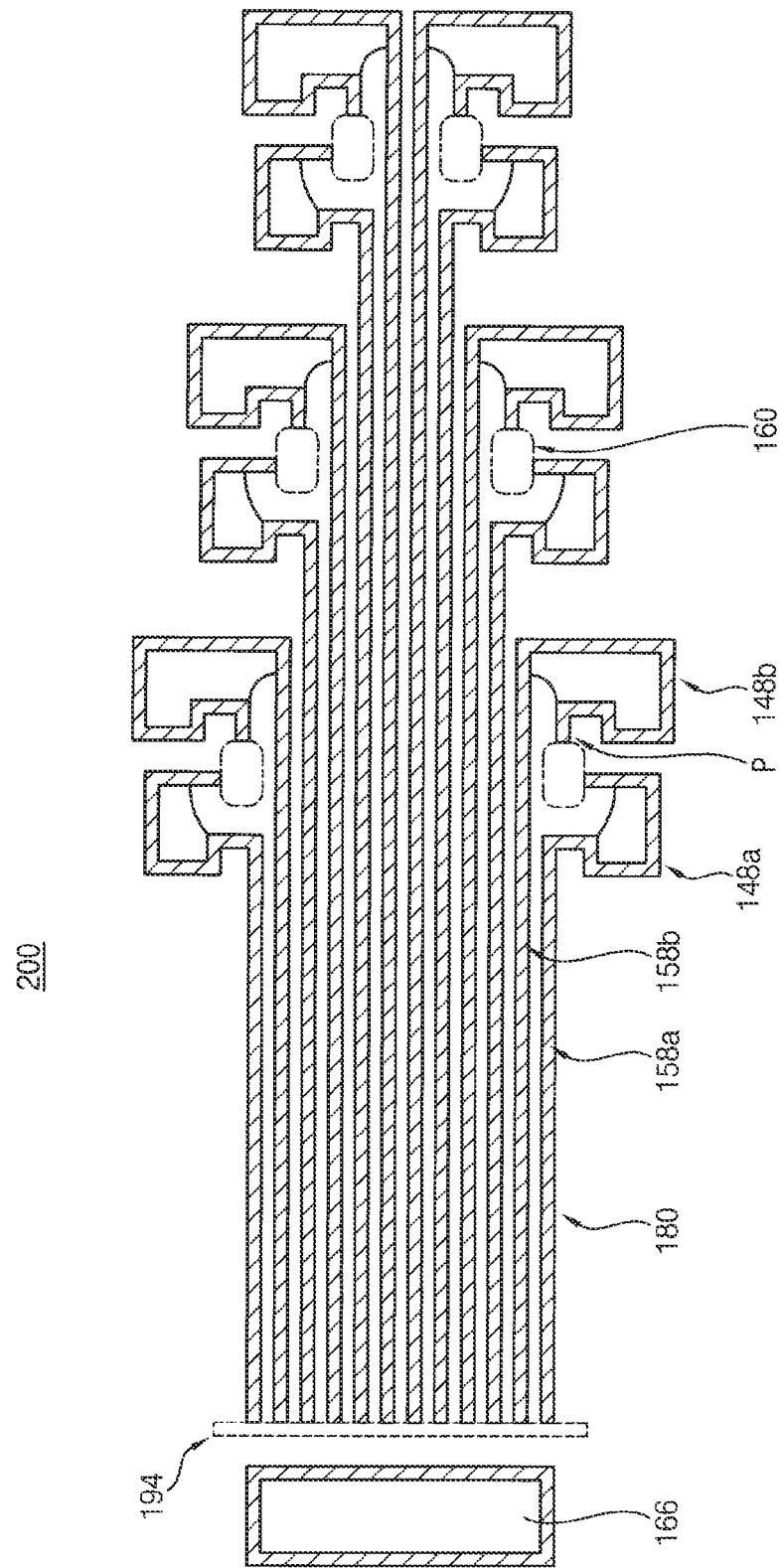

FIGS. 25 and 26 are plan views illustrating a method of forming the pattern structure array in FIG. 24. The method illustrated in FIGS. 25 and 26 may be substantially the same as or similar to those described with reference to FIGS. 4A to 12B except for a construction of a sacrificial pattern structure and a position of a second opening in a second photoresist pattern.

Referring to FIG. 25, a plurality of sacrificial pattern structures 164 are formed on an object to be etched positioned on a substrate. The sacrificial pattern structures 164 may be arranged on the object substantially in parallel one another. The sacrificial pattern structures 164 may have different lengths, respectively.

A first sacrificial pad portion 164*b* and a second sacrificial pad portion 164*c* in each sacrificial pattern structure 164 may have shapes substantially the same as or similar to those of the first and second sacrificial pad portions described with reference to FIG. 13. However, sacrificial lines 164*a* of the sacrificial pattern structures 164 may have end portions opposite to the first and the second sacrificial pad portions 164*b* and 164*c*, which are arranged in parallel one another.

A dummy structure 166 is formed on the object adjacent to the end portions of the sacrificial lines 164*a* opposite to the first and the second sacrificial pad portions 164*b* and 164*c*.

Referring to FIG. 26, an etching mask structure 200 may be formed on the object through processes substantially the same as or similar to those described with reference to FIGS. 4A to 12B. In FIG. 26, a reference numeral 194 denotes a portion of a spacer formation layer exposed by a second photoresist pattern similar to the second photoresist pattern in FIGS. 5A and 5B.

The exposed portion 194 of the spacer formation layer may be etched using the second photoresist pattern, so that the end portions of the sacrificial lines 164 may be separated from one another. Hence, two pad mask patterns 192*a* and 192*b* may be defined in one sacrificial pattern structure 164. The etching mask structure 200 may further include a first material film pattern 158*a* and a spacer 158*b* as illustrated in FIG. 26.

When the object (e.g., a layer to be etched) is etched using the etching mask structure 200, a pattern structure array may be provided on the substrate. The pattern structure may have a construction substantially the same as or similar to that of the pattern structure array illustrated in FIG. 24.

Figure 27:
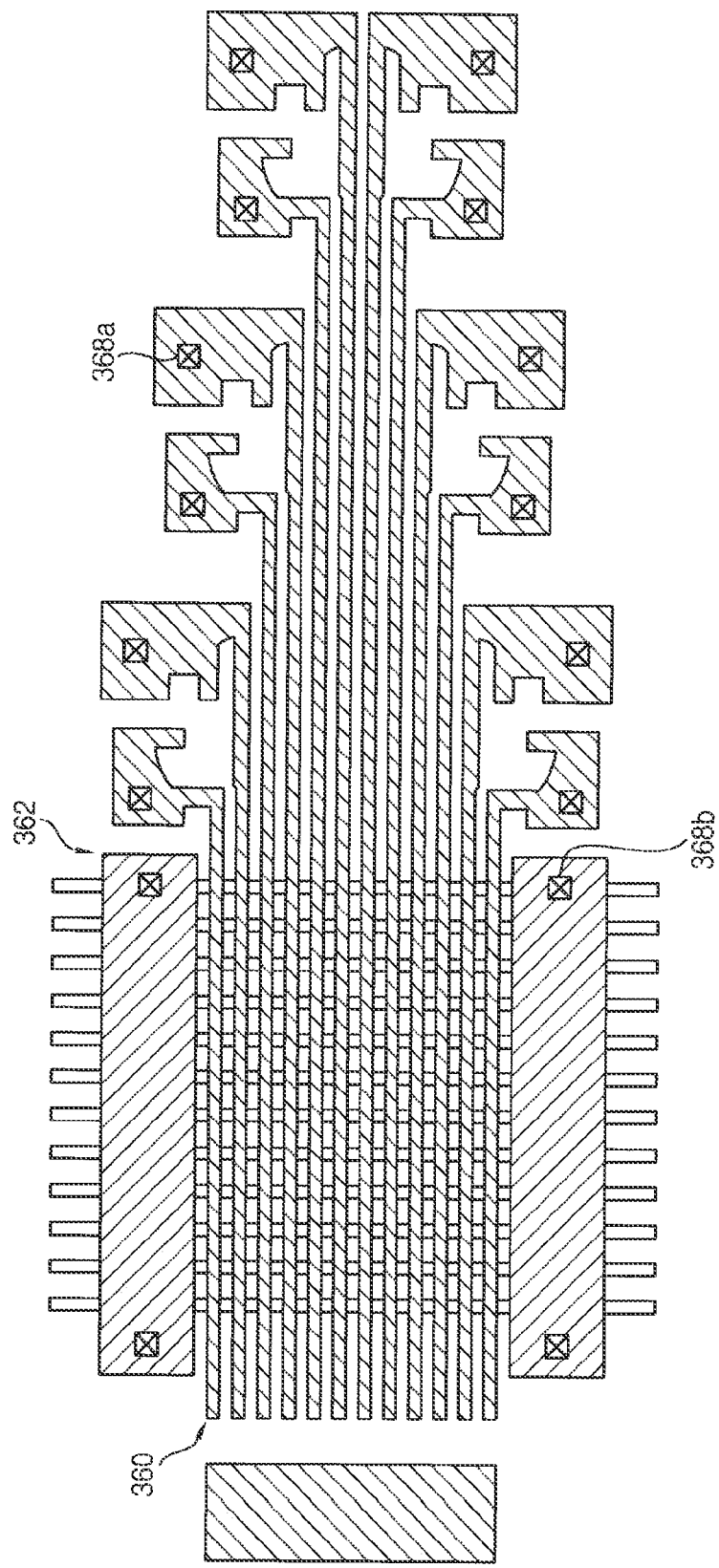
FIG. 27 is a plan view illustrating a unit cell of a NAND type flash memory device including the patterns structure array in FIG. 24 according to exemplary embodiments of the present general inventive concept.

FIG. 27 is a plan view illustrating a unit cell of a NAND type flash memory device including the pattern structure array in FIG. 24.

As illustrated in FIG. 27, the pattern structure array in FIG. 24 may be used as word lines 360 of the NAND type flash memory device.

In the formation of the NAND type flash memory device, isolation layer patterns and active patterns may be formed on a substrate through processes substantially the same as or similar to those described with reference to FIGS. 18 to 21. A tunnel insulation layer, a first gate electrode layer, a dielectric layer and a second gate electrode layer may be successively formed on the substrate. An etching mask structure may be formed on the second gate electrode layer by processes substantially the same as or similar to those described with reference to FIGS. 25 and 26. Using the etching mask structure, the second gate electrode layer, the dielectric layer and the first gate electrode layer may be etched, to form floating gates, dielectric layer patterns and control gates serving as the word lines 360. Selection transistors may be provided adjacent to both of end portions of a cell string.

First contact plugs 368*a* may be formed on pads connected with the word lines 360, and second contact plugs 368*b* may be formed on gate patterns of the selection transistors. As such, NAND type flash memory device may be manufactured on the substrate.

Figure 28:
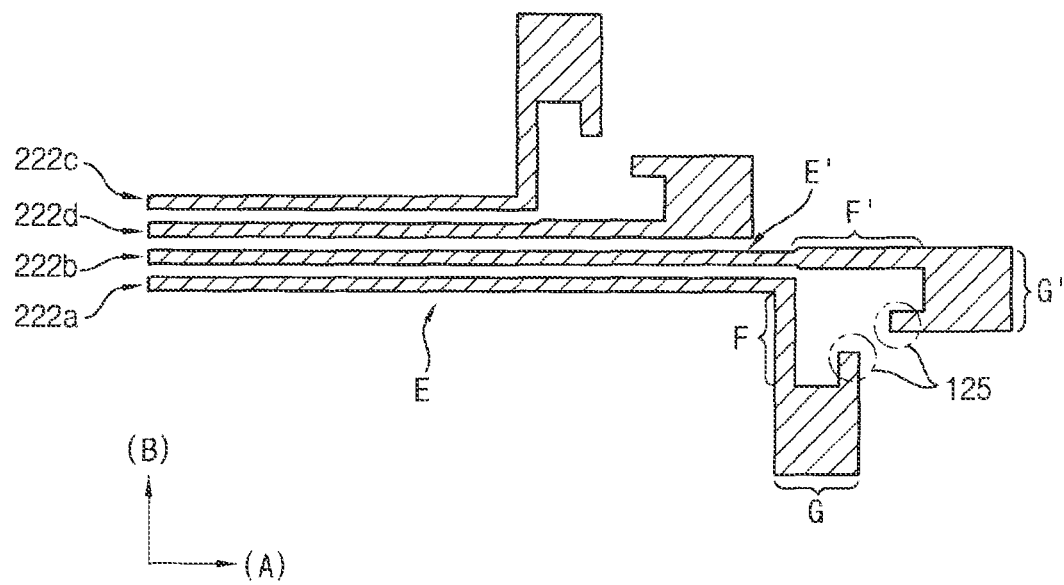
FIG. 28 is a plan view illustrating a pattern structure array in accordance with exemplary embodiments.

FIG. 28 is a plan view illustrating a pattern structure array in accordance with exemplary embodiments of the present general inventive concept.

Referring to FIG. 28, the pattern structure array includes a first pattern 222*a* and a second pattern 222*b*, which are arranged on an object located on a substrate. The first and the second patterns 222a and 222b may be disposed in parallel each other.

The first pattern 222a includes a first line pattern (E), a first extending line (F) and a first pad (G). The first line pattern (E) may be prolonged in the first direction (e.g., the (A) direction) and may have a first width (e.g., where the first width is in the (B) direction). The first extending line (F) may make contact with an end portion of the first line pattern (E). The first pad (G) may be connected with the end portion of the first line pattern (E) and may have a width (e.g., a width in the (B) direction) larger than the first width. The first pad (G) may have a width to be a contact pad for transferring signals successively formed on the first pad (G). The first width (e.g., a width in the (B) direction) of the first line pattern (E) may be smaller than a critical width of a photolithography process. The first extending line (F) may have a width relatively larger than the first width of the first extending line (E).

In example embodiments of the present general inventive concept, the first extending line (F) may be bent along a direction (e.g., the (B) direction) substantially perpendicular to the first direction (e.g., the (A) direction) of the first line pattern (E). The first pad (G) may have a protruding portion 125 extending from a lateral portion of the first pad (G). The protruding portion 125 of the first pad (G) may have a line shape. The protruding portion 125 may be protruded in a direction substantially in parallel relative to a direction where the end portion of the first extending line (F) extends. That is, the protruding portion 125 and the extending line (F) may both extend in the (B) direction. The protruding portion 125 of the first pad (G) may be a structural feature of the pattern structure array according to example embodiments of the present general inventive concept.

The second pattern 222b may be arranged adjacent to the first pattern 222a in parallel, where the second patter 222b and the first pattern 222a are spaced by a predetermined distance. The second pattern 222b includes a second line pattern (E'), a second extending line (F') and a second pad (G'). The second line pattern (E') may extend in parallel relative to the first line pattern (E) of the first pattern 222a. The second line pattern (E') may also have the first width (e.g., a width in the (B) direction). The second extending line (F') may be connected with an end portion of the second line pattern (E'). The second pad (G') may make contact with the end portion of the second line pattern (E'). The second pad (G') may also have a width (e.g., a width in the (B) direction) larger than the first width of the second line pattern (E'). The second extending line (F') may be prolonged in a direction substantially in parallel relative to the second line pattern (E'). The second extending line (F') may have a width larger than the first width of the second line pattern (E'). The second pad (G') may also have a width to be a contact pad for transferring signals successively formed on the second pad (G').

As illustrated in FIG. 28, the first extending line (F) may be perpendicular to the second extending line (F'). That is, first extending line (F) may extend in the (B) direction and second extending line (F') may extend in the (A) direction. The first and the second pads (G and G') may be disposed along a direction substantially in parallel to the first and the second extending lines (F and F'), respectively. That is, the first pad (G) may be disposed in the (B) direction, and the second pad (G') may be disposed in the (A) direction. Thus, the first pad (G) may not be parallel relative to the second pad (G') because the first and the second pads (G and G') extend from the first and the second extending lines (F and F'), respectively. The first pad (G) may be perpendicular to the second pad (G').

The pattern structure array further includes a third pattern 222c and a fourth pattern 222d. The third and the fourth patterns 222c and 222d may be symmetrically arranged with respect to the first and the second patterns 222a and 222b centering the first direction of the first and the second extending line (F and F'). Here, an extending line and a pad of the third pattern 222c may have shapes substantially the same as or similar to those of the first extending line (F) and the first pad (G) in the first pattern 222a. Further, an extending line and a pad of the fourth pattern 222d may have shapes substantially the same as or similar to those of the second extending line (F') and the second pad (G') in the second pattern 222b.

In FIG. 28, the first and the third patterns 222a and 222c may have lengths different from those of the second and the fourth patterns 222b and 222d, respectively. However, the first and the third patterns 222a and 222c may have lengths (e.g., lengths in the (A) direction) substantially the same as or similar to those of the second and the fourth patterns 222b and 222d in accordance with a construction of the pattern structure array serving elements in various semiconductor devices.

Hereinafter, a method of forming the pattern structure array in FIG. 28 will be described with reference to the accompanying drawings.

Figure 29:
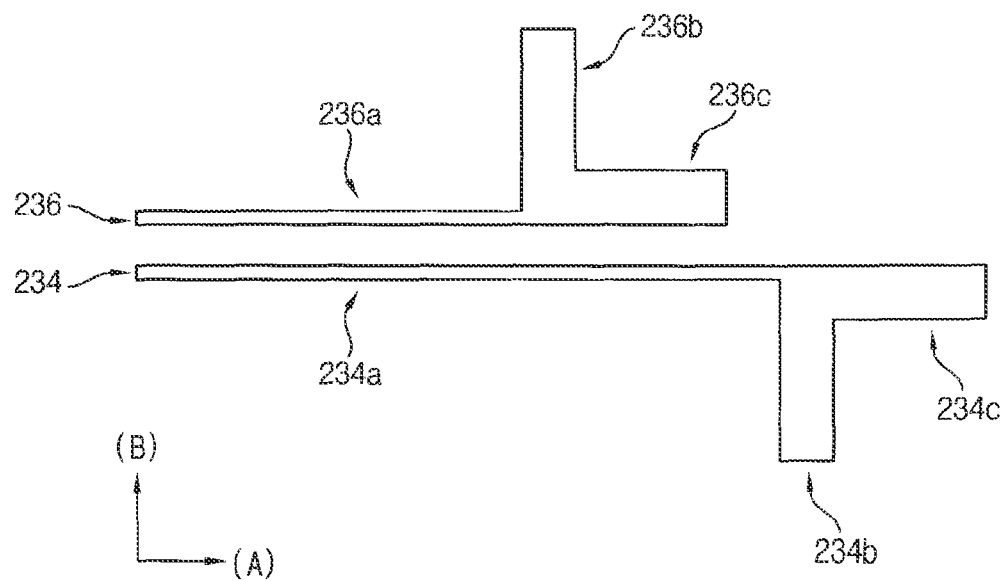
FIGS. 29 and 30 are plan views illustrating a method of forming the pattern structure array in FIG. 28 according to exemplary embodiments of the present general inventive concept.
Figure 30:
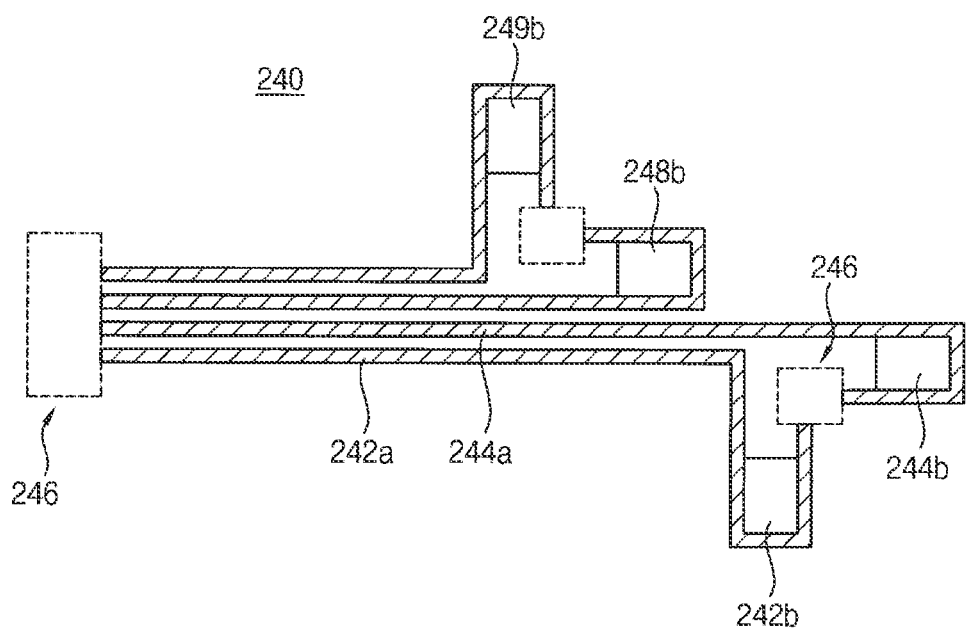

FIGS. 29 and 30 are plan views illustrating a method of forming the pattern structure array in FIG. 28. The method illustrated in FIGS. 29 and 30 may be substantially the same as or similar to those described with reference to FIGS. 4A to 12B except for a construction of a sacrificial pattern structure and a position of a second opening in a second photoresist pattern.

Referring to FIG. 29, sacrificial pattern structures 234 and 236 are formed on an object to be etched positioned on a substrate. The sacrificial pattern structures 234 and 236 may be arranged on the object substantially in parallel each other. Lengths of the sacrificial pattern structures 234 and 236 (e.g., lengths in the (A) direction) may be different each other or may be substantially the same each other. The sacrificial pattern structures 234 and 236 may have substantially same constructions. The sacrificial pattern structures 234 and 236 may be alternatively arranged over the substrate or may be symmetrically disposed on the object.

In example embodiments of the present general inventive concept, the sacrificial pattern structures 234 and 236 may be divided into an upper sacrificial pattern 236 and a lower sacrificial pattern 234.

The lower sacrificial pattern 234 includes a first sacrificial line 234a, a first preliminary pad portion 234b and a second preliminary pad portion 234c. The first sacrificial line 234a may have a first width (e.g., a width in the (B) direction). The first preliminary pad portion 234b may be prolonged from an end portion of the first sacrificial line 234a. The first preliminary pad portion 234b may be bent in a direction (e.g., the (B) direction) substantially perpendicular to a direction (e.g., the (A) direction) where the first sacrificial line 234a extends. The second preliminary pad portion 234c may extend form the end portion of the first sacrificial line 234a along the direction (e.g., the (A) direction) in which the first sacrificial line 234a extends.

Each of the first and the second preliminary pad portions 234b and 234c may have a width (e.g., a width in the (B) direction) larger than the first width of the first sacrificial line 234a. For example, each of the first and the second preliminary pad portions 234b and 234c may have a width (e.g., a width in the (B) direction) similar or larger than that of a pad formed thereon.

The upper sacrificial pattern 236 includes a second sacrificial line 236a, a third preliminary pad portion 236b and a fourth preliminary pad portion 236c. The second sacrificial line 236a may also have a first width (e.g. a width in the (B) direction). The third preliminary pad portion 236b may be extended from an end portion of the second sacrificial line 236a. The third preliminary pad portion 236b may also be bent in a direction (e.g., the (B) direction) substantially perpendicular to a direction (e.g., the (A) direction) where the second sacrificial line 236a extends. The fourth preliminary pad portion 236c may extend form the end portion of the second sacrificial line 236a along the direction (e.g., the (A) direction) in which the second sacrificial line 236a extends.

In example embodiments of the present general inventive concept, the third and the fourth preliminary pad portions 236b and 236c may be symmetrically arranged with respect to the first and the second preliminary pad portions 234b and 234c. Alternatively, the first and the second preliminary pad portions 234b and 234c may be arranged in parallel relative to the third and the fourth preliminary pad portions 236b and 236c.

When the sacrificial pattern structures 234 and 236 have the above-described construction, a pattern structure array formed on the substrate may have constructions similar to or the same as that of the sacrificial pattern structures 234 and 236 as described above.

Referring to FIG. 30, an etching mask structure 240 is formed on the object through processes substantially the same as or similar to those described with reference to FIGS. 4A to 12B. In FIG. 30, a reference numeral 246 represents a portion of a spacer formation layer exposed by a second photoresist pattern similar to the second photoresist pattern in FIG. 5A. The exposed portion 246 of the spacer formation layer may be etched using the second photoresist pattern, such that the end portions of the sacrificial lines may be separated one another. Thus, two of pad regions 242b, 244b, 248b and 249b may be defined in one of the sacrificial pattern structures 234 and 236, respectively.

After the object (for example, a layer to be etched) is etched using the etching mask structure 240, pattern structure arrays 242a and 244a may be provided on the substrate. Here, the pattern structure may have a construction substantially the same as or similar to that of the pattern structure array illustrated in FIG. 28.

Figure 31:
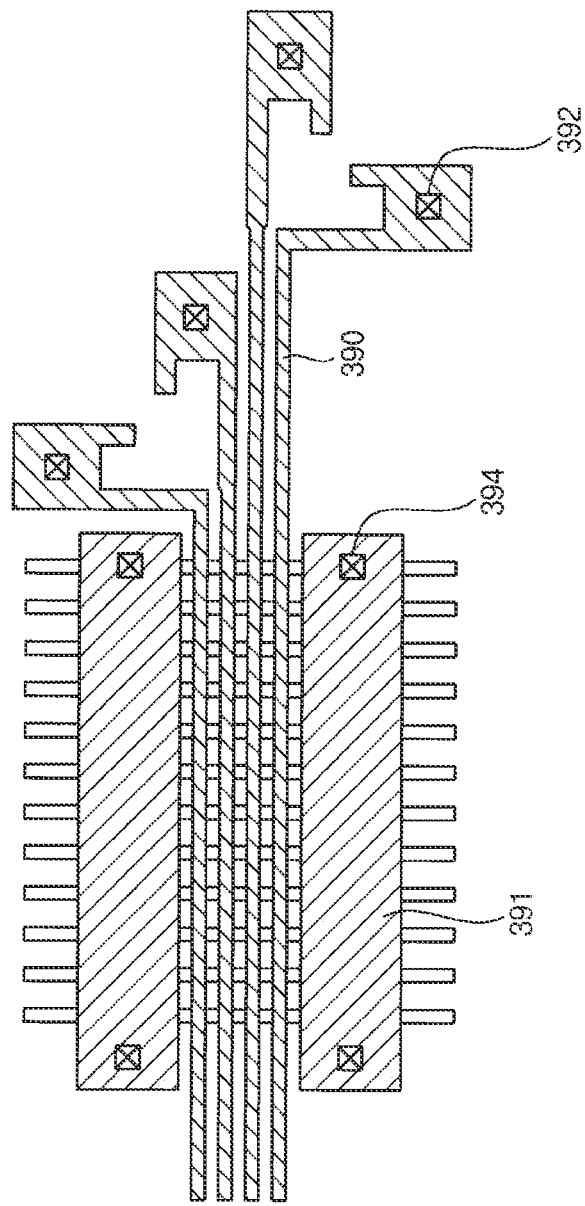
FIG. 31 is a plan view illustrating a unit cell of a NAND type flash memory device including the patterns structure array in FIG. 28 according to exemplary embodiments of the present general inventive concept.

FIG. 31 is a plan view illustrating a unit cell of a NAND type flash memory device including the patterns structure array in FIG. 28.

The pattern structure array (e.g., first array pattern 222a, second array pattern 222b, third array pattern 222c, and fourth array pattern 222d) illustrated in FIG. 28 may be used as word lines 390 of the NAND type flash memory device.

In the formation of the NAND type flash memory device in FIG. 31, isolation layer patterns and active patterns may be formed on a substrate through processes substantially the same as or similar to those described with reference to FIGS. 18 to 21. A tunnel insulation layer, a first gate electrode layer, a dielectric layer and a second gate electrode layer may be successively formed on the substrate. An etching mask structure may be formed on the second gate electrode layer by processes substantially the same as or similar to those described with reference to FIGS. 25 and 26. Using the etching mask structure, the second gate electrode layer, the dielectric layer and the first gate electrode layer may be etched, to form floating gates, dielectric layer patterns and control gates serving as the word lines 390. Selection transistors may be provided adjacent to both of end portions of a cell string.

An insulating interlayer is formed on the substrate to cover the word lines 390 and gate patterns 391 of the selection transistors, and then first contact plugs 392 may be formed on pads connected with the word lines 360 through the insulating interlayer. Additionally, second contact plugs 394 may be formed on the gate patterns 391 of the selection transistors through the insulating interlayer. Therefore, the NAND type flash memory device may be manufactured on the substrate.

Figure 32:
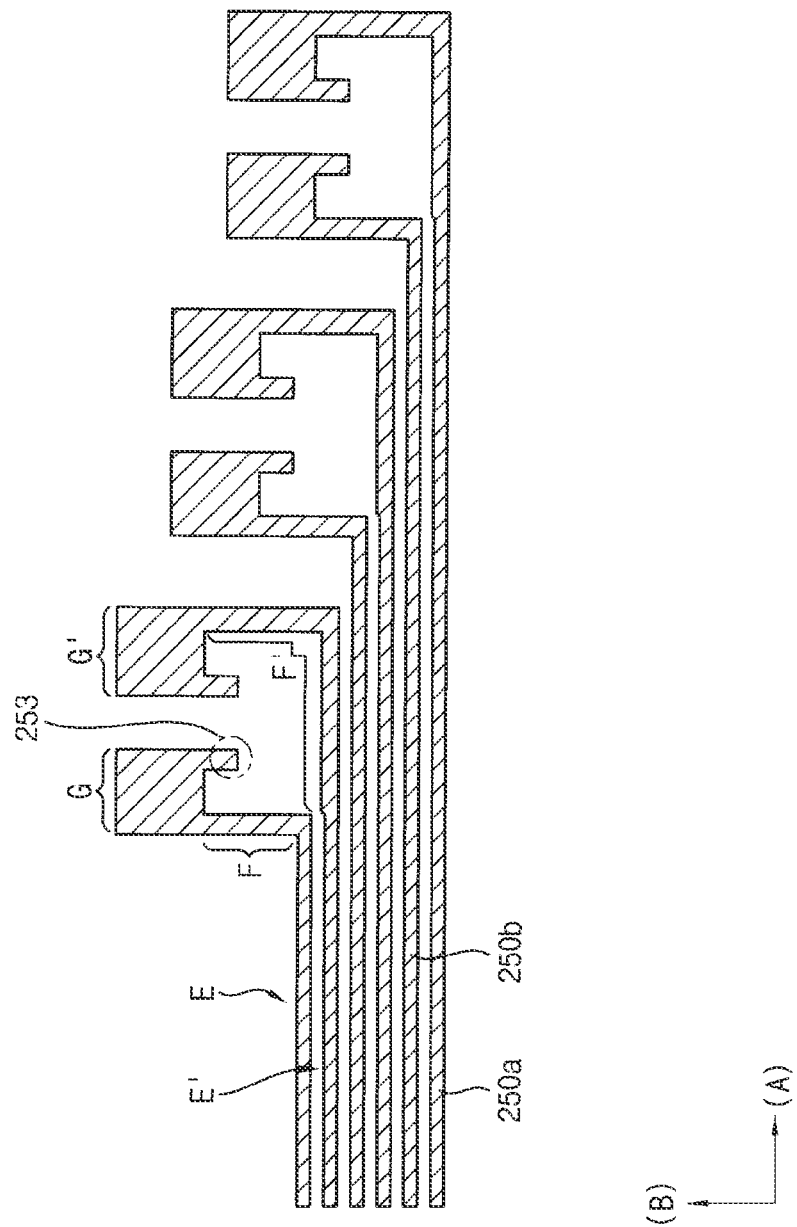
FIG. 32 is a plan view illustrating a pattern structure array in accordance with exemplary embodiments of the present general inventive concept.

FIG. 32 is a plan view illustrating a pattern structure array in accordance with exemplary embodiments of the present general inventive concept.

Referring to FIG. 32, the pattern structure array includes a first pattern 250a and a second pattern 250b, which are arranged on a substrate. The first and the second patterns 250a and 250b may be disposed in parallel each other (e.g., the first and the second patterns 250a and 250b may extend in the (A) direction in parallel with one another). Further, the first and the second patterns 250a and 250b may be alternatively arranged on the substrate.

The first pattern 250a of the pattern structure array includes a first line pattern (E), a first extending line (F) and a first pad (G). The first line pattern (E) of the first pattern 250a may extend in the first direction (e.g., the (A) direction) and may have a first width (e.g., where the width may be in the (B) direction). The first extending line (F) may make contact with an end portion of the first line pattern (E). The first pad (G) may be connected with the end portion of the first line pattern (E) and may have a width larger than the first width. The first pad (G) may have a sufficient width to be a contact pad for transferring signals successively formed on the first pad (G). The first width (e.g., the width in the (B) direction) of the first line pattern (E) may be smaller than a critical width of a photolithography process.

In example embodiments of the present general inventive concept, the first extending line (F) of the first pattern 250a may be bent along a direction substantially perpendicular to the first direction of the first line pattern (E). The first pad (G) of the first pattern 250a may have a protruding portion 253 extending (e.g., in the (B) direction) from a lateral portion of the first pad (G). The protruding portion 253 of the first pad (G) may have a line shape. The protruding portion 253 may be protruded in a direction (e.g., the (B) direction) in parallel with respect to a direction (e.g., the (B) direction) where the end portion of the first extending line (F) extends.

The second pattern 250b may be arranged adjacent to the first pattern 250a in parallel by a predetermined distance. The second pattern 250b of the pattern structure array includes a second line pattern (E'), a second extending line (F') and a second pad (G'). The second line pattern (E') may extend in parallel relative to the first line pattern (E) of the first pattern 222a. The second line pattern (E') of the second pattern 250b may also have the first width (e.g., in the (B) direction). The second extending line (F') may be connected with an end portion of the second line pattern (E'). The second pad (G') may make contact with the end portion of the second line pattern (E'). The second pad (G') of the second pattern 250b may also have a width (e.g., in the (B) direction) larger than the first width of the second line pattern (E'). The second extending line (F') may be prolonged in a direction (e.g., the (B) direction) substantially in parallel relative to the second line pattern (E'), at least in part.

The second extending line (F') of the second pattern 250b may be bent along a direction (e.g., the (B) direction) substantially perpendicular to a direction (e.g., the (A) direction) where the second line pattern (E') extends. The second pad (G') of the second pattern 250b may be opposite to the first pad (G) of the first pattern 250a. The second pad (G') of the second pattern 250b may have a protruding portion 253 extending (e.g., in the (B) direction) from a side portion of the second pad (G'). The protruding portion 253 of the second pad (G') may have a line shape. The protruding portion 253 of the second pad (G') may be protruded in a direction (e.g., the (B) direction) substantially in parallel with respect to a direction (e.g., the (B) direction) where the end portion of the second extending line (F') extends. The second pad (G') of the second pattern 250b may also have a sufficient width to be a contact pad for transferring signals successively formed on the second pad (G').

As illustrated in FIG. 32, the first extending line (F) of the first pattern 250a (e.g., extending in the (B) direction) may be perpendicular to a portion of the second extending line (F') (e.g., extending in the (A) direction) of the second pattern 250b. The first and the second pads (G and G') may be connected with the first and the second extending lines (F and F') and may be disposed substantially in parallel each other (e.g., pads G and G' may be disposed in parallel with one another in the (B) direction). For example, the first and the second pads (G and G') may be symmetrically arranged along a direction substantially in parallel relative to the directions where the first and the second extending lines (F and F'). The first pad (G) of the first pattern 250a may have a shape substantially the same as or similar to that of the second pad (G') of the second pattern 250b.

In example embodiments of the present general inventive concept, a plurality of first and second patterns 250a and 250b may be arranged on the substrate spaced apart by predetermined distances, respectively. The first and the second patterns 250a and 250b may be alternatively disposed on the substrate. Further, the first and the second patterns 250a and 250b may have lengths (e.g., lengths in the (A) direction) different one another. However, each of the first and the second patterns 250a and 250b may have a substantially same or similar construction.

Figure 33:
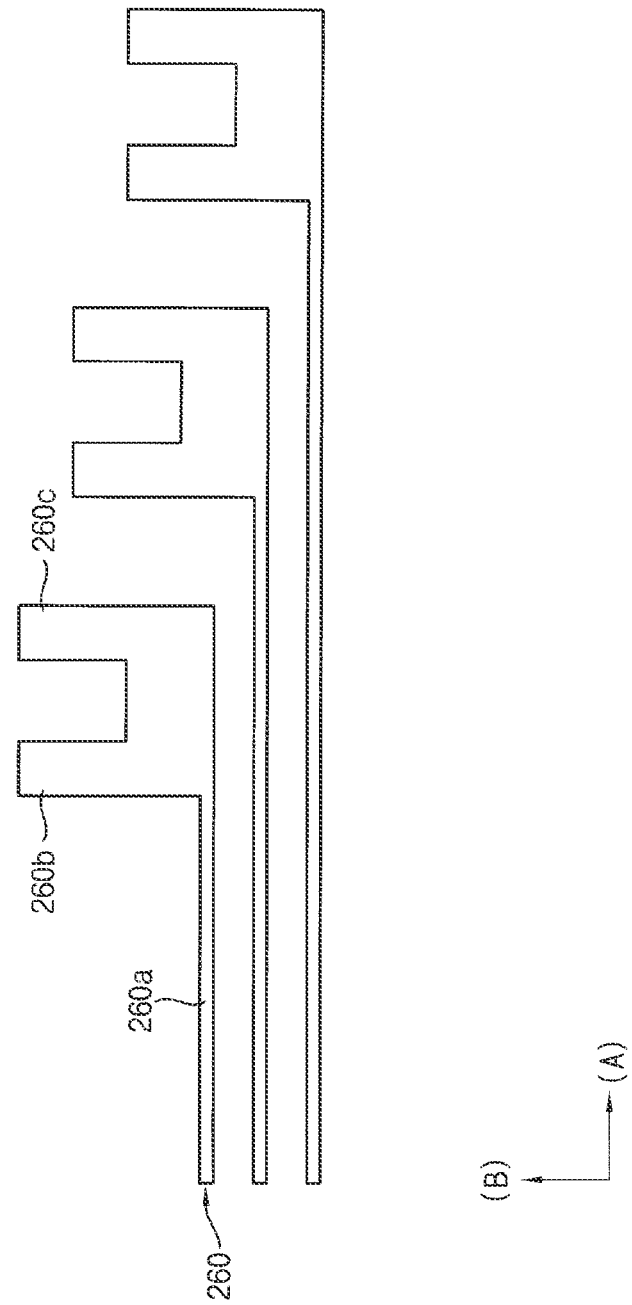
FIGS. 33 and 34 are plan views illustrating a method of forming the pattern structure array in FIG. 32 according to exemplary embodiments of the present general inventive concept.
Figure 34:
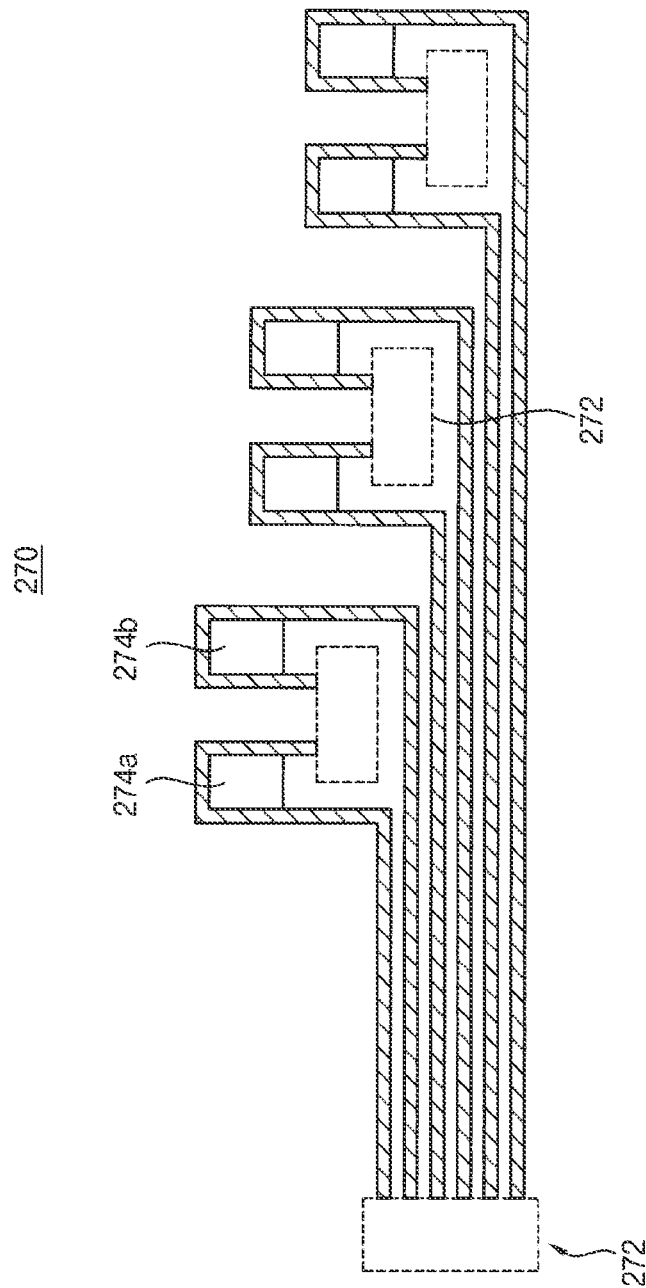

FIGS. 33 and 34 are plan views illustrating a method of forming the pattern structure array in FIG. 32. In the formation of the pattern structure array illustrated in FIG. 32, the method of forming the pattern structure may be substantially the same as or similar to that described with reference to FIGS. 4A to 12B except for constructions and positions of sacrificial pattern structures and a second photoresist pattern.

Referring to FIG. 33, sacrificial pattern structures 260 are formed on an object to be etched positioned on a substrate. The sacrificial pattern structures 260 may be arranged over the substrate substantially in parallel each other. Although lengths of the sacrificial pattern structures 260 may be different each other, the sacrificial pattern structures 260 may have substantially same or similar constructions. The sacrificial pattern structures 260 may be alternatively arranged over the substrate or may be symmetrically disposed on the object centering a reference line.

In example embodiments of the present general inventive concept, each of the sacrificial pattern structures 260 includes a first sacrificial line 260a, a first sacrificial pad portion 260b and a second sacrificial pad portion 260c. The first sacrificial line 260a may have a first width (e.g., in the (B) direction) and may extend along a first direction (e.g., in the (A) direction). The first sacrificial pad portion 260b may be bent from an end portion of the first sacrificial line 260a along a direction (e.g., the (B) direction) substantially perpendicular to the first direction (e.g., the (A) direction) of the first sacrificial line 260a. The second sacrificial pad portion 260c may extend (e.g., in the (B) direction) from the end portion of the first sacrificial line 260a. The second sacrificial pad portion 260c may be bent at a predetermined position along a direction (e.g., the (B) direction) substantially perpendicular to the first direction (e.g., the (A) direction) of the first sacrificial line 260a.

The first and the second sacrificial pad portions 260b and 260c may have widths (e.g., widths in the (B) direction) that are larger than the first width (e.g., in the (B) direction) of the first sacrificial line 260a. For example, the first and the second sacrificial pad portions 260b and 260c may have widths similar or larger than those of pads formed on the first and the second sacrificial pad portions 260b and 260c, respectively.

In example embodiments of the present general inventive concept, a plurality of sacrificial pattern structures 260 may be formed over the substrate. The sacrificial pattern structures 260 may be arranged in parallel with each other (e.g., where the sacrificial pattern structures extend in the (A) direction). The sacrificial lines of the sacrificial pattern structures 260 may have different lengths (e.g., lengths in the (A) direction), respectively.

As described above, a pattern structure array formed on the substrate may have constructions similar to or substantially the same as that of the sacrificial pattern structures 260. That is, the pattern structure may have a construction determined by the constructions of the sacrificial pattern structures 260.

Referring to FIG. 34, an etching mask structure 270 may be formed on the object through processes substantially the same as or similar to those described with reference to FIGS. 4A to 12B. In FIG. 34, a reference numeral 272 represents a portion of a spacer formation layer exposed by a second photoresist pattern substantially similar to the second photoresist pattern in FIG. 5A. The exposed portion 272 of the spacer formation layer may be etched using the second photoresist pattern, such that the end portions of the sacrificial lines may be separated one another. Therefore, two pad regions 274a and 274b may be defined in one sacrificial pattern structure 260 by separating end portions of line patterns in the pad regions 274a and 274b.

The object (e.g., a layer to be etched) is etched using the etching mask structure 270, a pattern structure array may be provided on the substrate. The pattern structure may have a construction substantially the same as or similar to that of the pattern structure array illustrated in FIG. 32.

Figure 35:
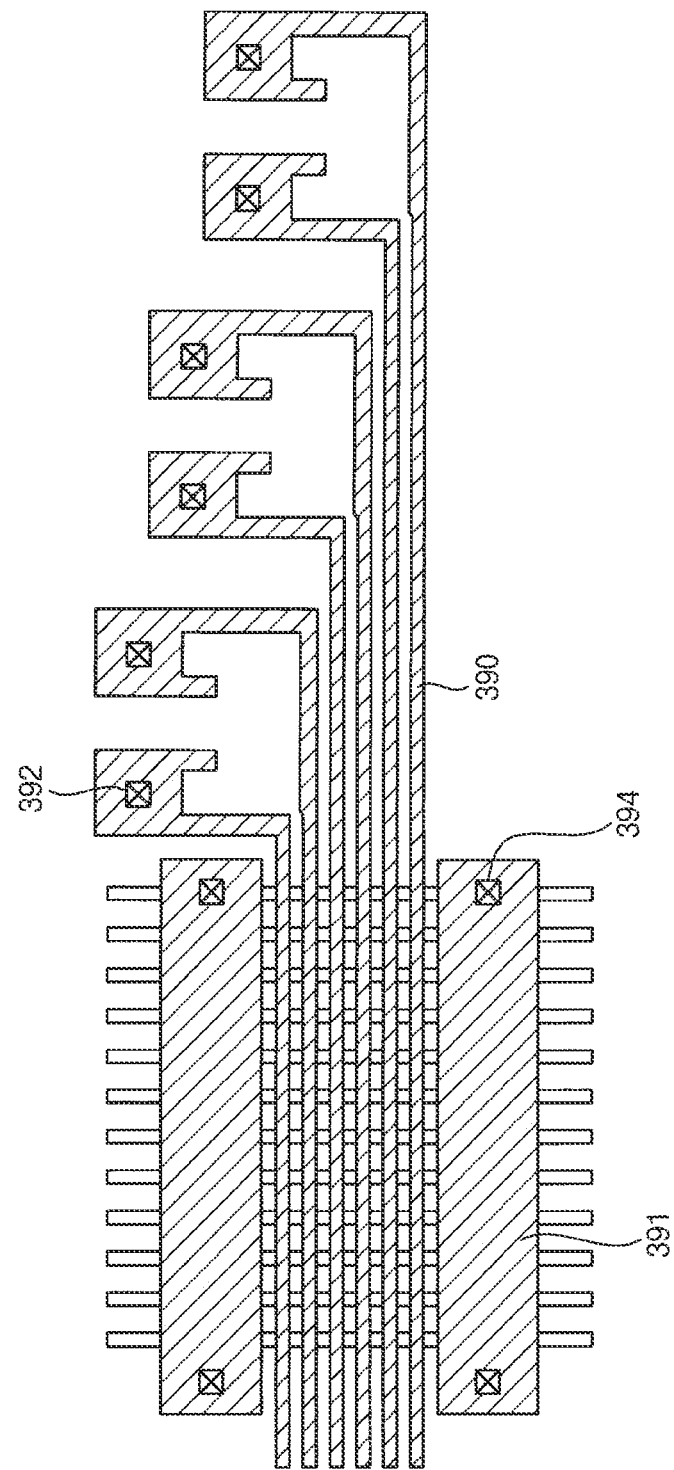
FIG. 35 is a plan view illustrating a unit cell of a NAND type flash memory device including the pattern structure array in FIG. 32 according to exemplary embodiments of the present general inventive concept.

FIG. 35 is a plan view illustrating a unit cell of a NAND type flash memory device including the pattern structure array in FIG. 32.

The pattern structure array illustrated in FIG. 32 may be used as word lines 390 of the NAND type flash memory device.

In the formation of the NAND type flash memory device in FIG. 32, isolation layer patterns and active patterns may be formed on a substrate through processes substantially the same as or similar to those described with reference to FIGS. 18 to 21. A tunnel insulation layer, a first gate electrode layer, a dielectric layer and a second gate electrode layer may be successively formed on the substrate. An etching mask structure may be formed on the second gate electrode layer by processes substantially the same as or similar to those described with reference to FIGS. 33 and 34. Using the etching mask structure, the second gate electrode layer, the dielectric layer and the first gate electrode layer may be etched, to form floating gates, dielectric layer patterns and control gates serving as the word lines 390. Further, selection transistors may be provided adjacent to both of end portions of a cell string.

An insulating interlayer is formed on the substrate to cover the word lines 390 and gate patterns 391 of the selection transistors, and then first contact plugs 392 may be formed on pads connected with the word lines 360 through the insulating interlayer. Additionally, second contact plugs 394 may be formed on the gate patterns 391 of the selection transistors through the insulating interlayer. Thus, the NAND type flash memory device may be manufactured on the substrate.

Figure 36:
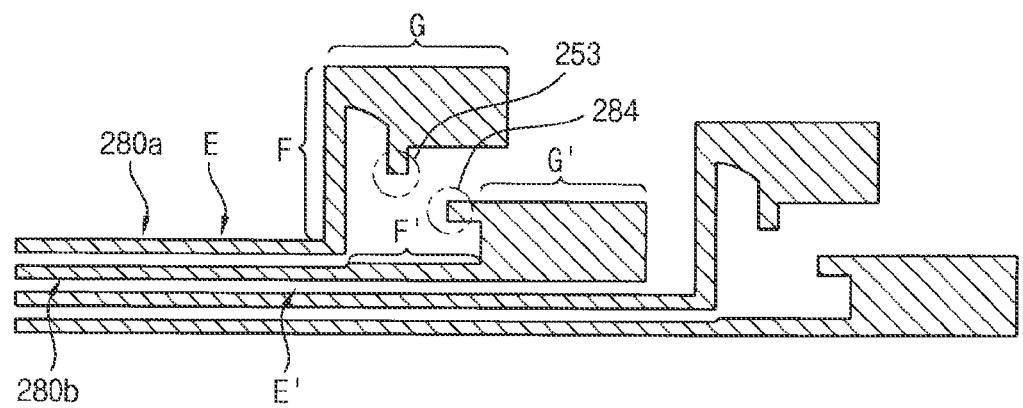
FIG. 36 is a plan view illustrating a pattern structure array in accordance with exemplary embodiments of the present general inventive concept.

FIG. 36 is a plan view illustrating a pattern structure array in accordance with fifth embodiment.

Referring to FIG. 36, the pattern structure array 280 includes a first pattern 280a and a second pattern 280b arranged on a substrate. The first and the second patterns 280a and 280b may be disposed on the substrate in parallel each other.

The first pattern 280a of the pattern structure array includes a first line pattern (E), a first extending line (F) and a first pad (G). The first line pattern (E) of the first pattern 280a may extend in the first direction (e.g., in the (A) direction) and may have a first width (e.g., the width may be in the (B) direction). The first extending line (F) may make contact with an end portion of the first line pattern (E). The first pad (G) of the first pattern 280a may be connected with the end portion of the first line pattern (E) and may have a width (e.g., in the (B) direction) larger than the first width. The first pad (G) may have a sufficient width to be a contact pad to transfer signals successively formed on the first pad (G) of the first pattern 280a. The first width (e.g., in the (B) direction) of the first line pattern (E) in the first pattern 280a may be smaller than a critical width of a photolithography process.

In example embodiments of the present general inventive concept, the first pad (G) of the first pattern 280a may have a protruding portion 284 extending from a lateral portion of the first pad (G). The protruding portion 253 of the first pad (G) may have a line shape. The protruding portion 253 of the first pad (G) may be protruded in a direction (e.g., the (B) direction) substantially in parallel with respect to a direction (e.g., the (B) direction) where the end portion of the first extending line (F) extends.

The second pattern 280b may be arranged adjacent to the first pattern 280a in parallel and spaced by a predetermined distance. The second pattern 280b of the pattern structure array includes a second line pattern (E'), a second extending line (F') and a second pad (G'). The second line pattern (E') of the second pattern 280b may extend in parallel relative to the first direction (e.g., the (A) direction) of the first line pattern (E) in the first pattern 280a. The second line pattern (E') of the second pattern 280b may also have the first width (e.g., in the (B) direction). The second extending line (F') may be connected with an end portion of the second line pattern (E').

The second pad (G') may make contact with the end portion of the second line pattern (E'). The second pad (G') of the second pattern 280b may also have a protruding portion 284 extending (e.g., in the (A) direction) from a side portion of the second pad (G'). The protruding portion 284 of the second pad (G') may have a line shape. The protruding portion 284 of the second pad (G') may be protruded in a direction (e.g., the (A) direction) in parallel with respect to a direction (e.g., the (A) direction) where the end portion of the second extending line (F') extends. The second pad (G') of the second pattern 280b may also have a sufficient width to be a contact pad to transfer signals successively formed on the second pad (G').

As illustrated in FIG. 36, the first pad (G) of the first pattern 280a may be arranged substantially in parallel to the second pad (G') of the second pattern 280b. That is the first pad (G) and the second pad (G') may both extend in the (A) direction and be parallel with one another. Further, the first extending line (F) (e.g., that extends in the (B) direction) of the first pattern 280a may be perpendicular to the second extending line (F') (e.g., that extends in the (A) direction) of the second pattern 280b.

In example embodiments of the present general inventive concept, a plurality of first and second patterns 280a and 280b may be arranged on the substrate by predetermined distances, respectively. The first and the second patterns 280a and 280b may be alternatively disposed on the substrate. The first and the second patterns 280a and 280b may have lengths (e.g., lengths in the (A) direction) different one another, however, each of the first and the second patterns 280a and 280b may have a substantially the same or similar construction.

Hereinafter a method of forming the pattern structure array in FIG. 36 will be described with reference to the accompanying drawings.

Figure 37:
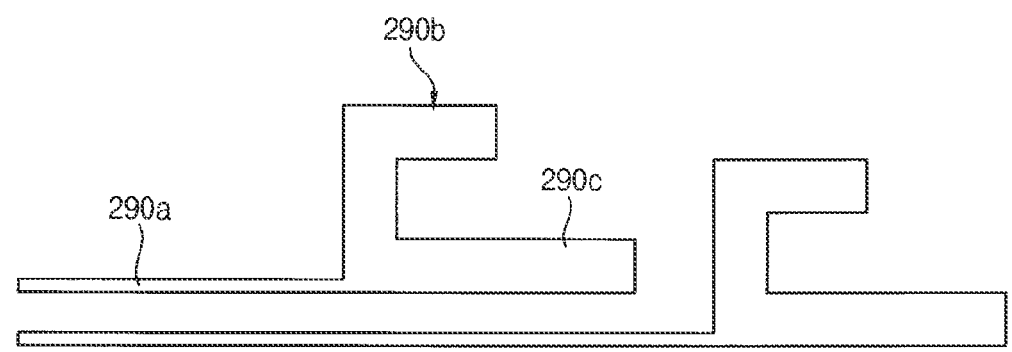
FIGS. 37 and 38 are plan views illustrating a method of forming the pattern structure array in FIG. 36 according to exemplary embodiments of the present general inventive concept.
Figure 38:
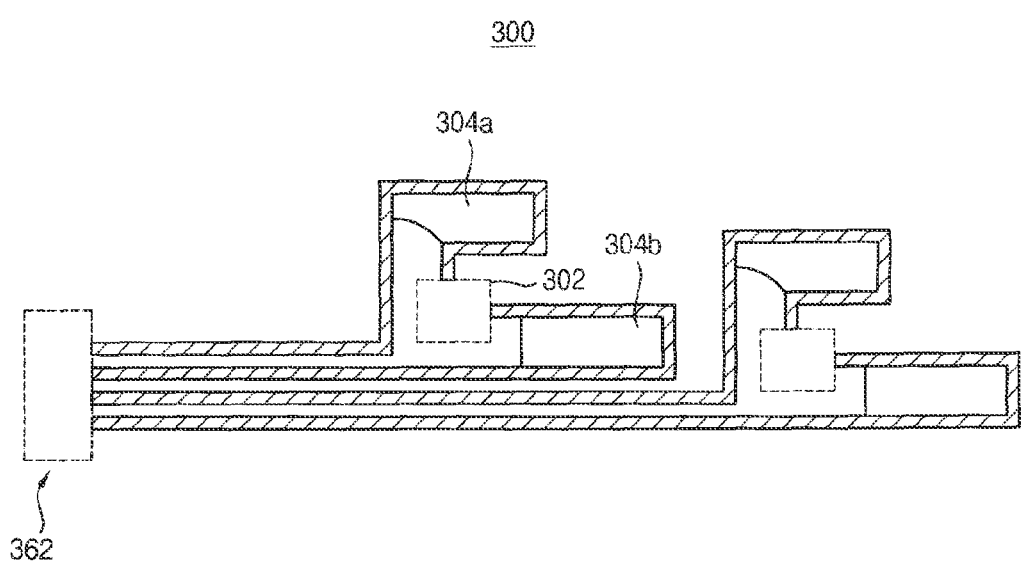

FIGS. 37 and 38 are plan views illustrating a method of forming the pattern structure array in FIG. 36. In FIGS. 37 and 38, the method of forming the pattern structure may be substantially the same as or similar to that described with reference to FIGS. 4A to 12B except for constructions and positions of sacrificial pattern structures and a second photoresist pattern.

Referring to FIG. 37, sacrificial pattern structures 290 are formed on a substrate. Each of the sacrificial pattern structures 290 may be arranged in parallel each other. The sacrificial pattern structures 290 may have different lengths, whereas constructions of the sacrificial pattern structures 290 may be similar or substantially the same to each other. The sacrificial pattern structures 290 may be periodically disposed on the substrate, or may be symmetrically arranged on the substrate centering a predetermined line.

Each of the sacrificial pattern structures 290 includes first sacrificial line 290a, a first sacrificial pad portion 290b and a second sacrificial pad portion 290c. The sacrificial line 290a may have a first width (e.g., a width in the (B) direction) and extend in a first direction (e.g., the (A) direction). The first sacrificial pad portion 290b may include one portion extending from an end portion of the sacrificial line 290a along a direction (e.g., in the (B) direction) substantially perpendicular to the first direction (e.g., the (A) direction). Another portion of the first sacrificial 290b may be bent along a direction (e.g., the (A) direction) substantially in parallel relative to the first direction (e.g., the (A) direction). The second sacrificial pad portion 290c may extend form the end portion of the sacrificial 290a along the first direction (e.g., the (A) direction).

Each of the first and the second sacrificial pad portions 290b and 290c may have a width (e.g., in the (B) direction) relatively larger than the first width of the sacrificial line 290a. The first and the second sacrificial pad portions 290b and 290b may have widths substantially similar or larger than those of pads formed thereon. In example embodiments of the present general inventive concept, a plurality of sacrificial pattern structures 290 may be provided on the substrate. Here, sacrificial lines of the sacrificial pattern structures 290 may have lengths (e.g., in the (A) direction) that are different one another.

As described above, pattern structures may have final constructions varied in accordance with the shapes of the sacrificial pattern structures 290.

Referring to FIG. 38, etching masks 300 are formed on the substrate based on the sacrificial pattern structures 290 through processes similar to or substantially the same as those described with reference to FIGS. 4A to 12B. In FIG. 38, a reference numeral 302 indicates a portion of the etching mask structure 300 exposed by a second photoresist pattern formed by the process described with reference to FIG. 5A. A reference numeral 362 may be gate electrode that is formed by the etching mask structure 300 exposed by a second photoresist pattern. The exposed portion 302 of the etching mask structure 300 may be etched using the second photoresist pattern, so that end portions of pad portions 304a and 304b may be separated, thereby defining two pad portions 304a and 304b from one sacrificial pattern structure 290.

Using the etching mask structure 300, an underlying layer to be etched may be partially etched to form a pattern structure array having a construction similar to or substantially the same as that of the pattern structure array described with reference to FIG. 36.

Figure 39:
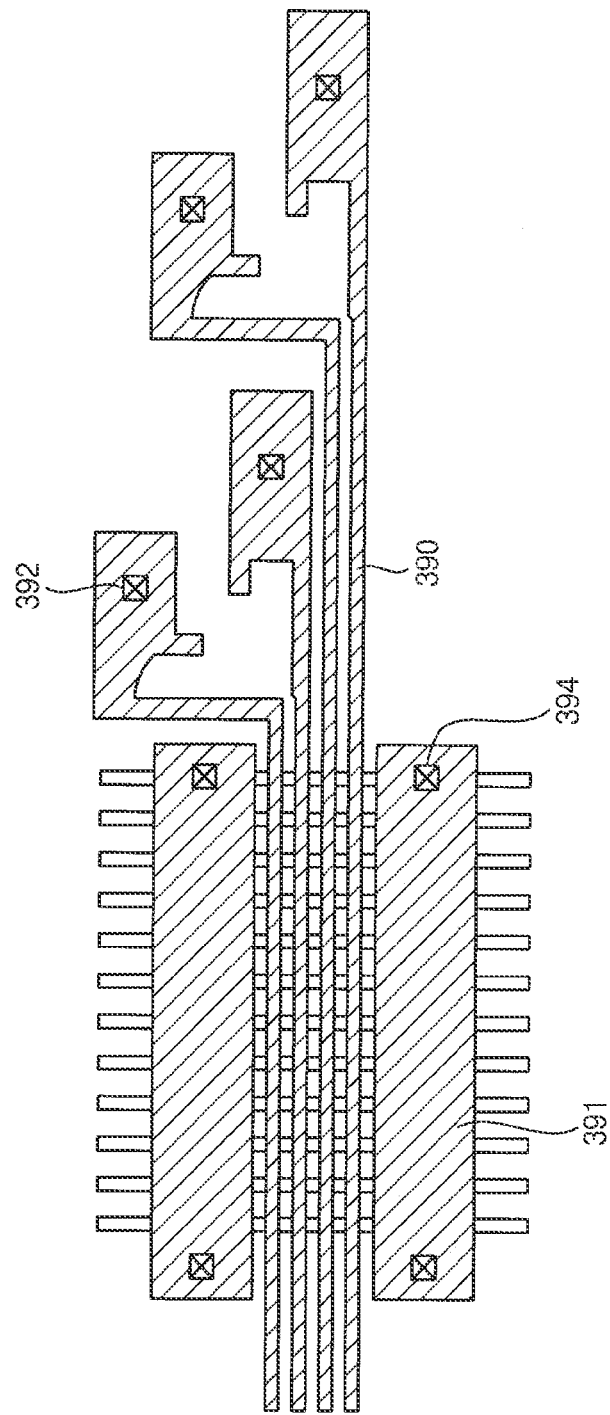
FIG. 39 is a plan view illustrating a unit cell of a NAND type flash memory device including the pattern structure array in FIG. 36 according to exemplary embodiments of the present general inventive concept.

FIG. 39 is a plan view illustrating a unit cell of a NAND type flash memory device including the pattern structure array in FIG. 36.

As illustrated in FIG. 39, the pattern structure array described with reference to FIG. 36 may be a word line 390 in a NAND type flash memory device.

In manufacturing the NAND type flash memory device, a tunnel insulation layer and a first gate electrode layer may be formed on a substrate, and then isolation layer patterns may be formed on the substrate to define an active region and an isolation region of the substrate through processes substantially the same as or similar to those described with reference to FIGS. 18 and 19.

A dielectric layer and a second gate electrode layer may be formed on the first gate electrode layer and the isolation layer patterns by processes substantially the same as or similar to those described with reference to FIG. 20. Etching masks may be provided on the second gate electrode layer by processes substantially the same as or similar to those described with reference to FIGS. 37 and 38. The second gate electrode layer, the dielectric layer and the first gate electrode layer may be partially etched using the etching masks, so that the word line 390 corresponding to a control gate may be obtained. Selection transistors may be provided adjacent both of end portions of cell string.

An insulating interlayer may be formed to cover the word line 390 and a gate pattern 391 of the selection transistor. A first contact plug 392 and a second contact plug 394 may be formed through the insulating interlayer. The first contact plug 392 may make contact with a pad connected to the control gate, and the second contact plug 394 may directly make contact with the gate pattern 391.

Figure 40:
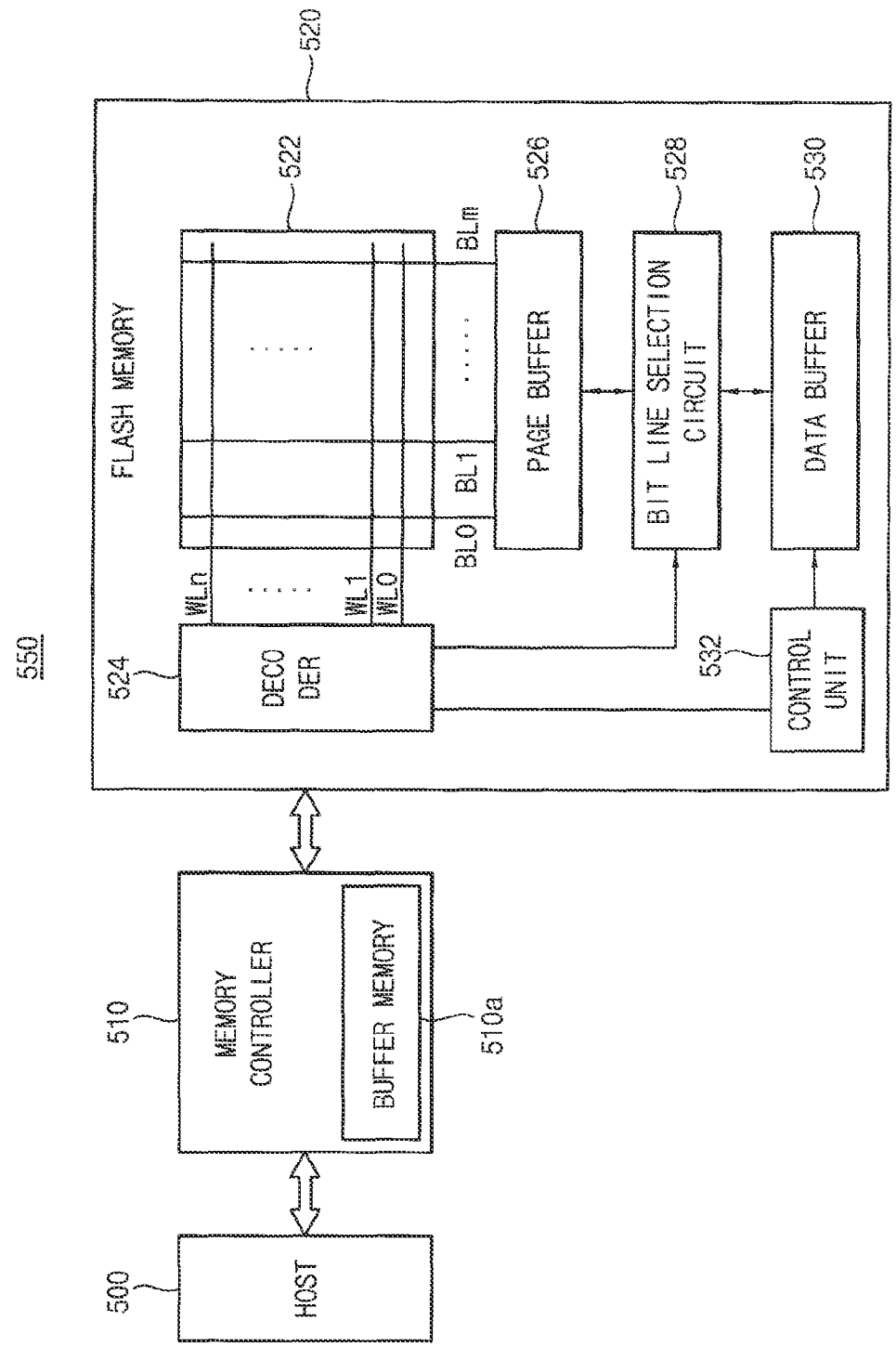
FIG. 40 is a block diagram illustrating a memory system including a pattern structure array in accordance example embodiments of the present general inventive concept.

FIG. 40 is a block diagram illustrating a memory system including a pattern structure array in accordance example embodiments.

Referring to FIG. 40, a memory system 550 includes a host 500, a memory controller 510 and a flash memory device 520.

The memory controller 510 may serve as an interface between the host 500 and the flash memory device 520. The memory controller 510 includes a buffer memory 510a. Further, the memory controller 510 may include a central processing unit (CPU), a read only memory (ROM), a random access memory (RAM), an interface block, etc.

The flash memory device 520 includes a cell array 522, a decoder 524, a page buffer 526, a bit line selection circuit 528, a data buffer 530 and a control unit 532.

In example embodiments of the present general inventive concept, data, address signals and write commands may be transferred into the memory controller 510 form the host 500. The memory controller 510 may control the flash memory device 520 for writing the date into the cell array 522 according to the inputted commands. Additionally, the memory controller 510 may control the flash memory device 520 for reading the data stored in the cell array 522 based on read commands transferred from the host 500. The data buffer 530 may temporarily store the data transmitted between the host 500 and the flash memory device 520.

The cell array 522 of the flash memory device 520 includes a plurality of memory cells. The decoder 524 may be electrically connected with the cell array 522 through word lines (WL0, WL1, . . . , WLn). The decoder 524 mat receive address signals from the memory controller 510, and then the decoder 524 may generate selection signals for selecting one of the word lines (WL0, WL1, . . . , WLn) or bit lines (BL0, BL1, . . . , BLn). The page buffer 526 may be electrically connected to the cell array 522 through the bit line (BL0, BL1, . . . , BLn).

In example embodiments of the present general inventive concept, the flash memory device 520 may include pattern structures having minute patterns and pads connected to end portions of the minute patterns. Each of the pattern structures in the flash memory device 520 may have a construction similar or substantially the same as that of one of the above-described pattern structures. For example, each word line or each bit line in the flash memory device may include a pattern structure array similar or substantially the same as one of the above-described pattern structure arrays.

In example embodiments of the present general inventive concept, the memory system 550 may additionally include a dynamic random access memory (DRAM) device and/or a static random access memory (SRAM) device. Further, pattern structures included in the DRAM device and/or the SRAM device may have constructions similar or substantially the same as those of the above-described pattern structures. For example, each word line or each bit line in the DRAM device and/or the SRAM device may include a pattern structure array similar or substantially the same as one of the above-described pattern structure arrays.

According to the present general inventive concept, a pattern structure including having a minute pattern and a pad connected to an end portion of the minute pattern, or a pattern structure array of the pattern structures may be easily obtained through simplified processes. The pattern structure and/or the pattern structure array may be widely employed in various semiconductor devices such as volatile semiconductor devices or non-volatile semiconductor devices.

The foregoing is illustrative of example embodiments, and is not to be construed as limiting thereof. Although several example embodiments have been described, those skilled in the art will readily appreciate that many modifications are possible in the example embodiments without materially departing from the novel teachings and advantages of example embodiments. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A pattern structure of a semiconductor device, comprising:
   a first pattern structure having a first line pattern, a first extending line extended from the first line pattern, and a first pad connected to the first extending line and having a circumferential line, a concave portion, and a protrusion disposed between the circumferential line and the concave portion; and a second pattern disposed adjacent to the first pattern structure, having a second line pattern, a second extending line extended from the second line pattern, and a second pad connected to the second extending line and having a second circumferential line, a second concave portion, and a second protrusion disposed between the second circumferential line and the second concave portion.

2. A pattern structure of a semiconductor device, comprising:
a first pattern structure connected to a controller, the first pattern structure comprising:
a first line pattern disposed in a first direction and having a first width in a second direction having an angle with the first direction,
a first extending line extended from the line pattern in the second direction and having a second width in the first direction wider than the first width, and
a first pad formed on an end portion of the extending line and having a third width wider than the second width; and
a second pattern structure disposed to face the first pattern structure and connected to the controller, the second pattern structure comprising:
a second line pattern formed on a substrate and having a fourth width,
a second extended line extended from an end portion of the line pattern and having a fifth width,
a second pad formed on an end portion of the extended line and having a six width and a seventh width narrower than the sixth width, and
a protruding portion to protrude from a portion of the pad of the seven width.

3. A pattern structure of a semiconductor device, comprising:
a line pattern unit formed on a substrate to transmit data; and
a pad formed to be connected to the line pattern unit to receive and output the data, having a circumferential line to define a shape of the pad, and having a concave portion formed in the circumference line, wherein the line pattern unit includes:
a line pattern; and
an extending line disposed between the line pattern and the pad, and having a width different from at least one of the line pattern and the pad,
wherein the circumferential line of the pad forms an area of the pad, and
the area of the pad has a first portion in which a width of the area in a direction parallel to a longitudinal direction of the line pattern unit does not vary, and a second portion in which a direction parallel to a longitudinal direction of the line pattern unit varies according to a distance from the line pattern unit.

4. The pattern structure of the claim 3, wherein:
the line pattern connected to the extending line and disposed opposite to the pad with respect to the extending line; and
the extending line is disposed in a direction different from at least one of the line pattern and the pad.

5. The pattern structure of claim 3, wherein:
the extending line includes two ends, where one of the two ends is connected to the circumferential line; and
the concave portion is connected to the one of the two ends of the extending line.

6. The pattern structure of claim 3, wherein:
the extending line includes two ends, where one of the two ends is connected to the circumferential line and has a width same as a width of a corresponding end of the circumferential line of the pad.

7. The pattern structure of claim 3, wherein:
the extending line has a width; and
the pad has a variable width different from the width of the extending line with respect to the line pattern.

8. The pattern structure of claim 3, wherein:
the concave portion of the pad is disposed adjacent to the extending line.

9. The pattern structure of claim 3, wherein:
the circumferential line includes one end directly connected to the extending line, and another end connected to the extending unit through the concave portion.

10. The pattern structure of claim 3, wherein:
the pad has a constant width and a variable width with respect to a longitudinal direction of the line pattern; and
the variable width corresponds to the concave portion.

11. The pattern structure of claim 3, wherein:
the circumferential line of the pad comprises an end connected to one end of the line pattern unit, the concave portion formed in the circumferential line; and
the circumferential line including concave portion has an end connected to the line pattern unit.

12. The pattern structure of claim 3, wherein:
the pad comprises a first portion having a constant width and a second portion having a variable width in a direction according to a location of the concave portion.

13. The pattern structure of claim 3, wherein:
the pad comprises a connecting portion to connect the circumference line to the line pattern unit;
the connecting portion is curved in a first area; and
the concave portion is curved in a second area larger than the first area.

14. The pattern structure of claim 3, wherein:
the pad comprises a connection portion connected to the line pattern unit; and
the concave portion is disposed in an area different from the connection portions.

15. The pattern structure of claim 3, wherein:
the pad comprises a connection portion connected to the line pattern unit; and
the concave portion is connected between an end of the connection portion.

16. The pattern structure of claim 3, wherein:
the pad comprises a connecting portion having a first end connected between the line pattern unit and one end of the circumferential line defining the shape of the pad and a second end connected between the line pattern and one end of the concave portion.

17. The pattern structure of claim 3, wherein:
the pad comprises at least four sides;
the circumferential line defines three of the four sides; and
the concave portion defines one of the four sides.

18. The pattern structure of claim 3, further comprising:
a protrusion disposed between the concave portion and the circumference line.

19. The pattern structure of claim 3, wherein:
the circumference line comprises two ends, where one of the ends is connected to an end of the line pattern unit, and a line is connected to the two ends to define the shape of the pad.

20. The pattern structure of claim 19, wherein:
the concave portion is formed on the line of the circumferential line.

21. The pattern structure of claim 19, wherein:
the concave portion is disposed between one of the ends and the line of the circumferential line.

22. The pattern structure of claim 3, further comprising:
a protrusion to protrude from the concave portion and the circumference line by a length.

23. The pattern structure of claim 22, wherein:
the length is shorter than a length of one of the concave portion and the circumference line.

24. The pattern structure of claim 22, wherein:
the length is shorter than the least width of the pad.

25. The pattern structure of claim 22, wherein:
the length is longer than a width of the line pattern unit.

26. The pattern structure of claim 22, wherein:
the protrusion has a width narrower than the length.

27. The pattern structure of claim 22, wherein:
the protrusion has a width narrower than a length of the concave portion.

28. The pattern structure of claim 22, wherein:
the line pattern unit is disposed in a direction; and
the protrusion is disposed in another direction.

29. The pattern structure of claim 22, wherein:
the line pattern unit comprises a line pattern formed in a first direction and an extending portion formed in a second direction between the line pattern and the pad; and
the protrusion is formed in one of the first direction and the second direction.

* * * * *